United States Patent
Tanaka

(10) Patent No.: US 6,693,257 B1
(45) Date of Patent: Feb. 17, 2004

(54) LASER IRRADIATION APPARATUS, LASER IRRADIATION METHOD, AND METHOD FOR MANUFACTURING A SEMICONDUCTOR DEVICE

(75) Inventor: Koichiro Tanaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 471 days.

(21) Appl. No.: 09/722,745

(22) Filed: Nov. 28, 2000

(30) Foreign Application Priority Data

Nov. 29, 1999 (JP) ............................................ 11-338846

(51) Int. Cl.[7] ............................................. B23K 26/40
(52) U.S. Cl. ................................................ 219/121.76
(58) Field of Search ........................ 219/121.76, 121.61, 219/121.62, 121.67, 121.68, 121.69, 121.7, 121.71, 121.72; 359/326, 327, 328, 329

(56) References Cited

U.S. PATENT DOCUMENTS

| | | | |
|---|---|---|---|
| 5,005,969 A | * | 4/1991 | Kataoka ........................ 353/122 |
| 5,247,190 A | | 9/1993 | Friend et al. |
| 5,399,502 A | | 3/1995 | Friend et al. |
| 5,643,826 A | | 7/1997 | Ohtani et al. |
| 5,923,962 A | | 7/1999 | Ohtani et al. |
| 6,563,843 B1 | * | 5/2003 | Tanaka ............................. 372/9 |

FOREIGN PATENT DOCUMENTS

| | | |
|---|---|---|
| EP | WO 90/13148 | 11/1990 |
| JP | 07-130652 | 5/1995 |
| JP | 10-092576 | 4/1998 |
| JP | 11-097702 | 4/1999 |
| JP | 11-133463 | 5/1999 |

OTHER PUBLICATIONS

H. Shenk et al., "Polymers for Light–Emitting Diodes", Euro Display Proceedings 1999, pp. 33–37.

* cited by examiner

Primary Examiner—M. Alexandra Elve
Assistant Examiner—Jonathan Johnson
(74) Attorney, Agent, or Firm—Eric J. Robinson; Robinson Intellectual Property Law Office, P.C.

(57) ABSTRACT

YAG laser can simultaneously emit a plurality of laser beams having different wavelengths from each other. By simultaneously irradiating the laser beams having different wavelengths from each other to a same region of a non-single crystal semiconductor film, an interference influence is suppressed to obtain a more uniform laser beam. For example, by simultaneously generating second and third harmonics of YAG laser to irradiate the same region through suitable optical system, a laser beam having higher uniformity and having an energy in which interference is highly suppressed is obtained.

22 Claims, 31 Drawing Sheets

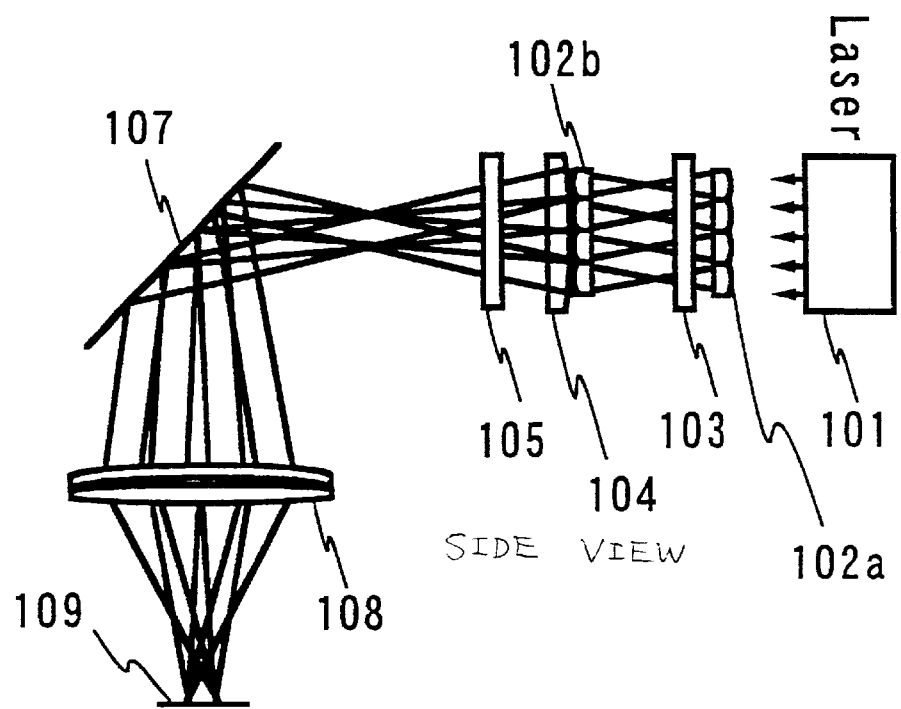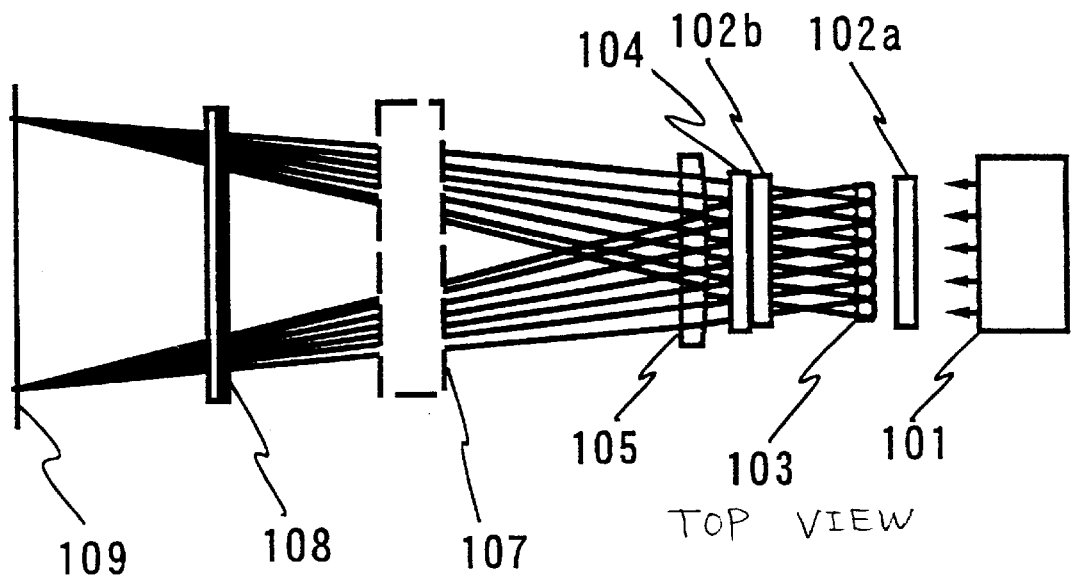
Fig. 1

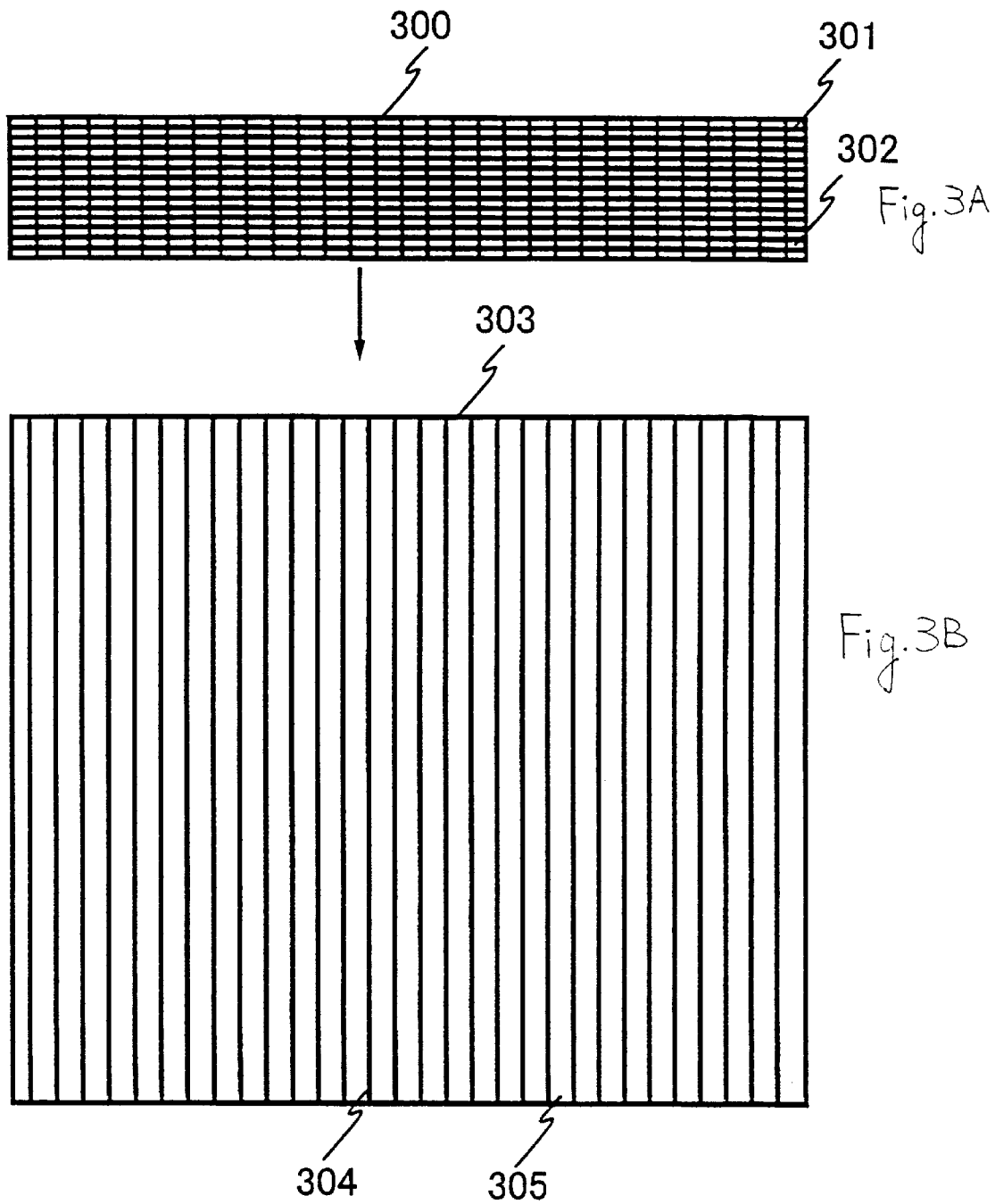

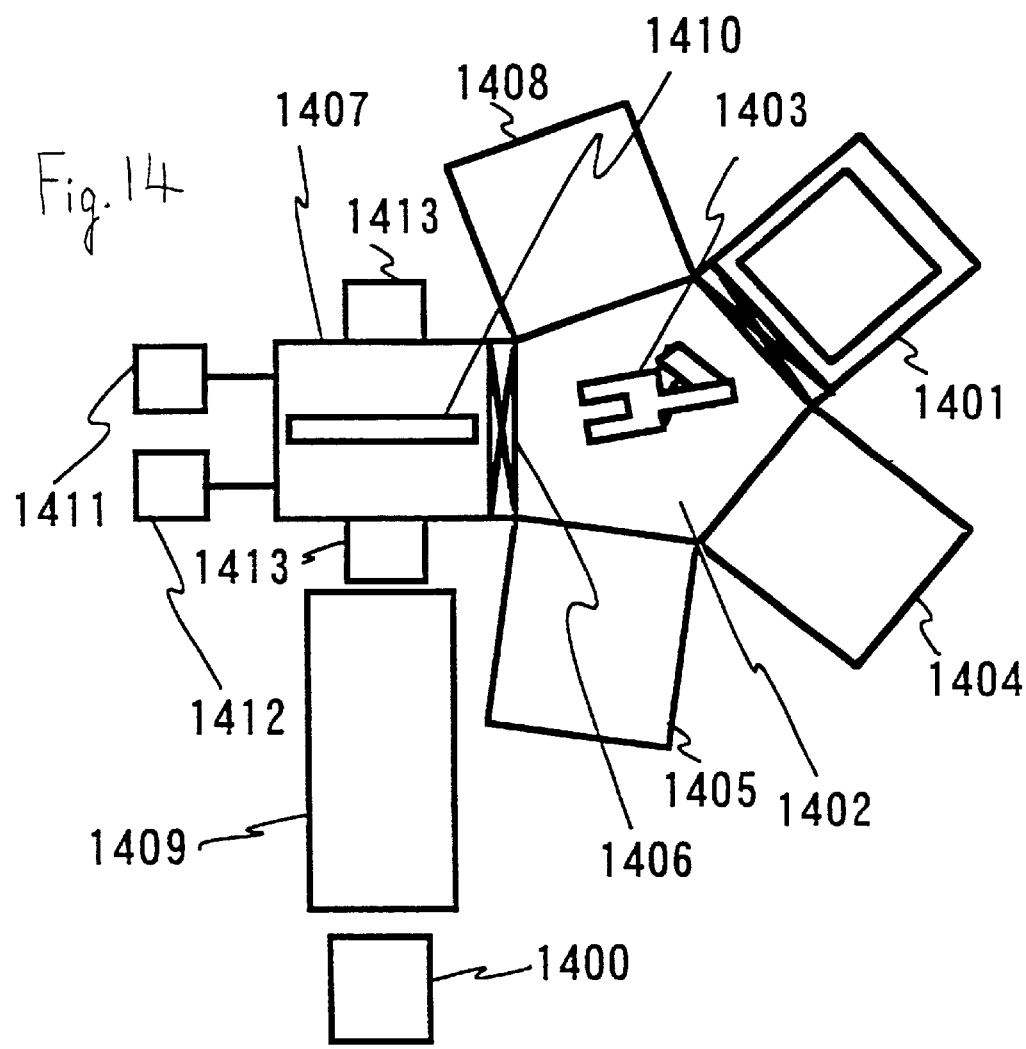

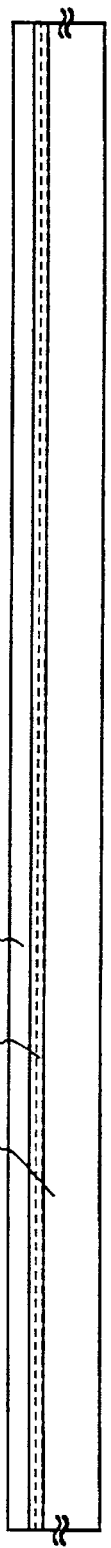
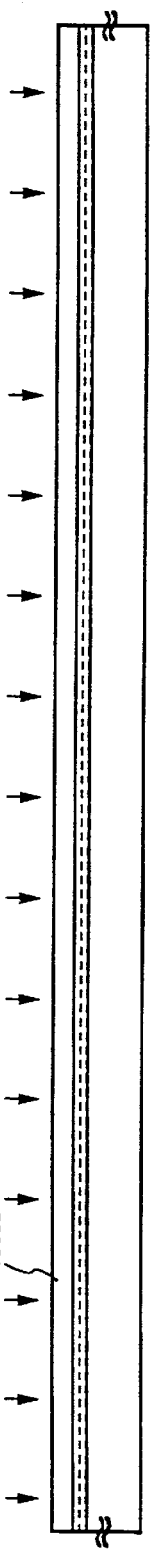
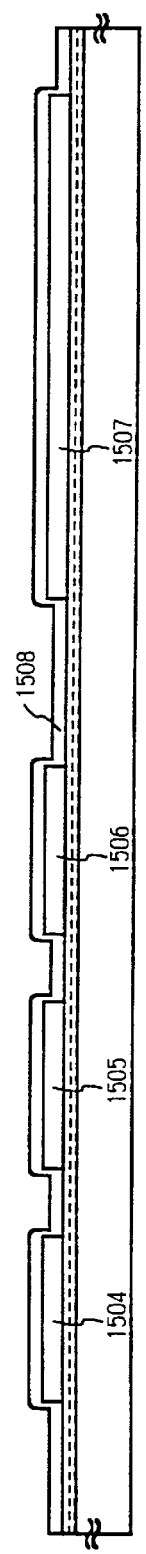
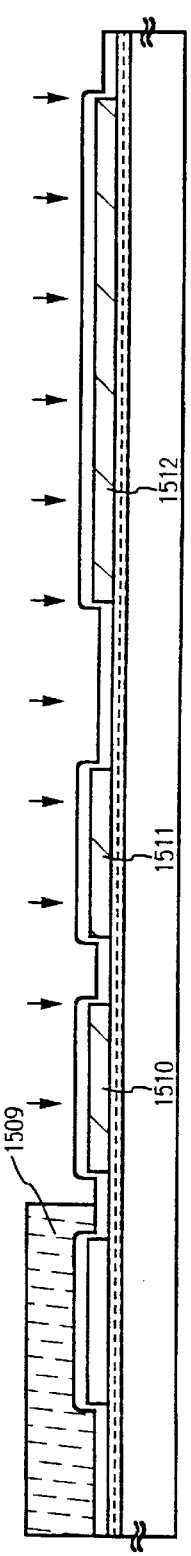

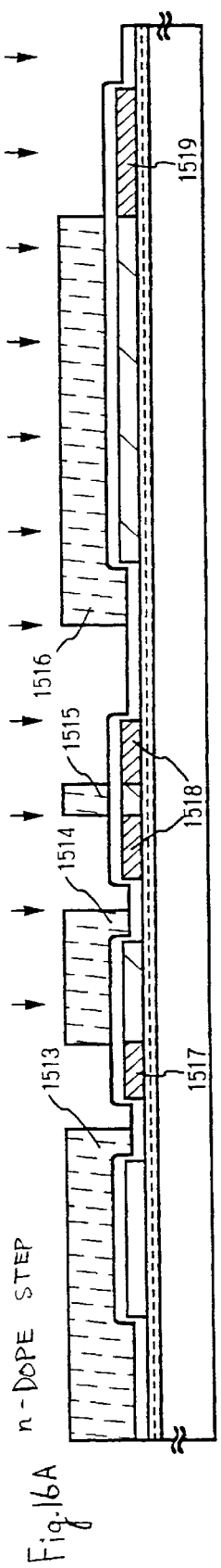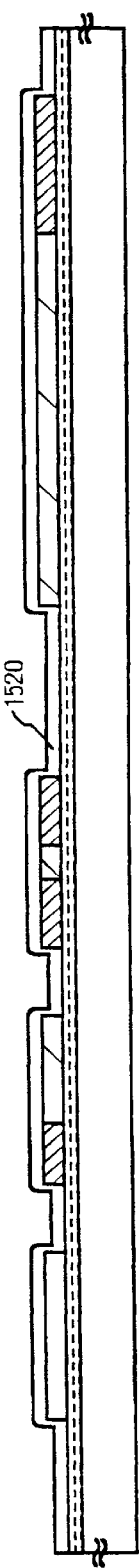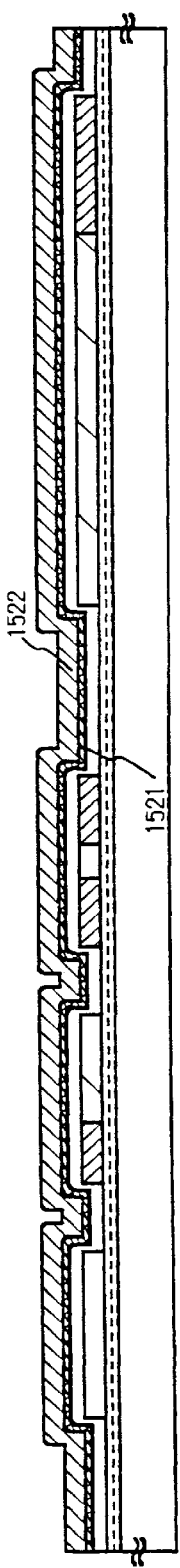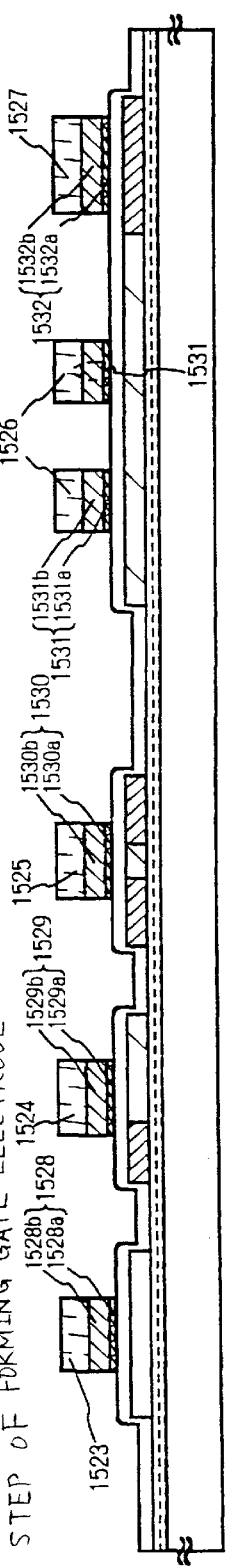
Fig. 16A n-DOPE STEP
Fig. 16B STEP OF REMOVING MASK LAYER / LASER ACTIVATION STEP / STEP OF FORMING GATE INSULATING FILM
Fig. 16C STEP OF FORMING FIRST CONDUCTIVE LAYER
Fig. 16D STEP OF FORMING GATE ELECTRODE

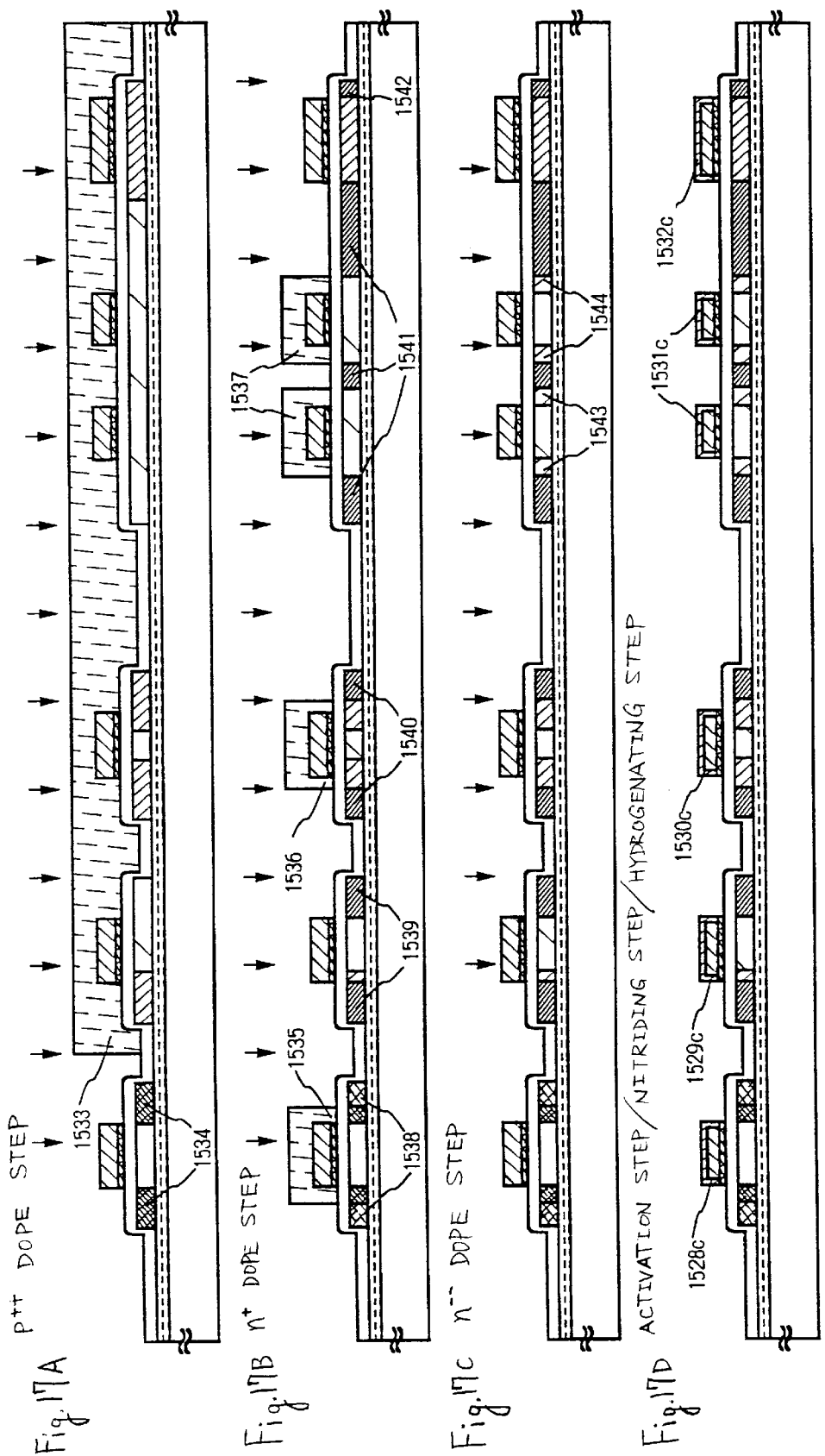

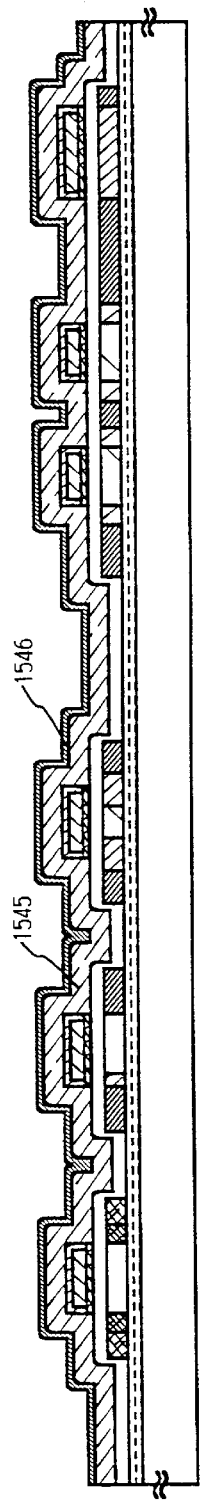
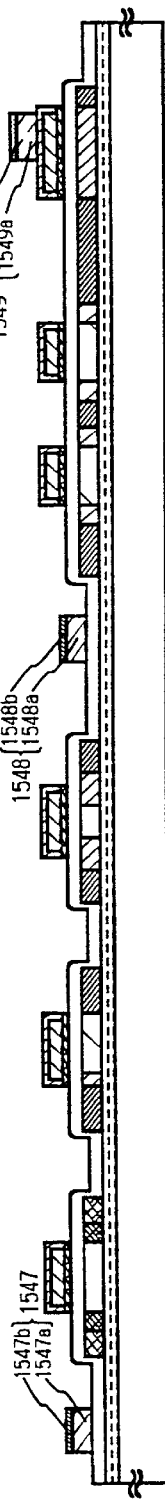
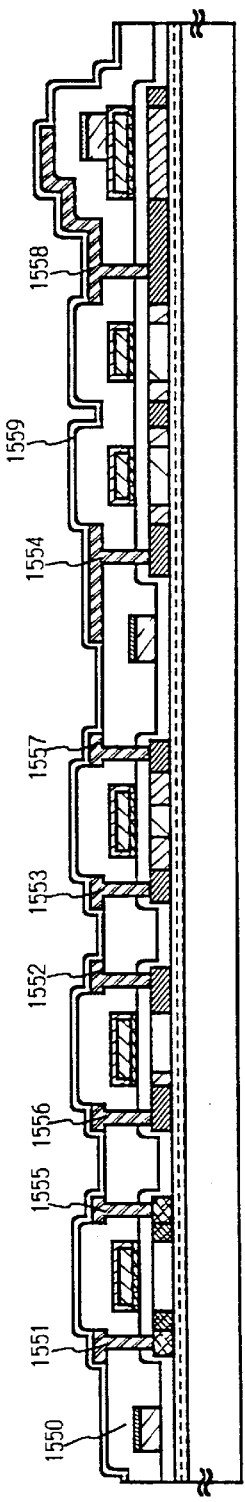
Fig. 18A STEP OF FORMING SECOND CONDUCTIVE FILM
Fig. 18B FORMATION OF GATE WIRING
Fig. 18C STEP OF FORMING INTERLAYER INSULATING FILM / STEP OF FORMING CONTACT HOLE / STEP OF FORMING WIRING / STEP OF FORMING PASSIVATION FILM

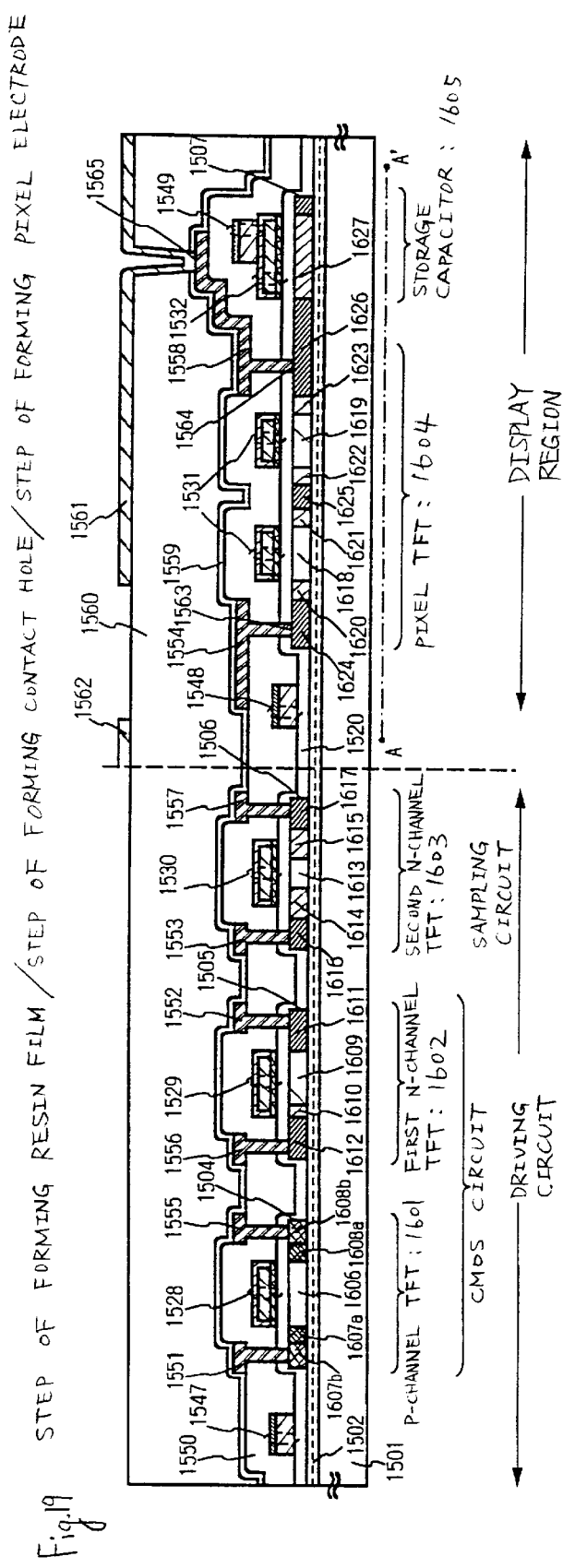

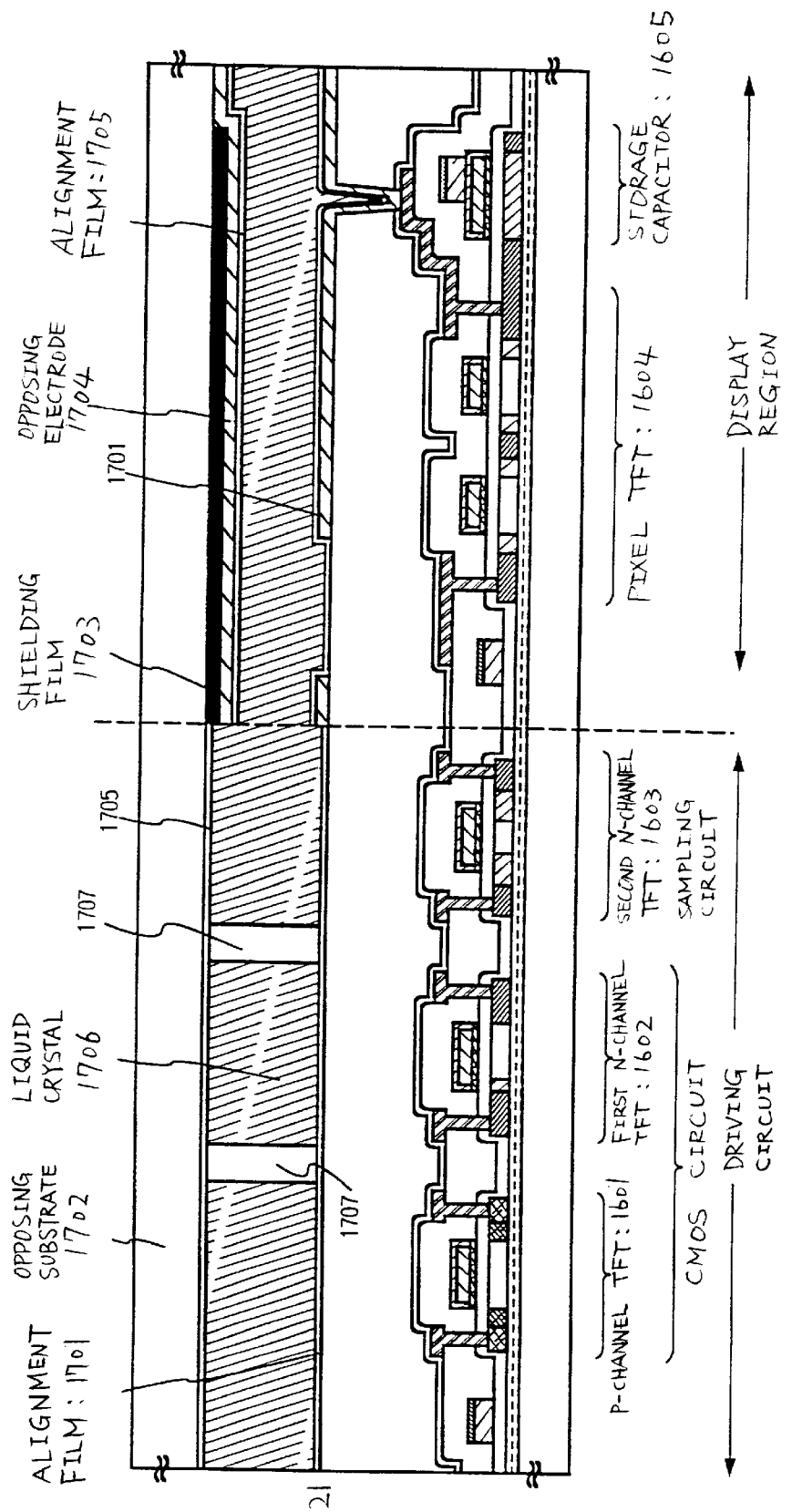

Fig. 22A STEP OF FORMING AMORPHOUS SEMICONDUCTOR FILM
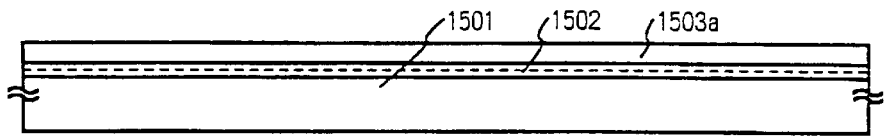
Fig. 22B STEP OF ADDING CATALYST ELEMENT
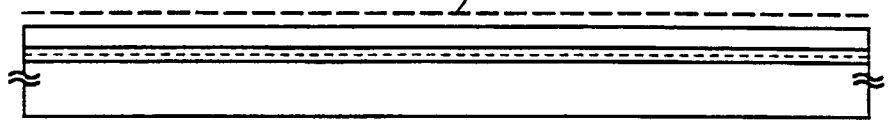
Fig. 22C LASER CRYSTALLIZATION STEP
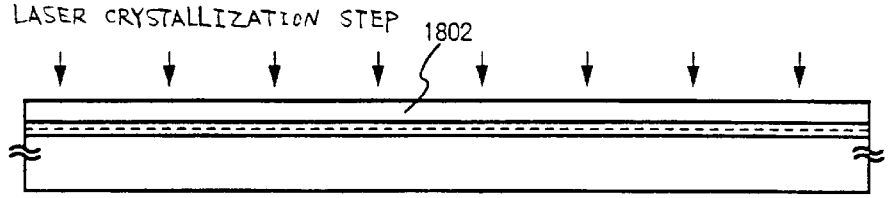
Fig. 23A STEP OF FORMING AMORPHOUS SEMICONDUCTOR FILM
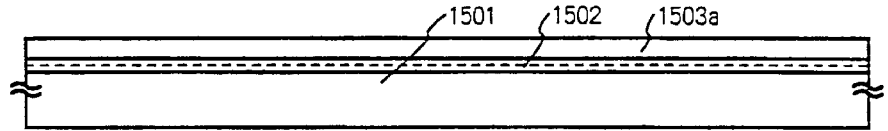
Fig. 23B STEP OF ADDING CATALYST ELEMENT
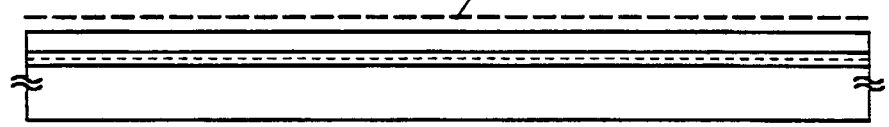
Fig. 23C CRYSTALLIZATION STEP (THERMAL CRYSTALLIZATION)
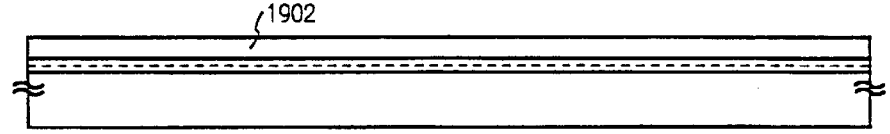
Fig. 23D LASER ANNEAL STEP
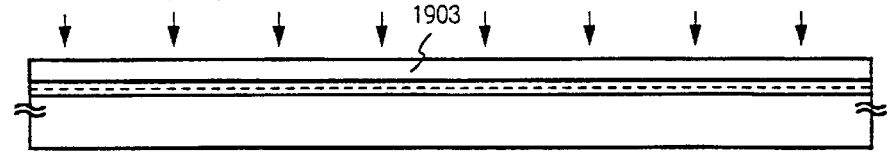

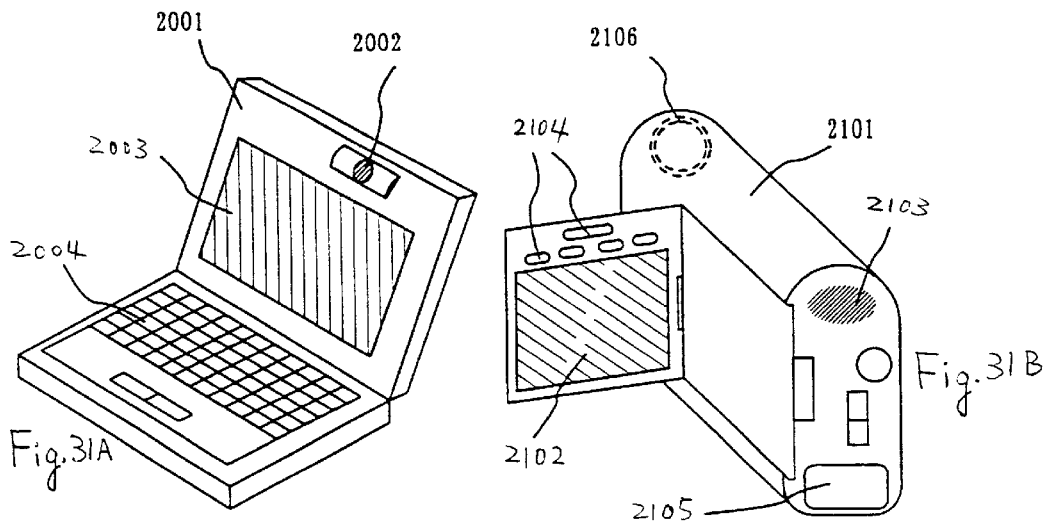
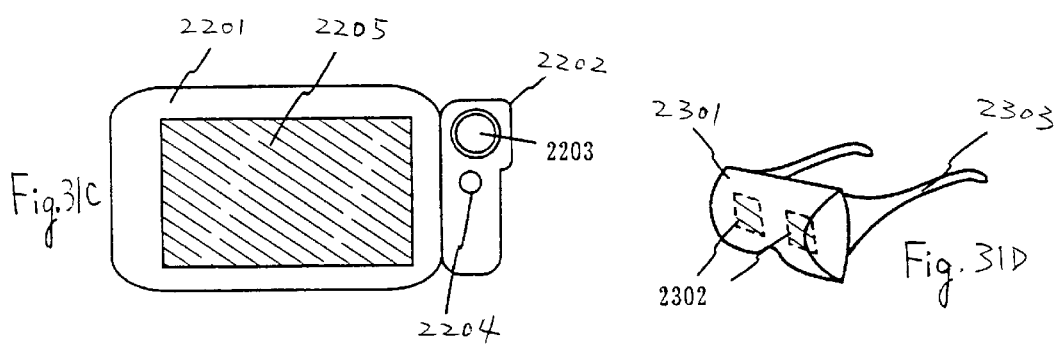
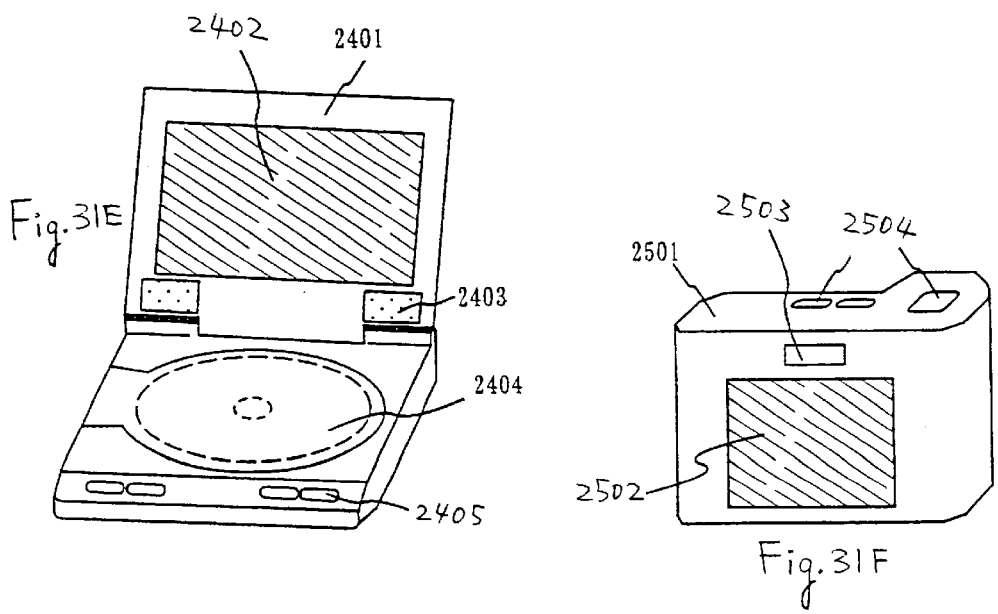

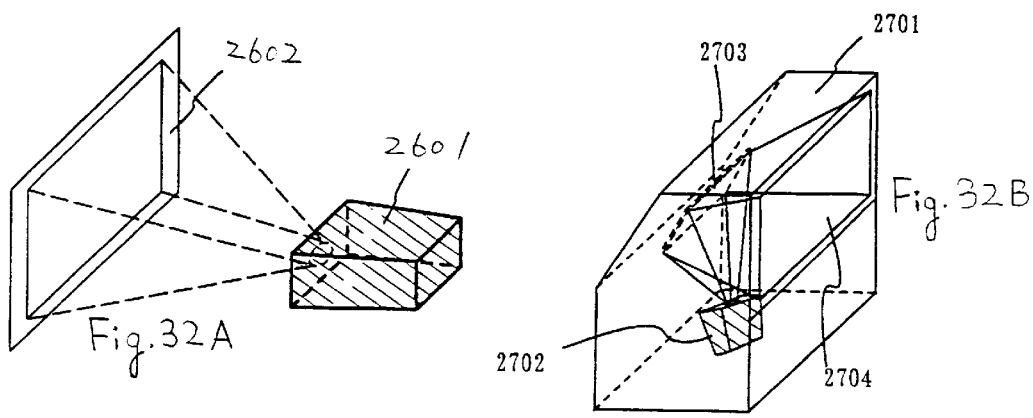
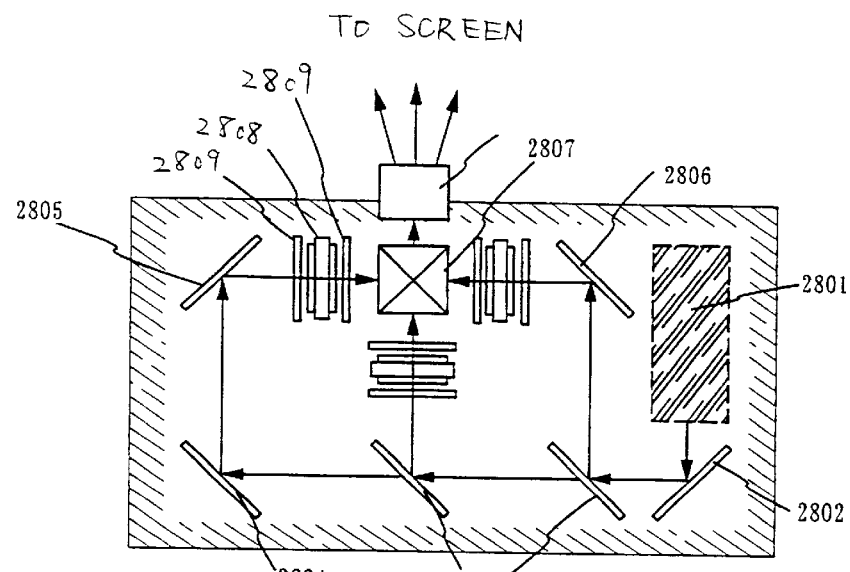
Fig. 32C PROJECTION UNIT (THREE PLATE SYSTEM)
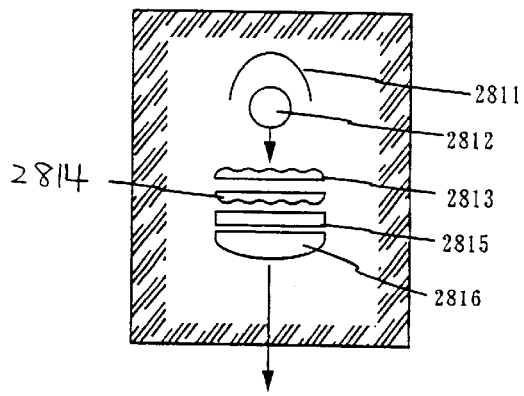
Fig. 32D LIGHT SOURCE OPTICAL SYSTEM

3006 アンテナ

LASER IRRADIATION APPARATUS, LASER IRRADIATION METHOD, AND METHOD FOR MANUFACTURING A SEMICONDUCTOR DEVICE

BACKGROUND OF THE INVENTION

1. Field of the Invention

The present invention relates to an apparatus for manufacturing a semiconductor device having a circuit structured with a thin film transistor. For example, the invention relates to an apparatus for manufacturing an electro-optical device, typically a liquid crystal display device, and the structure of electric equipment mounted with such an electro-optical device as a component. Note that throughout this specification, the semiconductor device indicates general devices that may function by use of semiconductor characteristics, and that the above electro-optical device and electric equipment are categorized as the semiconductor device.

2. Description of the Related Art

In recent years, the technique of crystallizing and improving the crystallinity of an amorphous semiconductor film or a crystalline semiconductor film (a semiconductor film having a crystallinity which is polycrystalline or microcrystalline, but is not a single crystal), in other words, a non-single crystal semiconductor film, formed on an insulating substrate such as a glass substrate by laser annealing, has been widely researched. Silicon film is often used as the above semiconductor film.

Comparing a glass substrate with a quartz substrate, which is often used conventionally, the glass substrate has advantages of low-cost and great workability, and can be easily formed into a large surface area substrate. This is why the above research is performed. Also, the reason for preferably using a laser for crystallization resides in that the melting point of a glass substrate is low. The laser is capable of imparting high energy only to the non-single crystalline film without causing much change in the temperature of the substrate.

The crystalline silicon film is formed from many crystal grains. Therefore, it is called a polycrystalline silicon film or a polycrystalline semiconductor film. A crystalline silicon film formed by laser annealing has high mobility. Accordingly, it is actively used in, for example, monolithic type liquid crystal electro-optical devices where thin film transistors (TFTs) are formed using this crystalline silicon film and used as TFTs for driving pixels and driving circuits formed on one glass substrate.

Furthermore, a method of performing laser annealing is one in which a laser beam emitted from a pulse oscillation type excimer laser, which is large in output, is processed by an optical system so that the laser beam thereof becomes a linear shape that is 10 cm long or greater or a square spot that is several cm square at an irradiated surface to thereby scan the laser beam (or relatively move the irradiation position of the laser beam to the irradiated surface). Because this method is high in productivity and industrially excellent, it is being preferably employed. A laser beam that has been linearized into a laser beam that is 10 cm long or greater at the irradiated surface is referred as a linear laser beam throughout the present specification.

Different from when using a spot shape (square) laser beam which requires a front, back, left, and right scan, when using the linear laser beam, in particular, the entire irradiated surface can be irradiated by the laser beam which requires only scanning at a right angle direction to the linear direction of the linear laser beam, resulting in the attainment of a high productivity. To scan in a direction at a right angle to the linear direction is the most effective scanning direction. Because a high productivity can be obtained, using the laser beam that is emitted from the pulse oscillation type excimer laser and processing it into a linear laser beam by an appropriate optical system for laser annealing at present is becoming a mainstream.

Shown in FIGS. 1A and 1B is an example of the structure of an optical system for linearizing the sectional shape of a laser beam on the irradiated surface. This structure is a very general one and all aforementioned optical systems conform to the structure of the optical system shown in FIGS. 1A to 1B. This structure of the optical system not only transforms the sectional shape of the laser beam into a linear shape, but also homogenizes the energy of the laser beam in the irradiated surface at the same time. Generally, an optical system that homogenizes the energy of a beam is referred to as a beam homogenizer.

If the excimer laser, which is ultraviolet light, is used as the light source, then the core of the above-mentioned optical system may be made of, for example, entirely quartz. The reason for using quartz resides in that a high transmittance can be obtained. Further, it is appropriate to use a coating in which a 99% or more transmittance can be obtained with respect to a wavelength of the excimer laser that is used.

The side view of FIG. 1A will be explained first. Laser beam emitted from a laser oscillator 101 is split at a right angle direction to the advancing direction of the laser beam by cylindrical lens arrays 102a and 102b. The right angle direction is referred to as a longitudinal direction throughout the present specification. When a mirror is placed along the optical system, the laser beams in the longitudinal direction will curve in the direction of light curved by the mirror. These laser beams in this structure are split into 4 beams. The split laser beams are then converged into 1 beam by a cylindrical lens 104. Then, the converged laser beam are split again and reflected at a mirror 107. Thereafter, the split laser beams are again converged into 1 beam at an irradiated surface 109 by a doublet cylindrical lens 108. A doublet cylindrical lens is a lens that is constructed of 2 pieces of cylindrical lenses. Thus, the energy in the width direction of the linear laser beam is homogenized and the length of the width direction of the linear laser beam is also determined.

The top view of FIG. 1B will be explained next. Laser beam emitted from the laser oscillator 101 is split at a right angle direction to the advancing direction of the laser beam and at a right angle direction to the longitudinal direction by a cylindrical lens array 103. The right angle direction is called a vertical direction throughout the present specification. When a mirror is placed along the optical system, the laser beams in the vertical direction will curve in the direction of light curved by the mirror. The laser beams in this structure is split into 7 beams. Thereafter, the split laser beams are converged into 1 beam at the irradiated surface 109 by the cylindrical lens 104. Thus, homogenization of the energy in the longitudinal direction of the linear laser beam is made and the length of the longitudinal direction is also determined.

The above lenses in the optical system are made of synthetic quartz for correspondence to excimer laser. Furthermore, coating is implemented on the surfaces of the lenses so that the excimer laser will be well transmitted.

Therefore, the transmittance of excimer laser through one lens is 99% or more.

By irradiating the linear laser beam linearized by the above structure of the optical system in an overlapping manner with a gradual shift in the width direction thereof, laser annealing is implemented to the entire surface of a non-single crystal silicon film to thereby crystallize the non-single crystal silicon film and thus its crystallinity can be enhanced.

A typical method of manufacturing a semiconductor film that is to become the object to be irradiated is shown next.

First, a 5 inch square Corning 1737 substrate having a thickness of 0.7 mm is prepared as the substrate. Then a 200 nm-thick $SiO_2$ film (silicon oxide film) is formed on the substrate and a 50 nm-thick amorphous silicon film (hereinafter denoted by "a-Si film") is formed on the surface of the $SiO_2$ film. Both films are formed by employing the plasma CVD apparatus.

The substrate is exposed under an atmosphere containing nitrogen gas at a temperature of 500° C. for 1 hour to thereby reduce the hydrogen concentration in the film. Accordingly, the laser resistance in the film is remarkably improved.

The XeCl excimer laser L3308 (wavelength: 308 nm, pulse width: 30 ns) manufactured by Lambda Co. is used as the laser apparatus. This laser apparatus generates a pulse oscillation laser and has the ability to output an energy of 500 mJ/pulse. The size of the laser beam at the exit of the laser beam is 10×30 mm (both half-width). Throughout the present specification, the exit of the laser beam is defined as the perpendicular plane in the advancing direction of the laser beam immediately after the laser beam is emitted from the laser irradiation apparatus.

The shape of the laser beam generated by the excimer laser is generally rectangular and is expressed by an aspect ratio which falls under the range of the order of 2 to 5. The intensity of the laser beam grows stronger towards the center of the beam and indicates the Gaussian distribution. The size of the laser beam processed by the optical system having the structure shown in FIG. 1 is transformed into a 125 mm×0.4 mm linear laser beam having a uniform energy distribution.

Based upon an experiment conducted by the present inventor, when irradiating a laser to the above-mentioned semiconductor film, the most suitable overlapping pitch is approximately 1/10 of the width (half-width) of the linear laser beam. The uniformity of the crystallinity in the film is thus improved. In the above example, the half-width of the linear laser beam was 0.4 mm, and therefore the pulse frequency of the excimer laser was set to 30 hertz and the scanning speed was set to 1.0 mm/s to thereby irradiate the laser beam. At this point, the energy density in the irradiated surface of the laser beam was set to 420 mJ/cm$^2$. The method described so far is a very general method employed for crystallizing a semiconductor film by using a linear laser beam.

When an extremely attentive observation is made to a silicon film that has been laser annealed by using the above-mentioned linear laser beam, very faint interference patterns were seen in the film. The cause of the interference patterns seen in the film resides in that the laser beam is split and assembled in 1 region, and therefore the split light brings about interference with each other. However, because the coherent length of the excimer laser is about several microns to several tenths of microns, a strong interference will not occur. As a result, the influence imparted by the above-mentioned interference to a semiconductor device is extremely small.

The excimer laser is large in output and capable of oscillating pulses repetitively at a high frequency (approximately 300 hertz under the present situation), and hence is often used in performing crystallization of a semiconductor film. In recent years, advances have been made in manufacturing low temperature poly-silicon TFTs used in liquid crystal displays. Accordingly, the excimer laser is employed in the crystallization process of semiconductor films.

Further, the largest output of an YAG laser is remarkably improved. Because the YAG laser is a solid state laser, it is easier to handle and maintain compared with the excimer laser which is a gas laser. Therefore, in the crystallization process of a semiconductor film, if the YAG laser is substituted for the excimer laser, an astounding improvement in cost performance can be expected. On the basis of the background such as the above, the present applicant is making an examination in the possibility of using the YAG laser in the crystallization process of a semiconductor film.

It is known that the YAG laser outputs a laser beam having a wavelength of 1065 nm as the fundamental wave. The absorption coefficient of this laser beam with respect to silicon films is extremely low, and therefore the laser beam as it is cannot be used in the crystallization process of the a-Si film, which is one of the silicon films. However, the laser beam, i.e., the fundamental wave, can be modulated into having a shorter wavelength by using a non-linear optical crystal. Due to the modulated wavelengths, the laser beam is named a second harmonic (wavelength 533 nm), a third harmonic (wavelength 355 nm), a fourth harmonic (wavelength 266 nm), and a fifth harmonic (wavelength 213 nm).

Since the wavelength of the second harmonic is 533 nm, it has sufficient absorption to an a-Si film that is about 50 nm thick, and hence can be used in crystallizing the a-Si film. In addition, the third harmonic, the fourth harmonic, and the fifth harmonic also have a high absorption to the above-mentioned a-Si film, and therefore similar crystallization can be performed.

The largest output of the second harmonic from the current general-purpose YAG laser is about 1500 mJ/pulse. Further, the largest output of the third harmonic thereof is about 750 mJ/pulse and the largest output of the fourth harmonic thereof is about 200 mJ/pulse. The largest output of the fifth harmonic is further lower than the aforementioned largest outputs, and thus if the fifth harmonic is used in crystallizing the a-Si film, mass production will become extremely worse. Taking into consideration both the output of the laser beam and its absorption to the a-Si film, at the present level, it is best to use the second harmonic and the third harmonic.

In the case of using the YAG laser to crystallize the semiconductor film, nonetheless, the shape of the laser beam at the irradiated surface is preferably linear for mass production. Hereinbelow, an examination is made on the possibility of applying the above-mentioned optical system to the YAG laser without any modifications made thereto.

First, the difference between the beam shape of the YAG laser and the beam shape of the excimer laser will be described. The shape of the laser beam emitted from the excimer laser is generally rectangular, whereas the shape of the laser beam emitted from the YAG laser is both circular and rectangular. To process a rectangular laser beam into a linear laser beam is comparatively easy since transformation is made from a rectangular shape to a rectangular shape. However, to transform a circular beam into a rectangular linear laser beam is comparatively difficult. Therefore, judging from the shape of the beam only, it is better to use the rectangular beam emitted from the YAG laser than to use the circular beam emitted therefrom.

Hereinafter, a description will be made on the uniformity of energy between the beam of the YAG laser which emits the rectangular beam and the beam of the YAG laser which emits the circular beam, and an examination is conducted to discern which one of the YAG lasers is suitable as a substitute for the excimer laser.

The type of YAG laser which has a beam shape that is circular irradiates a strong light (flash lamp and laser diode, hereinafter denoted by LD) for exciting a cylindrical crystal rod, thereby obtaining laser oscillation. On the other hand, the type of YAG laser which has a beam shape that is rectangular irradiates a strong light to a parallelepiped crystal rod that structures a system called a zigzag slub, thereby obtaining laser oscillation.

Comparing the energy uniformity of the beam oscillated from the YAG laser which has a beam shape that is circular with that of the excimer laser, the energy uniformity of the former is in general not good. This non-uniformity of energy originates from a temperature distribution of the above-mentioned cylindrical crystal rod which occurs from the application of a strong light. As can be readily surmised from the shape of the aforementioned cylindrical crystal rode, the temperature of the temperature distribution thereof becomes lower towards the exterior of the cylinder. Thus, a function similar to that of a lens is added to the aforementioned cylindrical crystal rod, thereby worsening the energy uniformity of the beam. This phenomenon is generally called the thermal lens effect.

A system conceived for the purpose of restraining the above thermal lens effect is a zigzag slub system of the YAG laser. The structure of the zigzag slub system of the YAG laser will be briefly explained with reference to FIG. 2 in the following.

The rod system YAG laser obtains laser oscillation by excitation of the cylindrical crystal called a crystal rod. However, in the case of the zigzag slub system YAG laser, the shape of the crystal rod is parallelepiped. A parallelepiped crystal 202 is irradiated by excitation lamps 203a and 203b, for example, an LD and a flash lamp, to thereby obtain laser oscillation. Electric power is supplied to the excitation lamps 203a and 203b from a power source 208. Furthermore, the parallelepiped crystal 202 is cooled by a cooler 207.

Arranging resonant mirrors 201 and 204 diagonally to the parallelepiped crystal 202 is a characteristic of the zigzag slub system. The resonant mirrors 201 and 204 are arranged parallelly in a state facing each other and sandwiching the parallelepiped crystal 202. Each of the surfaces of the parallelepiped crystal 202 and the resonant mirrors have no parallel positional relationship. By appropriately adjusting the positional relationship, light reflected from the resonant mirrors will advance in a zigzag way within the parallelepiped crystal. When laser is oscillated at this point in this state, a large amount of light will exit from a side surface of the parallelepiped crystal resulting in a large lost of energy, and thus becoming unusable. In order to prevent this drawback, reflector mirrors 205 and 206 are arranged at the side surfaces of the parallelepiped crystal to thereby prevent light escaping from the parallelepiped crystal 202. Gold-plated mirrors, for example, may be used as the reflector mirrors 205 and 206.

By adopting the above structure, the laser beam not only passes through the interior portion of the parallelepiped crystal rod, but also passes through the exterior portion thereof. Thus, influence to the biased laser beam of the temperature distribution of the crystal is less than the case of using the cylindrical crystal rod. Consequently, influence from the thermal lens effect becomes lesser thereby enhancing the uniformity of the beam.

Thus, it can be determined from the above examination that the zigzag system YAG laser is suitable as a substitute for the excimer laser than the type of YAG laser which employs the cylindrical crystal rod because the shape of the laser beam emitted from the zigzag system YAG laser is similar to that of the excimer laser and the uniformity of the beam thereof is higher.

Next, consideration is made in regards to a difference in the coherent length of the YAG laser and the excimer laser. As stated above, the coherent length of the excimer laser is about several microns to several tenths of microns, and therefore the occurrence of light interference when the laser beam passes through the aforementioned optical system, which splits and then converges the laser beam into 1 beam again, is thus very weak. On the other hand, the coherent length of the YAG laser is quite long, about 1 cm or more. Hence, the influences of the interference due to this long coherent length of the YAG laser cannot be ignored.

If the laser beam emitted from the YAG laser is passed through the optical system shown in FIG. 1 to be processed into a linear laser beam, then a linear laser beam 300 having an energy distribution with repetitive strong and weak regions in a lattice pattern as shown in FIG. 3A is formed.

The lattice pattern energy distribution is caused by the light interference. In FIG. 3A, darker lines 301 denotes regions where the energy is comparatively high and blank lines 302 between the darker lines 301 denotes regions where the energy is comparatively low.

Using the linear laser beam 300, which has a lattice pattern energy distribution, to crystallize the a-Si film will nonetheless cause non-uniform crystallization in the surface of the a-Si film. Shown in FIG. 3B is the appearance of a front surface of a silicon film 303 crystallized by the linear laser beam. As described in the above, the linear laser beam is irradiated on the a-Si film in the width direction of the linear laser beam and overlaps each other in a manner that is about $\frac{1}{10}$ of the length of the width of the laser beam. Therefore, the stripes parallel to the linear direction of the linear laser beam eliminate each other out, becoming inconspicuous. However, lines 304 and 305 that are parallel to the width direction of the laser beam strongly remain. In FIG. 3B, darker lines 304 denotes regions where the energy is comparatively high and blank lines 305 between the darker lines 304 denotes regions where the energy is comparatively low.

SUMMARY OF THE INVENTION

The present invention has been made in view of the above, and therefore has an object thereof to select an appropriate YAG laser as a substitute for an excimer laser used for the crystallization of a semiconductor film, and to resolve the aforementioned problem of an interference pattern, thereby providing a laser irradiation apparatus for attaining a polycrystalline silicon film having very little stripe patterns.

The inventors of the present invention have selected a zigzag slub system YAG laser, which has a rectangular beam shape, as the appropriate YAG laser for employment in the crystallization of a semiconductor film. In the present invention, it is important that the shape of the beam is rectangular, and there is no particular problem in using a YAG laser of a different system. However, the present inventor considers the zigzag slub system as the most suitable system among the current systems of the YAG laser at present. Further, the laser irradiation apparatus disclosed in the present specification is not particularly limited to one that emits a rectangular laser beam, but a laser irradiation apparatus that emits a circular laser beam may also be used.

As a problem that occurs when the YAG laser is used in crystallizing the semiconductor film is that interference, as mentioned in the above paragraph, is liable to occur in the YAG laser compared with the excimer laser.

The present invention will provide a technique to suppress an influence of the interference pattern. As mentioned before, the oscillation wavelength of the YAG laser includes a fundamental wave (1.06 um), a second harmonic (0.53 um), a third harmonic (0.35 um), a fourth harmonic, a fifth harmonic, and so forth.

Shown in FIG. 4A is a schematic view of a simplified beam homogenizer having the second harmonic of the YAG laser as a light source. A fundamental wave emitted from a light source 401 is converted into the second harmonic by a non-linear optical element 402. Because components of the fundamental wave still remain in the laser beam converted into the second harmonic, at a beam splitter 403, only the fundamental wave is transmitted and the second harmonic is reflected. Next, the light path of the second harmonic is bend 90 degrees by a mirror 404, and then split into 2 beams by a cylindrical lens array 405. Thereafter, the split beams are converged into 1 beam at an irradiated surface 407 by a cylindrical lens 406. At the irradiated surface 407 at this point, lights having equivalent wavelengths advance in opposite directions to each other, thereby interfering with each other. The pattern of interference that has developed in the irradiated surface 407 is shown in FIG. 4B. The pattern of interference illustrated in FIG. 4B is one in which plural patterns of wave shapes that change with time are overlapped. Throughout the present specification, a plural number of patterns of interference are shown, but all will be shown in the same method as that of FIG. 4B.

A stationary wave is formed when lights of equivalent wavelengths advance in opposite direction from each other. However, in a portion where energy is weak, the energy thereof becomes extremely weak. Thus, when a region having an immense energy difference is formed, a massive decline in the uniformity of crystallization by using laser is therefore unavoidable.

Accordingly, by utilizing the characteristic of the YAG laser capable of simultaneously emitting plural kinds of wavelengths of light, the present inventor designed a method of making the interference pattern inconspicuous by compositing YAG lasers of different wavelengths.

An example of a system that is capable of making the interference pattern inconspicuous is shown in FIG. 5A. Light (fundamental wave) oscillated from a resonator 501 of the YAG laser is converted into the second and third harmonic, besides being converted to the fundamental wave, via a non-linear crystal 502 for converting wavelengths. The fundamental wave is split by a beam splitter 503 which is provided with functions to satisfactorily penetrate the wavelength region of the fundamental wave, and to satisfactorily reflect the other wavelengths. Lights having the second and third harmonic reflected from the beam splitter 503 intermingled can thus be formed. Then at a beam splitter 504, only the second harmonic is reflected while the third harmonic is transmitted. Finally, the advancing direction of the third harmonic is alternated by a reflector mirror 505 so that the advancing direction thereof is the same as the advancing direction of the second harmonic.

Thus, a YAG laser capable of simultaneously emitting 3 types of lights, that is, the fundamental wave, the second harmonic, and the third harmonic, can be made through the above structure. Not much of the fundamental wave is absorbed by the silicon film, and hence is not used in the crystallization of the silicon film. The second and third harmonic are used in the crystallization thereof.

Shown in FIG. 34 is a wavelength dependence of a ratio of the absorption of light to a 55 nm-thick a-Si film formed on a glass substrate. As can be known from the graph, when light having a wavelength of 600 nm or less is used, there is a 10 percent or more absorption to the silicon film. Therefore, when the present invention is applied to a 55 nm-thick a-Si film, light having a wavelength of 600 nm or less is used.

The second harmonic is split into 2 beams by a cylindrical lens array 506. On the other hand, the third harmonic is split into 2 beams by a cylindrical lens array 507. The cylindrical lens arrays 506 and 507 are set at positions with equivalent focal lengths. Finally, a cylindrical lens 508 is arranged and the laser beam which has been split into 4 beams are composited to 1 region by the cylindrical lens 508.

The second harmonic and the third harmonic enter the cylindrical lens 508. Therefore, though there is a few percentage of difference in the focal length to the second harmonic and the third harmonic with each other, there is no influence to the present experiment. Quartz, which has a high transmissivity to both the second harmonic and the third harmonic, is used as the material of the lenses. Interference occurs in an irradiated surface 509 due to the fact that the second harmonic and the third harmonic advance in opposite directions from each other. A simulation result of the pattern of interference formed in the irradiated surface 509 is shown in FIG. 5B. It is apparent from the graph of FIG. 5B that nodes caused by the interference have disappeared.

FIG. 6 is a view illustrating the state of an interference that has occurred when the second harmonic and the third harmonic having equivalent swinging widths with each other are made to advance in opposite directions from each other at equivalent speeds. In FIG. 6, the longitudinal axis denotes the intensity of light and the lateral axis denotes a position. As can be understood from FIG. 6, it is apparent that the energy distribution of light is more balanced in this case than in the case of using only the second harmonic.

An output of the second harmonic emitted from the YAG laser having the structure of FIG. 5 is about twice the size of an output of the third harmonic. Therefore, in order to synthesize the second harmonic and the third harmonic emitted from the YAG laser having the structure of FIG. 5 to thereby make the interference patterns inconspicuous, it is necessary to consider synthesizing a second harmonic that has a swinging width of $\sqrt{2}$ and a third harmonic that has a swinging width of 1. The simulation result thereof is shown in FIG. 7. Making the swinging width of the second harmonic of FIG. 6 to $\sqrt{2}$ times is the result of FIG. 7. Similar to the result of FIG. 6, the energy distribution of light is also satisfactorily balanced in FIG. 7.

Thus, from the above results, it can be surmised that the contrast of a strong and weak pattern of the energy caused by the interference can be easily suppressed by synthesizing lights having different wavelengths from each other. Actually, similar results can be expected from synthesizing the second harmonic and the fourth harmonic and synthesizing the third harmonic and the fourth harmonic. An example of synthesizing the second harmonic and the fourth harmonic is shown in FIG. 8, and an example of synthesizing the third harmonic and the fourth harmonic is shown in FIG. 9. It is apparent that the energy is made uniform in both examples. Energy uniformity can also be achieved even if 3 types or more different wavelengths of laser beams are mixed together. In other words, by irradiating each of the laser beams having different wavelengths from each other to the same region and at the same time, uniformity of the laser beam in the same region can be improved.

The above-mentioned method of making the interference pattern inconspicuous by synthesizing laser beams of different wavelengths is applied to the optical system for forming linear laser beams that is illustrated in FIG. 1. The interference pattern is made inconspicuous by making laser beams of different wavelengths advance in opposite directions from each other at equivalent speeds. For example, the effect of making the interference pattern inconspicuous can be obtained in an optical system for forming linear laser beams illustrated in FIG. 10. The optical system shown in FIG. 10 is a beam homogenizer, similar to the optical system shown in FIG. 1. The basic perspective of constructing the lenses in both optical systems is the same.

The role of the optical system structured as shown in FIG. 10 will be explained. The aforementioned YAG laser is used as a laser oscillator. The YAG laser oscillates the second harmonic and the third harmonic in addition to the fundamental wave. The fundamental wave outputted from a laser resonator 1001 is converted into the second harmonic and the third harmonic by a non-linear optical element 1002. Components of the fundamental wave remain in the second harmonic and the third harmonic. Next, the fundamental wave is separated by a beam splitter 1003 while the second harmonic and the third harmonic are introduced to a beam splitter 1004. The second harmonic and the third harmonic are further separated into a second harmonic and a third harmonic by the beam splitter 1004.

Penetrating the beam splitter 1004, the advancing direction of the third harmonic is bent by reflector mirrors 1005 and 1006. As a result, the second harmonic and the third harmonic exit at oblique opposite angle positions in the form of being parallel with each other.

The second harmonic is first split into 2 beams in the vertical direction by a cylindrical lens array 10071, and then split into 2 beams in the horizontal direction by a cylindrical lens array 10081. These split laser beams are converged into 1 beam at an irradiated surface 1011 by cylindrical lenses 10091 and 10101.

On the other hand, the third harmonic is first split into 2 beams in the vertical direction by cylindrical lens array 10072, and then split into 2 beams in the horizontal direction by a cylindrical lens array 10082. These split beams are converged into 1 beam at the irradiated surface 1011 by cylindrical lenses 10092 and 10102.

The reason why the structure of FIG. 10 is able to make the interference pattern become inconspicuous will be explained with reference to FIG. 11. FIG. 11 is a top view of the optical system of FIG. 10. The laser beam split into 4 laser beams and converged into 1 beam in the longitudinal direction of the linear laser beam are denoted by the following names, respectively: laser beam A (the laser beam that passes the outermost right-hand side), laser beam B (the laser beam that passes the inner side of the right-hand side), laser beam C (the laser beam that passes the inner side of the left-hand side), and laser D (the laser beam that passes the outermost left-hand side).

Laser beam A is the third harmonic and laser beam D is the second harmonic. Both laser beams are advancing in opposite directions from each other at equivalent speeds, and therefore the effect of making the interference pattern in the irradiated surface 1011 inconspicuous is attained. Laser beam B is the third harmonic and laser beam C is the second harmonic. Both laser beams are advancing in opposite directions from each other at equivalent speeds, thereby attaining the effect of making the interference pattern in the irradiated surface 1011 inconspicuous. That is, laser beam A and laser beam D erase an interference effect with each other. Furthermore, laser beam B and laser beam C erase an interference effect with each other.

Shown in FIG. 12A is the state of an interference in the irradiated surface 1011, which is calculated by a computer, when the laser beams in FIG. 11 are all second harmonic. In this graph, it is apparent that the formation of loops and nodes are distinctive due to the influence of interference. On the other hand, shown in FIG. 12B is the state of an interference in the irradiated surface 1011 when the above method is adopted in the optical system of FIG. 11. The loops and nodes that were seen in FIG. 12A have disappeared, and hence it is discerned that the energy has been made uniform. The essence of the present invention is in making each of the lights having different wavelengths uniform and then synthesizing the respective uniform lights into 1 light in the irradiated surface.

Accordingly, the possible stripe pattern developing in the semiconductor film when the semiconductor film is laser annealed with a YAG laser that has been processed into a linear laser beam can thus be made unnoticeable. Although cited in the present specification is an example of taking out laser beams having different wavelengths from each other from 1 laser oscillator, there is no influence of any kind inflicted upon the essence of the present invention even if laser beams having different wavelengths from each other are taken out from 2 laser oscillators. In this case, a trigger is tuned in to so that the emission of lasers having different wavelengths from each other may be performed at the same time. The present invention is not limited to the YAG laser but can be applied to all laser irradiation apparatuses having a long coherent length such as a glass laser and an Ar laser. In addition, the present invention is not limited to a linear laser beam that has a linear section in the irradiated surface but is also applicable to a rectangular laser beam having a small aspect ratio. The present invention is further applicable to a square shape laser beam.

That is, according to the present invention, there is provided a laser irradiation apparatus that irradiates a laser beam with a section which becomes linear, square-like, or rectangular in an irradiated surface, characterized by comprising a laser oscillator that emits a plurality of laser beams having different wavelengths from each other, an optical system for processing the plurality of sectional laser beams having different wavelengths from each other into a square-like or rectangular laser beam in the irradiated surface, respectively, and making an energy distribution uniform, and a stage for arranging an object to be irradiated.

According to another aspect of the present invention, there is provided a laser irradiation apparatus that irradiates a laser beam with a section which becomes linear in an irradiated surface, characterized by comprising a laser oscillator that emits a plurality of laser beams having different wavelengths from each other, an optical system for processing the plurality of sectional laser beams having different wavelengths from each other into a linear laser beam in the irradiated surface, respectively, and making an energy distribution uniform, and a means of relatively moving the object to be irradiated to the laser beam.

In any of the above-mentioned inventions, since the laser oscillator is a YAG laser and the maintenance of the laser apparatus is easy to manage, productivity is increased and is thus preferable. Further, the YAG laser is capable of generating harmonics readily, and hence is suitable for use in the present invention.

Also, in any of the above-mentioned inventions when the object to be irradiated is a non-single crystal silicon film, laser beams having a wavelength of 600 nm or less may be used as the laser beams having different wavelengths from each other because the processing efficiency is high. For example, it is good to use the combination the second harmonic and the third harmonic of the YAG laser, or the combination the second harmonic and the fourth harmonic of the YAG laser, or the combination the third harmonic and the fourth harmonic of the YAG laser because the processing efficiency is high. Other than the YAG laser, a YVO4 laser, a glass laser, etc. can be used in the present invention.

Both of the above-mentioned laser apparatuses have a load/unload chamber, a transfer chamber, a pre-heat chamber, a laser irradiation chamber, and a cooling chamber. Both laser apparatuses are preferred for they can be used in mass production.

Further, according to another aspect of the present invention, there is provided a laser irradiation method that simultaneously irradiates each of a plurality of laser beams having different wavelengths from each other to a same region, characterized in that the shape of the laser beam in the same region is square-like or rectangular.

Further, according to another aspect of the present invention, there is provided a laser irradiation method that simultaneously irradiates each of a plurality of laser beams having different wavelengths from each other to a same region, characterized in that the shape of the laser beam in the same region is linear.

Further, according to another aspect of the present invention, there is provided a laser irradiation method that simultaneously irradiates each of a plurality of laser beams having different wavelengths from each other to a same region of a substrate having a non-single crystal semiconductor film formed thereon, characterized in that the shape of the laser beam in the same region is square-like or rectangular.

Further, according to another aspect of the present invention, there is provided a laser irradiation method that simultaneously irradiates each of a plurality of laser beams having different wavelengths from each other to a same region of a substrate having a non-single crystal semiconductor film formed thereon, characterized in that the shape of the laser beam in the same region is linear and that the linear laser beam is irradiated to the non-single crystal semiconductor film while relatively scanning the linear laser beam to the non-single crystal semiconductor film.

Still further, according to another aspect of the present invention, there is provided a method of manufacturing a semiconductor device provided with a TFT formed on a substrate, characterized by comprising the steps of forming a non-single crystal semiconductor film on the substrate and simultaneously irradiating a plurality of laser beams having different wavelengths from each other to a certain region of the non-single crystal semiconductor film.

Still further, according to another aspect of the present invention, there is provided a method of manufacturing a semiconductor device provided with a TFT formed on a substrate, characterized by comprising the steps of forming a non-single crystal semiconductor film on the substrate and simultaneously irradiating a plurality of laser beams having different wavelengths from each other to a region of the non-single crystal semiconductor film to thereby transform the non-single crystal semiconductor film into a crystalline semiconductor film.

In any one of the above-mentioned inventions, the laser beam is a YAG laser and the maintenance of the laser apparatus can be easily managed, and therefore the inventions thereof are appreciated. Also, because the plurality of laser beams having different wavelengths from each other have a wavelength of 600 nm or less in any one of the above-mentioned inventions, their absorption to the semiconductor film is large and hence the inventions thereof are appreciated. As laser beams having a wavelength of 600 nm or less, there are, for example, the second harmonic, the third harmonic, and the fourth harmonic of the YAG laser.

BRIEF DESCRIPTION OF THE DRAWINGS

The above and other objects and features of the present invention will become more apparent from the following description taken in conjunction with the accompanying drawings:

FIGS. 1A and 1B are diagrams showing a side view and a top view, respectively, of a conventional optical system that forms a linear laser beam;

FIG. 3A is a view showing an energy distribution of a linear laser beam and FIG. 3B is a view showing the state of a silicon film irradiated with a linear laser beam while the linear laser beam is scanned in a direction at a right angle in the longitudinal direction thereof;

FIG. 14 is a diagram showing a laser irradiation apparatus for mass production;

FIGS. 15A to 15D are diagrams showing an example of a manufacturing process of the present invention;

FIGS. 16A to 16D are diagrams showing an example of a manufacturing process of the present invention;

FIGS. 17A to 17D are diagrams showing an example of a manufacturing process of the present invention;

FIGS. 18A to 18C are diagrams showing an example of a manufacturing process of the present invention;

FIG. 19 is a diagram showing an example of a manufacturing process of the present invention;

FIG. 21 is a diagram showing the cross-sectional structure of a liquid crystal display device;

FIGS. 22A to 22C are diagrams showing an example of a manufacturing process of the present invention;

FIGS. 23A to 23D are diagrams showing an example of a manufacturing process of the present invention;

FIGS. 31A to 31F are diagrams showing examples of an electronic device;

FIGS. 32A to 32D are diagrams showing examples of an electronic device;

DESCRIPTION OF THE PREFERRED EMBODIMENTS

Embodiment Mode of the Present Invention

First, an example of irradiating a laser beam, which has been processed into a linear laser beam at an irradiated surface, to a 5 inch square substrate having an a-Si film formed thereon as an object to be irradiates is shown.

A 0.7-thick Corning 1737 is used as the substrate. If the Corning 1737 substrate has sufficient durability up to a temperature of 600° C. An $SiO_2$ film is formed to a thickness of 200 nm on one side of the substrate by plasma CVD. Further, a 55 nm-thick a-Si film is formed thereon. As the film deposition method, for example, sputtering or the like may be used.

The substrate, completed with the formation of the silicon films, is exposed in a nitrogen atmosphere at a temperature of 500° C. for 1 hour to thereby reduce the hydrogen concentration in the a-Si film. The laser resistance of the a-Si film can thus be enhanced. An appropriate concentration of hydrogen inside the a-Si film is on the order of $10^{20}$ atoms/$cm^3$. The formation of the object to be irradiated is thus completed. Then laser is irradiated to the object to thereby perform crystallization of the a-Si film.

Before performing laser irradiation to the a-Si film, heat may be applied thereto to perform crystallization. For example, the a-Si film may be crystallized by adding therein an element that promotes crystallization and then performing heat treatment. The details regarding the method of crystallizing the a-Si film by adding therein an element that promotes crystallization and then applying heat is explained in Embodiment 1.

Figure 2:
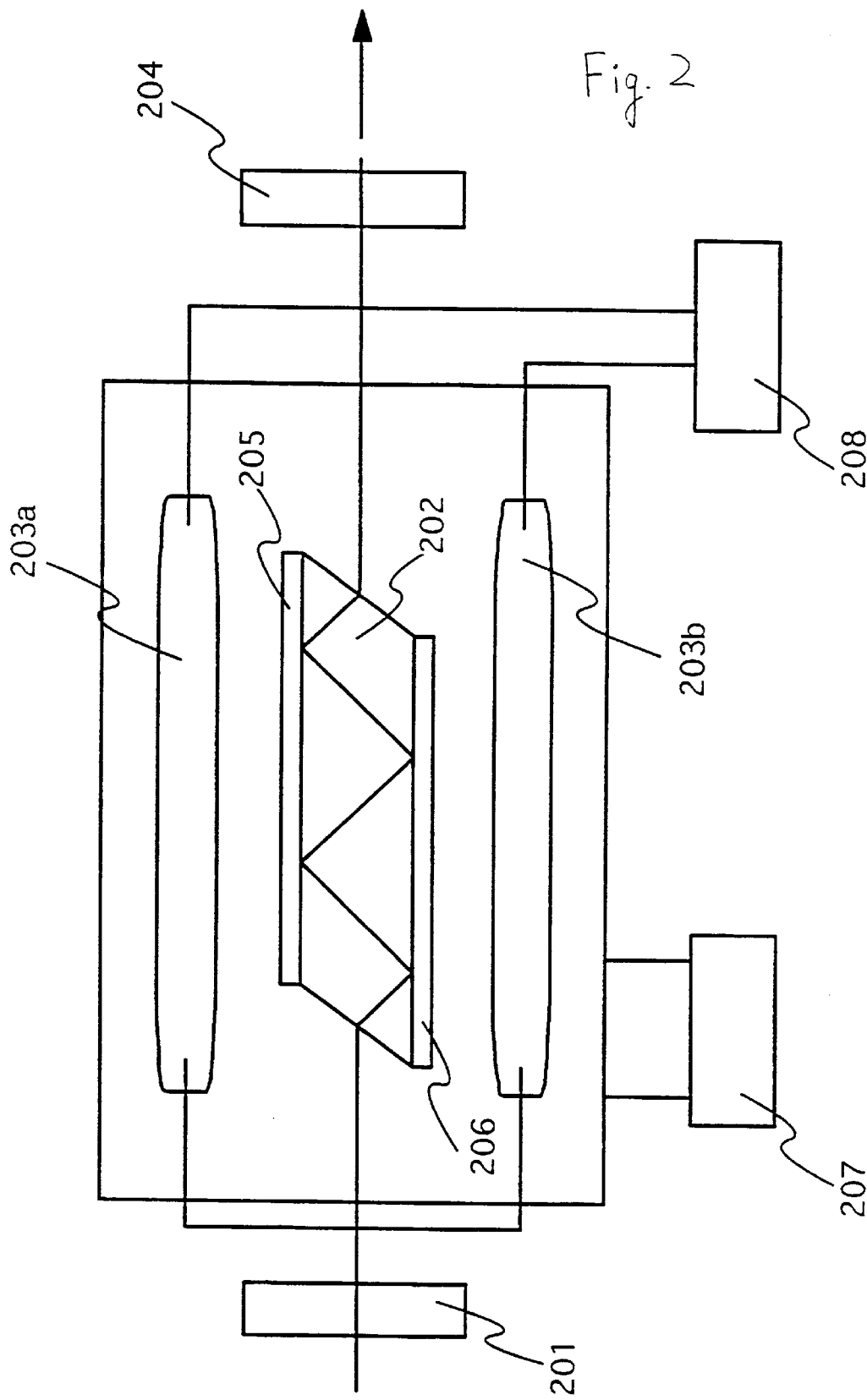
FIG. 2 is a view illustrating the structure of a YAG laser of a zigzag slub system.
Figure 4A:
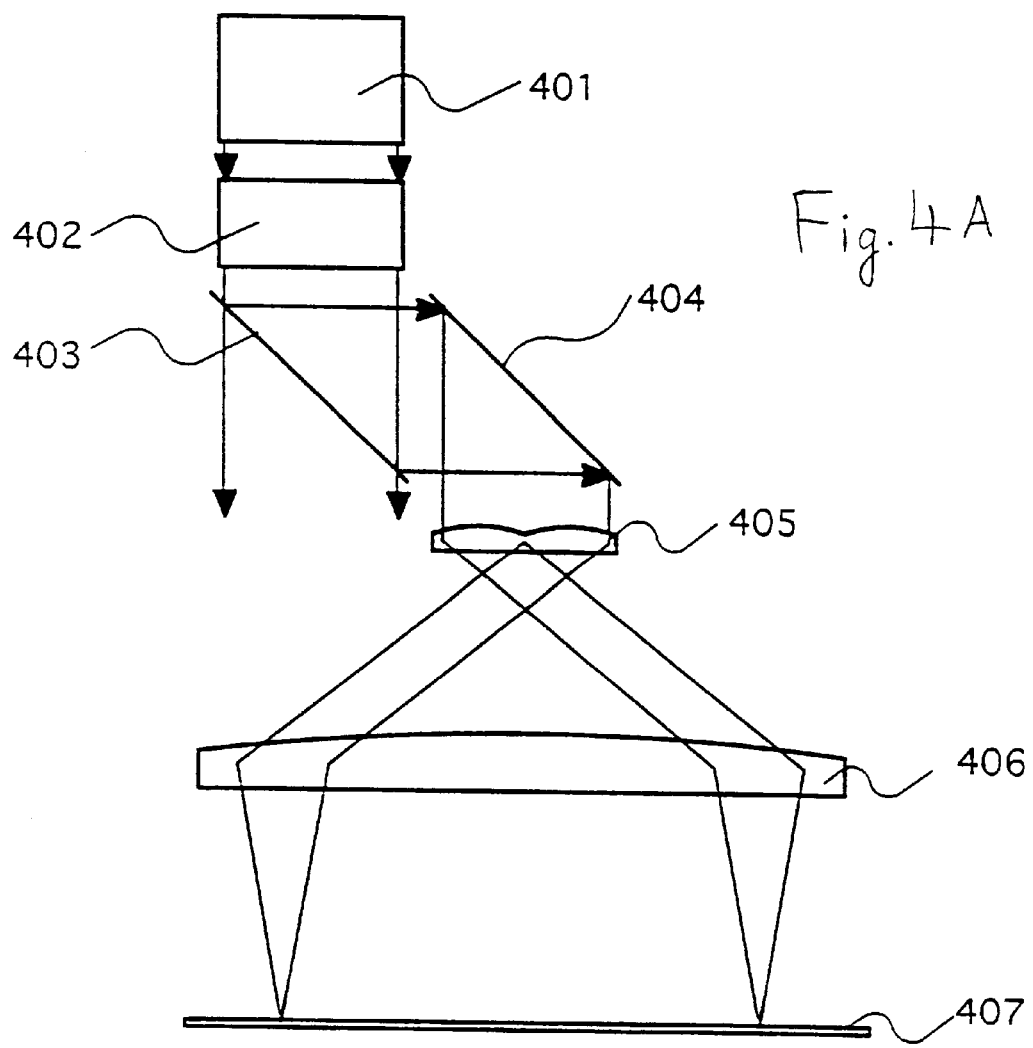
FIG. 4A is a view showing an example of an optical system processing a second harmonic of a YAG laser into a linear laser beam by using a beam homogenizer.
Figure 4B:
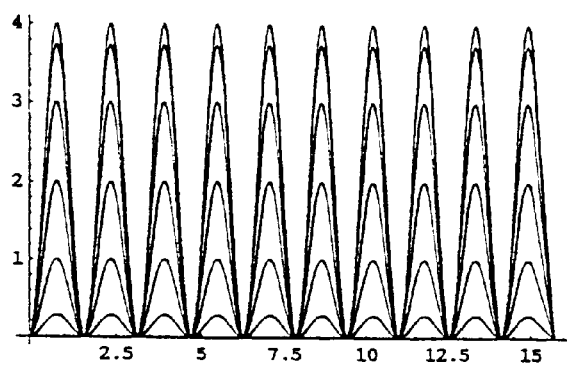
FIG. 4B is a view illustrating a profile of an interference caused by the second harmonic of the YAG laser which is processed into a linear laser beam by using the beam homogenizer.
Figure 5A:
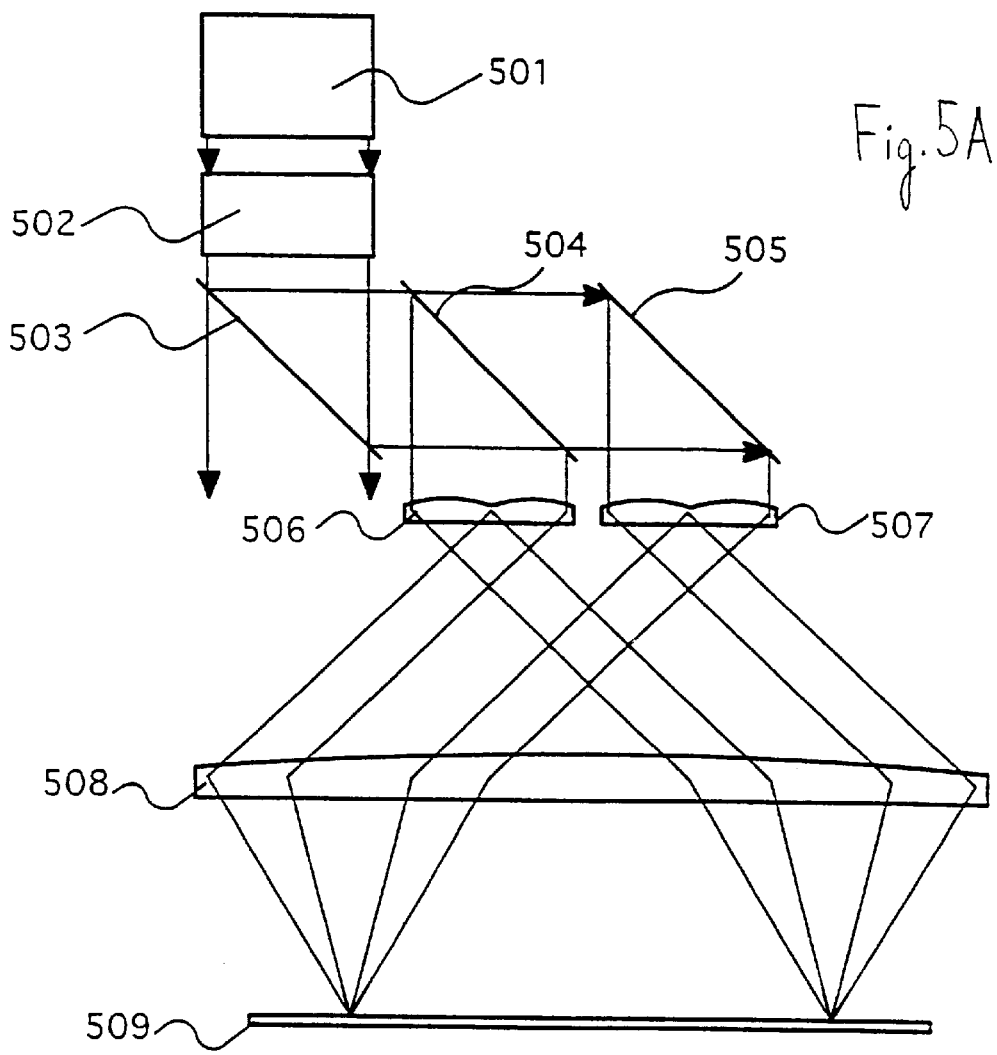
FIG. 5A is a view showing an example of an optical system using a beam homogenizer to synthesize a second harmonic and a third harmonic of a YAG laser to thereby form a linear laser beam.
Figure 5B:
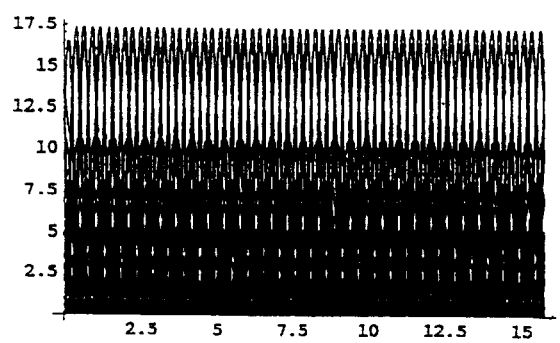
FIG. 5B is view illustrating a profile of an interference caused by the second harmonic and the third harmonic of the YAG laser which are synthesized and processed into a linear laser beam by using the beam homogenizer.
Figure 6:
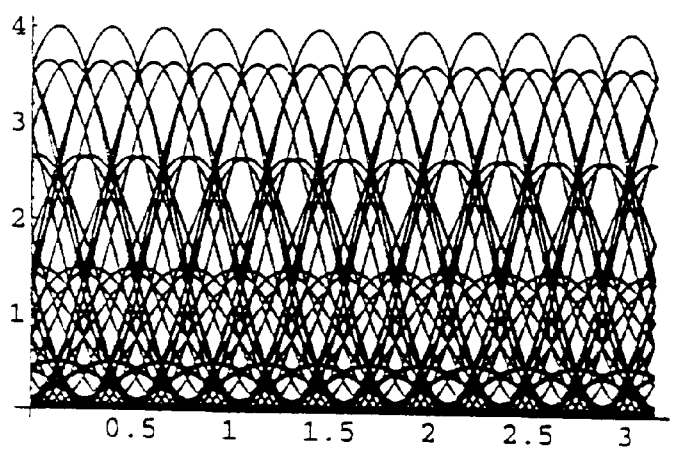
FIG. 6 is a view illustrating a calculation result of an energy intensity distribution of a light interference.
Figure 7:
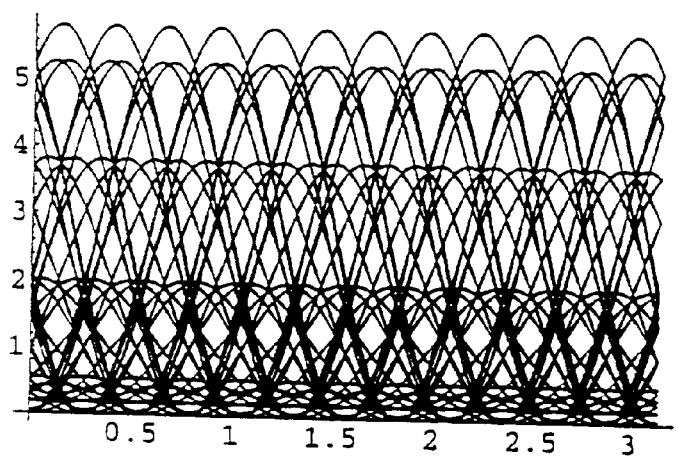
FIG. 7 is a view illustrating a calculation result of an energy intensity distribution of a light interference.
Figure 8:
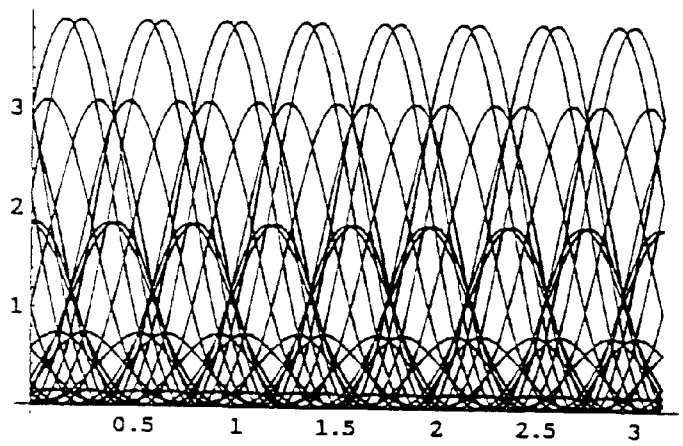
FIG. 8 is a view illustrating a calculation result of an energy intensity distribution of a light interference.
Figure 9:
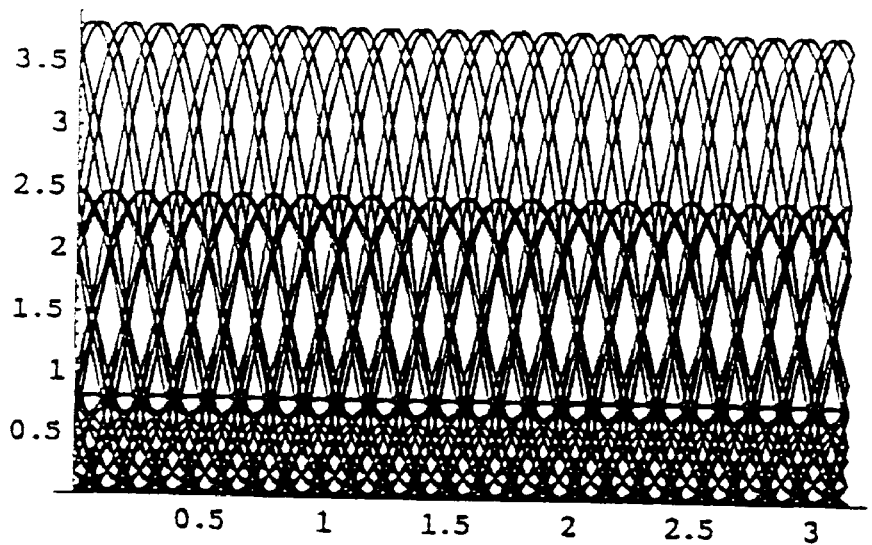
FIG. 9 is a view illustrating a calculation result of an energy intensity distribution of a light interference.
Figure 10:
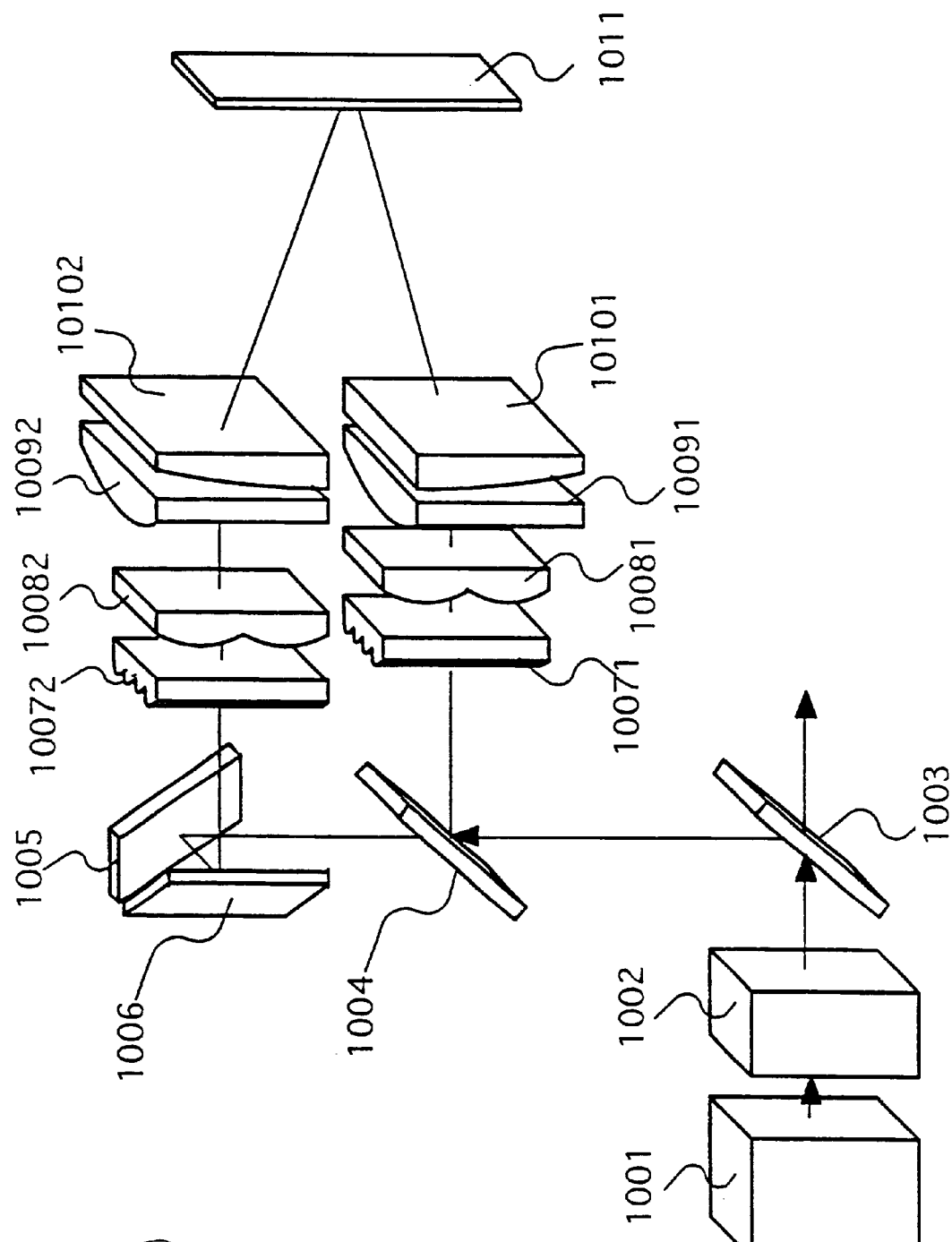
FIG. 10 is a diagram showing an example of a laser irradiation apparatus disclosed in the present invention.
Figure 11:
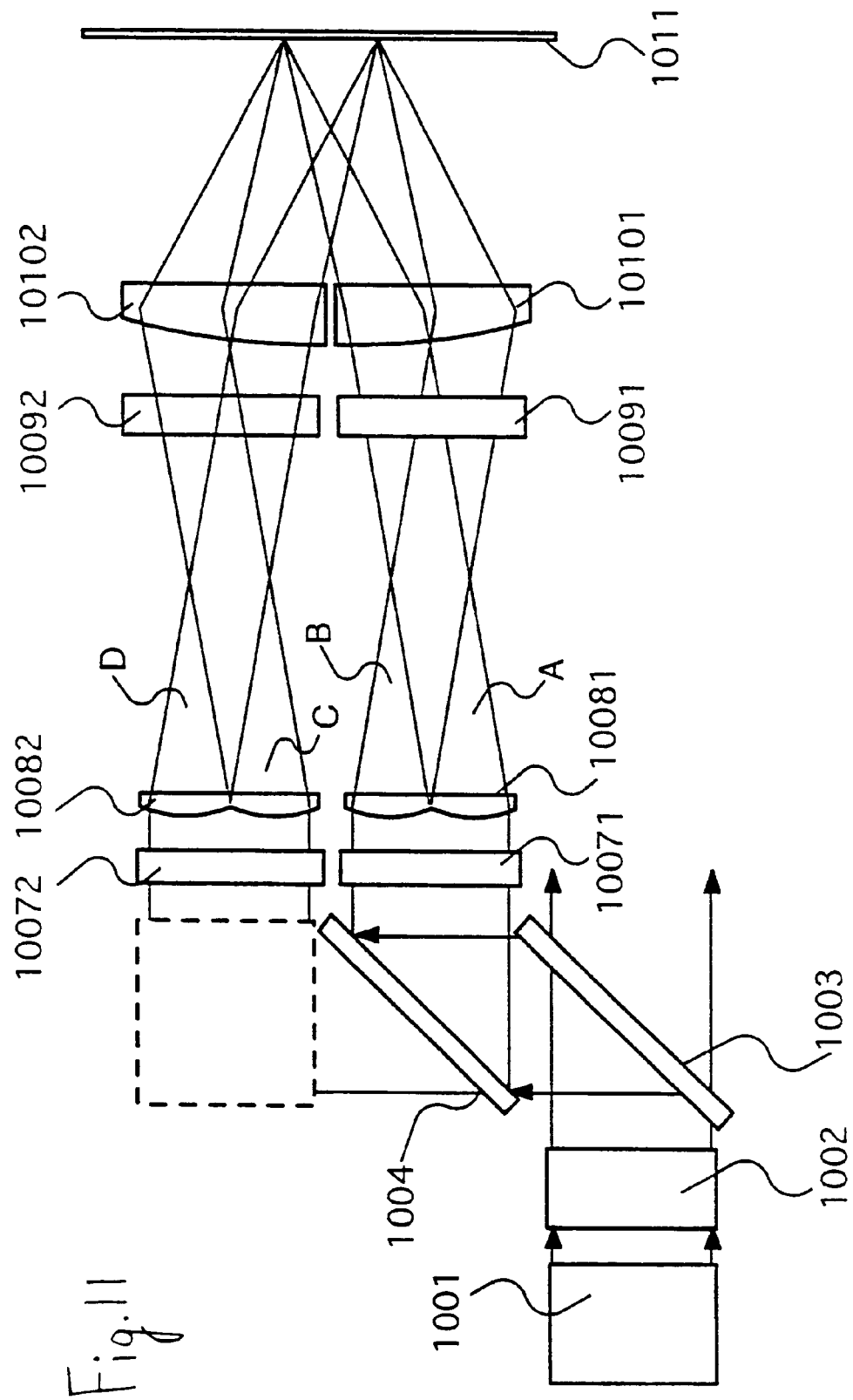
FIG. 11 is a diagram showing an example of a laser irradiation apparatus disclosed in the present invention.
Figure 12A:
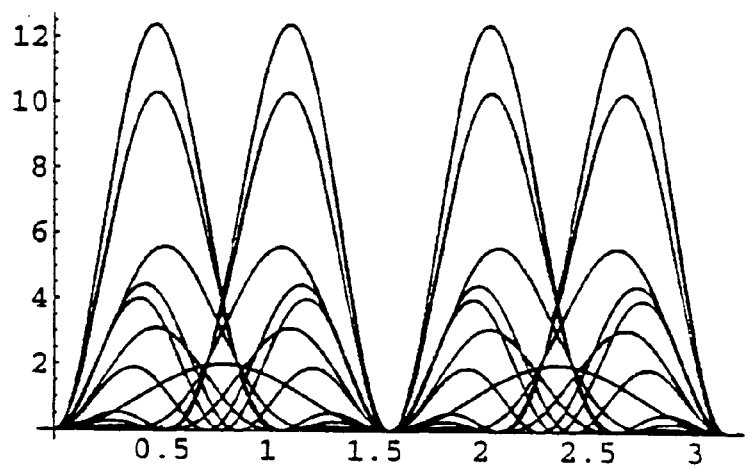
FIGS. 12A and 12B are views illustrating a calculation result of an energy intensity distribution of a light interference.
Figure 12B:
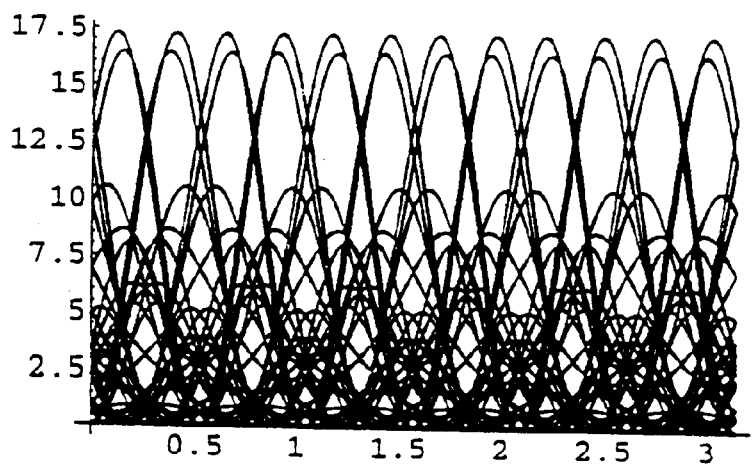
Figure 13:
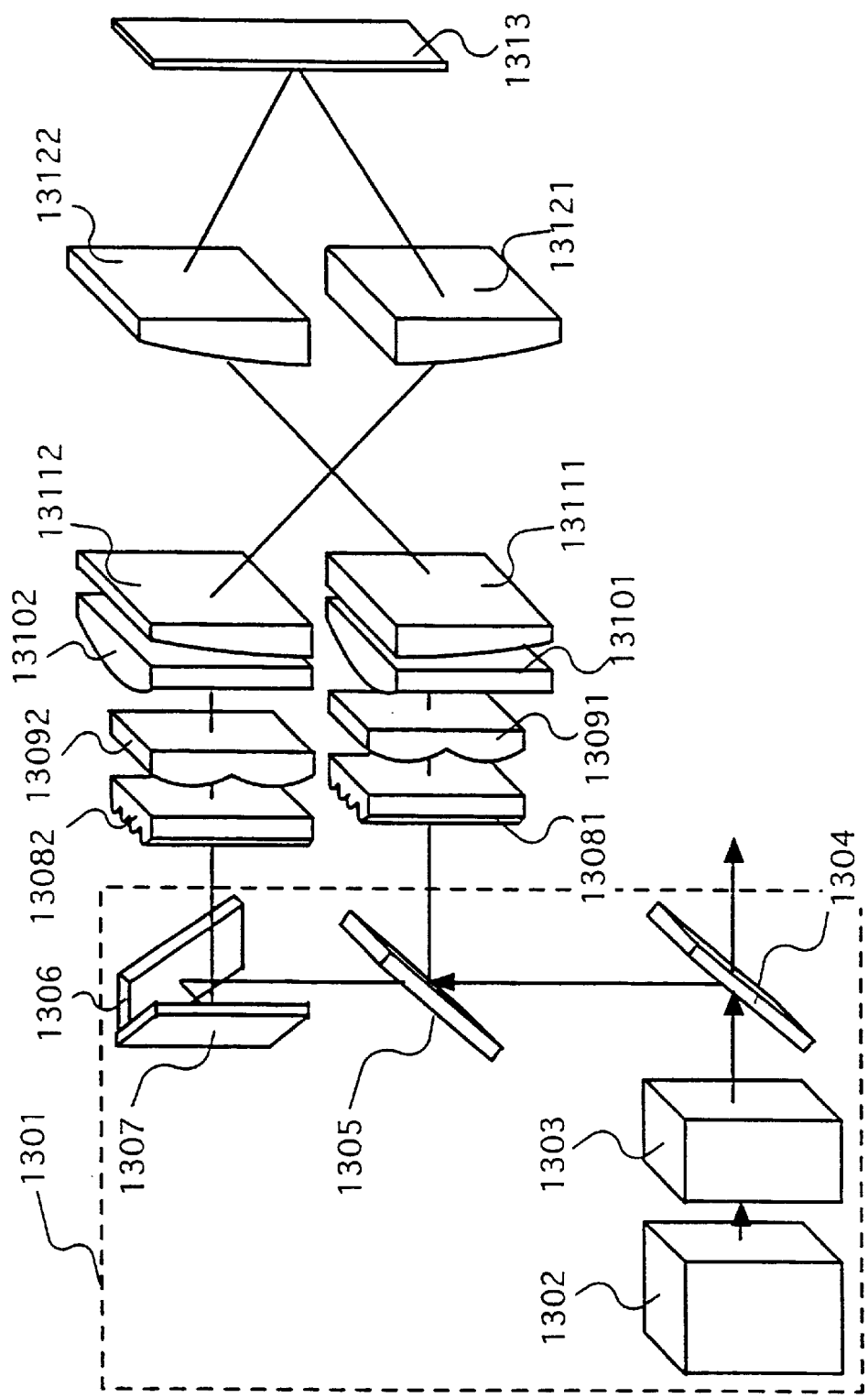
FIG. 13 is a diagram showing an example of a laser irradiation apparatus disclosed in the present invention.

FIG. 13 is a view illustrating a laser irradiation apparatus. The laser irradiation apparatus shown in FIG. 13 is one example of an apparatus that irradiates a linear laser beam to a substrate. The structure thereof is the same as the optical system shown in FIG. 1. A laser beam is processed into a 115 mm long and 0.5 mm wide linear laser beam by the optical system shown in FIG. 13. Because the length of the linear laser beam is 115 mm, it is scanned in one direction to the 5 inch square (about 125 mm) substrate, whereby almost the entire surface of the substrate can be irradiated with the laser beam. The optical system illustrated in FIG. 13 is one example thereof. The linear laser beam is imaged on the a-Si film. The size of the above-mentioned linear laser beam is the size of the beam when imaged on the a-Si film. The structure of the optical system is explained in the following. A pulse oscillation type YAG laser oscillator 1301 oscillates a laser beam having a fundamental wave (wavelength of 1065 nm), a second harmonic (wavelength of 533 nm), and a third harmonic (wavelength of 355 nm). The above-mentioned YAG laser is a zigzag slub system YAG laser. The sizes of the above laser beams at the exit of the respective laser beams are 6×12 mm and rectangular in shape. Further, the largest outputs of the laser beams are 800 mJ/pulse at the second harmonic and 400 mJ/pulse at the third harmonic. A largest repetitive frequency is 30 Hz and a pulse width is 10 ns.

From the fact that the 533 nm laser beam and the 355 nm laser beam having different wavelengths from each other are used, a synthetic quartz that has a high transmittance at the wavelength region thereof is used as the core of the lenses. Because laser beams having different wavelengths from each other are passed through the optical system, the radius of curvature of the lenses that the second harmonic penetrates and the radius of the curvature of the lenses that the third harmonic penetrates must be changed even if, for example, the focal lengths thereof are equivalent. Further, a coating that is appropriate for each of the wavelengths may be applied to the lenses in order to prevent the surfaces of the lenses from reflecting and to enhance the transmittance. In addition, the life of the lenses can be extended by applying a coating. Depending on the layout of the laser irradiation apparatus, it is necessary to arrange mirrors in appropriate positions. Progress is being made in a technique for making mirrors to have a high reflectance to a very wide range of wavelengths. There are mirrors in which nearly 99% or more reflectance can be obtained from both the 355 nm wavelength and the 533 nm wavelength. Of course, different coatings may be used in accordance with different wavelengths because a higher reflectance can be obtained.

The fundamental wave generated from a resonator 1302 of the YAG laser is converted into the second harmonic and the third harmonic by a non-linear optical element 1303.

Because components of the fundamental wave still remain in the laser beam, the components thereof are separated from that of the second harmonic and the third harmonic by a beam splitter 1304 that is arranged at a 45 degree angle to the advancing direction of the laser beam. The laser beam that is transmitted from the beam splitter 1304 is the fundamental wave and the laser beam that is reflected is the second harmonic and the third harmonic.

The second harmonic and the third harmonic are separated by a beam splitter 1305 that is arranged at a 45 degree angle to the advancing direction of the second harmonic and the third harmonic. The laser beam that is reflected by the beam splitter 1305 is the second harmonic and the laser beam that transmitted thereby is the third harmonic. Next, the light path of the third harmonic is bend 90 degrees upward by a mirror 1306 and then further bend 90 degrees in a horizontal direction by a mirror 1307. Thus, the advancing direction of the third harmonic is converted into a direction that is the same as the advancing direction of the second harmonic. At this point, the fundamental wave, the second harmonic, and the third harmonic are simultaneously outputted at the exit of the laser beam, respectively. A positional relationship of the laser beams of the second harmonic and the third harmonic is set so that the diagonal line of the rectangular laser beam is on top of the same linear line.

The second harmonic separated by the beam splitter 1305 is once split into 2 beams by a cylindrical lens array 13082. Thereafter, the split beam is converged into 1 beam at an irradiated surface 1313 by a cylindrical lens 13102 and a cylindrical lens 13121. The cylindrical lens 13102 and the cylindrical lens 13121 have the shape of a cylindrical lens after it has been separated into 2 congruent solid cylindrical lenses at a plane containing a straight line that is called the main line (mother line) of a normal cylindrical lens. Such lenses are called half cylindrical lenses throughout the present specification.

The second harmonic that has been split into 4 beams by a cylindrical lens array 13092 is converged into 1 beam at the irradiated surface 1313 by a cylindrical lens 13111.

A coating is applied on the cylindrical lens array 13082, the cylindrical lens array 13092, the cylindrical lens 13102, the cylindrical lens 13111, and the cylindrical lens 13121, respectively, in order to make the transmittance of the 533 nm wavelength second harmonic to 99% or more.

On the other hand, the third harmonic reflected by the mirror 1307 is once split into 2 beams by a cylindrical lens array 13081. Thereafter, the split beam is converged into 1 beam at the irradiated surface 1313 by a cylindrical lens 13101 and a cylindrical lens 13122. The cylindrical lens 13101 and the cylindrical lens 13122 are half cylindrical lenses.

The third harmonic that has been further split into 4 beams by a cylindrical lens array 13091 is converged into 1 beam at the irradiated surface 1313 by a cylindrical lens 13112.

A coating is applied on the cylindrical lens array 13081, the cylindrical lens array 13091, the cylindrical lens 13101, the cylindrical lens 13112, and the cylindrical lens 13122, respectively, in order to make the transmittance of the 355 nm wavelength third harmonic to 99% or more.

Examples of specific sizes and focal lengths of the optical system illustrated in FIG. 13 are shown here in the following. The lenses shown herein below are all cylindrical lenses and have a radius of curvature in the width direction.

First, the structure of the optical system which processes the second harmonic is described. The cylindrical lens array 13082 is made up of 2 cylindrical lenses that are 3 mm wide, 25 mm long, 3 mm thick with a focal length of 300 mm and combined with each other in the width direction in the form of an array.

The above-mentioned cylindrical lens is a planoconvex lens having a spherical convex surface. Throughout the present specification, the incident surfaces of the lenses are spherical and the other surfaces are planar unless particularly stated. To make the lenses into an array form, a method that may be used is by adhering them together by applying heat or fitting the lenses into a frame and then fixing them from the outside. In addition, the cylindrical lens arrays may be formed into one unit of cylindrical lens array at the grinding stage.

The cylindrical lens array 13092 is made up of 4 cylindrical lenses that are 3 mm wide, 30 mm long, 3 mm thick with a focal length of 25 mm, and combined with each other in the width direction in the form of an array.

The cylindrical lens 13102 is a half cylindrical lens that is 30 mm wide, 80 mm long, 8 mm thick, and has a focal length of 300 mm.

The cylindrical lens 13111 is a cylindrical lens that is 150 mm wide, 40 mm long, 15 mm thick, and has a focal length of 1000 mm.

The cylindrical lens 13121 is a half cylindrical lens that is 40 mm wide, 150 mm long, and 15 mm thick with a focal length of 175 mm. In order to enhance the uniformity of the linear laser beam at the irradiated surface 1313, it is better that the cylindrical lens 13121 is a non-spherical lens. If non-spherical lenses are hard to process, then it is better to use a set lens such as, for example, a doublet lens or a triplet lens to thereby suppress the spherical aberrations.

Next, the structure of the optical system which processes the third harmonic is described. The cylindrical lens array 13081 is made up of 2 cylindrical lenses that are 3 mm wide, 25 mm long, 3 mm thick with a focal length of 300 mm and combined with each other in the width direction in the form of an array.

The cylindrical lens array 13091 is made up of 4 cylindrical lenses that are 3 mm wide, 30 mm long, 3 mm thick with a focal length of 25 mm, and combined with each other in the width direction in the form of an array.

The cylindrical lens 13101 is a half cylindrical lens that is 30 mm wide, 80 mm long, 8 mm thick, and has a focal length of 300 mm.

The cylindrical lens 13112 is a cylindrical lens that is 150 mm wide, 40 mm long, 15 mm thick, and has a focal length of 1000 mm.

The cylindrical lens 13122 is a half cylindrical lens that is 40 mm wide, 150 mm long, and 15 mm thick with a focal length of 175 mm. In order to enhance the uniformity of the linear laser beam at the irradiated surface 1313, it is better that the cylindrical lens 13122 is a non-spherical lens. If non-spherical lenses are hard to process, then it is better to use a set lens such as, for example, a doublet lens or a triplet lens to thereby suppress the spherical aberrations.

Note that for the purpose of protecting the optical system, the atmosphere around the optical system may contain a gas, such as nitrogen, that does not easily react to the lens coating substance. Therefore, the optical system may be enclosed in an optical system protection chamber. Using quartz, which has been applied with a coating in accordance to the respective wavelengths, for a window where a laser enters and exits the optical system protection chamber is good because a high transmittance of 99% or more can thus be obtained.

The substrate having the a-Si film formed thereon is placed on the irradiated surface 1313 where a stage (not shown), is moved at a constant speed by using a moving mechanism (not shown), in the longitudinal direction and the right angle direction of the linear laser beam (the direction indicated by an arrow) while irradiating the laser beam. Thus, the laser beam can be irradiated on the entire surface of the substrate. A ball screw type, a linear motor, or the like can be used as the moving mechanism.

The irradiation conditions may be determined within the range of the following standards.

Energy density of a linear laser beam: 50 to 500 mJ/cm$^2$
Moving speed of the stage: 0.1 to 2 mm/s
Oscillation frequency of a laser oscillator: 30 Hz The above stated irradiation conditions change in accordance with the pulse width of the laser oscillator, the state of the semiconductor film, and the specification of the device to be manufactured. An implementor will have to determine the details of the conditions appropriately. Furthermore, the value of the frequency of the laser oscillator is set to a value which is considered to be the highest value among the large output YAG lasers sold in the current market. If lasers with a higher frequency are developed in the future, it is suitable to adopt the higher frequency as much as possible in order to improve throughput. However, if attempts are made to obtain a higher frequency at the present level, the quality of the laser beam becomes very poor. That is, $M^2$ becomes poor, and therefore it is better to use a frequency of about 30 Hz.

The atmosphere during the irradiation of the laser beam is set to the atmosphere of a clean room. For example, the atmosphere of the clean room is air at a temperature of 23° C. As other replacements of the atmosphere, a chamber may be provided and air may be replaced by $H_2$. Replacements of the atmosphere are performed to prevent contamination of the substrate and to prevent the surface of the semiconductor film from becoming rough. Gas is supplied through a gas cylinder. The above-mentioned atmosphere may be $H_2$, He, $N_2$, or Ar or a gaseous mixture thereof. In addition, making the atmosphere into a vacuum ($10^{-1}$ torr or less) also has the contamination prevention effect and the effect of preventing the surface from becoming rough.

Besides using the Corning 1737 as the substrate, the Corning 7059 and a glass substrate such as the AN100 can be used, or a quartz substrate may be used.

During the irradiation of the laser beam, when a spot of the substrate irradiated with the linear laser beam is heated by applying a strong light using an infrared lamp or the like, the energy of the laser beam can be reduced compared with the case of not heating the spot of the substrate. Heat may also be applied by placing a heater at a bottom portion of the substrate. When the linear laser beam is made longer so that it may be used for a larger area substrate, the aid of energy due to the application of heat is useful when the energy of the laser beam is insufficient.

The laser irradiation apparatus of the present invention is applicable not only to the non-single crystal silicon film, but also to other non-single crystal semiconductor films such as, for example, a non-single crystal semiconductor film of a diamond or germanium.

Employing the semiconductor film crystallized by the above-mentioned laser irradiation apparatus, a semiconductor device such as a liquid crystal display of a low temperature poly-silicon TFT may be manufactured by a known method, or a semiconductor device contrived by an implementor may be manufactured.

Embodiment 1

In the present embodiment, an example will be described in which a polycrystalline silicon film is irradiated with a laser beam. The laser irradiation device described in the above embodiment mode is used.

A Corning glass 1737 having a thickness of 0.7 mm is used as a substrate. The substrate has sufficient durability if it is used under 600° C. An $SiO_2$ film is formed in 200 nm on one surface of the substrate by a plasma CVD method. Further, an a-Si film is formed in 55 nm on the $SiO_2$ film. Any other film forming method, for example, a sputtering method may be used.

Next, the above-mentioned a-Si film is crystallized by the method disclosed in Japanese Patent Laid-Open No. 7-130652. The method will be described briefly in the following. The above a-Si film is coated with a nickel acetate water solution having a concentration of 10 ppm and then is heated in a nitrogen atmosphere at 550° C. for 4 hours, whereby the a-Si film is crystallized. It is recommended that a spin coat method, for example, be used for applying the nickel acetate water solution. The a-Si film to which nickel is added is crystallized in a short period at low temperatures. It is thought that this is because the nickel acts as the seed crystal of crystal growth to facilitate the crystal growth.

If the polycrystalline silicon film crystallized by the above method is irradiated with the laser beam, it has higher characteristics as a material of a semiconductor element. Accordingly, to improve the characteristics of the above polycrystalline silicon film, the above polycrystalline silicon film is irradiated with the laser beam by using the laser irradiation device used in the embodiment mode of the present invention.

It is recommended that a semiconductor device, for example, a liquid crystal display made of low-temperature polysilicon TFTs, is manufactured by using a semiconductor film crystallized with the above laser irradiation device by a publicly known method. Or a semiconductor device invented by a practicing person can be manufactured. The embodiment mode of the present invention and the embodiment 1 can be used in combination.

Embodiment 2

Shown in Embodiment 2 is an example of linearly synthesizing the second harmonic and the fourth harmonic of the YAG laser at the irradiated surface as the light source of the laser beam.

The advantages of using the second harmonic are that a large output can be obtained, and further, the optical lenses do not deteriorate easily. By mixing the fourth harmonic with the second harmonic, the influence of interference in the irradiated surface can thus be remarkably reduced.

A method of Embodiment 2 is that a non-linear optical element which forms the second harmonic and the fourth harmonic at the same time is used instead of the non-linear optical element used in the Embodiment Mode of the present invention. Furthermore, a similar optical system for processing the fourth harmonic is used in place of the portion of the optical system, which processes the third harmonic. The fourth harmonic may be entered into the optical system.

Embodiment 2 can be combined with Embodiment 1.

Embodiment 3

Shown in Embodiment 3 is an example of linearly synthesizing the third harmonic and the fourth harmonic of the YAG laser at the irradiated surface as the light source of the laser beam.

The advantage of using the third harmonic and the fourth harmonic is that both laser beams have an extremely high absorption coefficient with respect to silicon films. By mixing the fourth harmonic with the third harmonic, the influence of interference in the irradiated surface can thus be remarkably reduced.

A method of Embodiment 3 is that a non-linear optical element which forms the third harmonic and the fourth harmonic at the same time is used instead of the non-linear optical element used in the Embodiment Mode of the present invention. Furthermore, a similar optical system for processing the fourth harmonic is used in place of the portion of the optical system, which processes the second harmonic. The fourth harmonic may be entered into the optical system.

Embodiment 3 can be combined with Embodiment 1.

Embodiment 4

In the present embodiment, an example of a laser irradiation device for mass production will be described with reference to FIG. 14. FIG. 14 is a top view of a laser irradiation device.

A substrate is carried from a load/unload chamber 1401 by the use of a carrying robot arm 1403 mounted in a transfer chamber 1402. First, the substrate is aligned in an alignment chamber 1404 and then is carried to a pre-heat chamber 1405. In the pre-heat chamber 1405, the substrate is previously heated to a desired temperature of about 300° C., for example, by the use of an infrared lamp heater. Then, the substrate is placed in a laser irradiation chamber 1407 via a gate valve 1406 and then the gate valve 1406 is closed.

A laser beam is emitted by the laser oscillator 1400 described in the embodiment mode and then is bent downward 90 degrees by a mirror (not shown) placed directly above a quartz window 1410 via an optical system 1409 and is transformed into a linear laser beam at an irradiate surface in the laser irradiation chamber 1407 via the quartz window 1410. The laser beam is applied to the substrate placed at the irradiate surface. It is recommended that the above-mentioned optical system be used as the optical system 1409, or the one similar to the optical system may be used. It is preferable to use excimer grade quartz window. The excimer grade quartz window can be used at a state of non-coat, because it has sufficiently transmittance against the second harmonic and the third harmonic.

The laser irradiation chamber 1407 is evacuated by a vacuum pump 1411 to make the atmosphere of the chamber 1407 a high vacuum of about $10^{-3}$ Pa before the irradiation of the laser beam, or the atmosphere of the laser irradiation chamber 1407 is made a desired atmosphere by the vacuum pump 1411 and a gas cylinder 1412. As described above, the above atmosphere may be He, Ar, $H_2$, or the mixed gas of them.

Then, the substrate is scanned and irradiated with the linear laser beam moved by a moving mechanism 1413. At this time, an infrared lamp (not shown) may be applied to the spot of the substrate irradiated with the linear laser beam.

After the end of the irradiation of the laser beam, the substrate is carried to a cooling chamber 1408 to be allowed to cool slowly and then is returned to the load/unload chamber 1401 via the alignment chamber 1404. In this manner, many substrates can be annealed with laser by repeating these actions.

The embodiment 4 can be used in combination with the embodiment mode and the other embodiments of the present invention.

Embodiment 5

The present embodiment is described by using FIGS. 15 to 21. Here, the method of fabricating pixel TFTs for the display region and TFTs of driving circuits provided in the periphery of the display region, over a same substrate, and a display device manufactured by using it will be described in detail in accordance with the fabricating steps. However, in order to simplify the description, CMOS circuits that are the basic circuits of a shift register circuit, a buffer circuit, and the like for the control circuit and n-channel type TFTs that form sampling circuits will be shown in the figures.

In FIG. 15A, a low-alkaline glass substrate or a quartz substrate can be used as a substrate 1501. In this embodiment, a low-alkaline glass substrate was used. On the surface of this substrate 1501 on which TFTs are to be formed, a base film 1502 such as a silicon oxide film, a silicon nitride film or a silicon oxynitride film is formed in order to prevent the diffusion of impurities from the substrate 1501. For example, a silicon oxynitride film which is fabricated from $SiH_4$, $NH_3$, $N_2O$ by plasma CVD into 100 nm and a silicon oxynitride film which is similarly fabricated from $SiH_4$ and $N_2O$ into 200 nm are formed into a laminate.

Next, a semiconductor film 1503a that has an amorphous structure and a thickness of 20 to 150 nm (preferably, 30 to 80 nm) is formed by a known method such as plasma CVD or sputtering. In this embodiment, an amorphous silicon film was formed to a thickness of 55 nm by plasma CVD. As semiconductor films which have an amorphous structure, there are an amorphous semiconductor film and a microcrystalline semiconductor film; and a compound semiconductor film with an amorphous structure such as an amorphous silicon germanium film may also be applied. Further, the base film 1502 and the amorphous silicon film 1503a can be formed by the same deposition method, so that the two films can be formed in succession. By not exposing the base film to the atmospheric air after the formation of the base film, the surface of the base film can be prevented from being contaminated, as a result of which the dispersion in characteristics of the fabricated TFTs and the variation in the threshold voltage thereof can be reduced. (FIG. 15A)

Then, by a known crystallization technique, a crystalline silicon film 1503b is formed from the amorphous silicon film 1503a. In the present embodiment, laser crystallization was performed in accordance with the above stated embodiment mode by using a laser apparatus of the present invention. It is preferred that, prior to the crystallization step, heat treatment is carried out at 400 to 500° C. for about one hour though it depends on the amount of hydrogen contained, so that, after the amount of hydrogen contained is reduced to 5 atom % or less, the crystallization is carried out. (FIG. 15B)

Then, the crystalline silicon film 1503b is divided into islands, to form island semiconductor layers 1504 to 1507. Thereafter, a mask layer 1508 of a silicon oxide film is formed to a thickness of 50 to 100 nm by plasma CVD or sputtering. (FIG. 15C)

Then, a resist mask 1509 is provided, and, into the whole surfaces of the island semiconductor layers 1505 to 1507 forming the n-channel type TFTs, boron (B) was added as an impurity element imparting p-type conductivity, at a concentration of about $1\times10^{16}$ to $5\times10^{17}$ atoms/cm$^3$, for the purpose of controlling the threshold voltage. The addition of boron (B) may be performed either by the ion doping or it may be added simultaneously when the amorphous silicon film is formed. The addition of boron (B) here was not always necessary, however, the formation of semiconductor layers 1510 to 1512 into which boron was added was preferable for maintaining the threshold voltage of the n-channel type TFTs within a prescribed range. (FIG. 15D)

In order to form the LDD regions of the n-channel type TFTs in the driving circuit, an impurity element imparting n-type conductivity is selectively added to the island semiconductor layers 1510 and 1511. For this purpose, resist masks 1513 to 1516 were formed in advance. As the impurity element imparting the n-type conductivity, phosphorus (P) or arsenic (As) may be used; here, in order to add phosphorus (P), ion doping using phosphine ($PH_3$) was applied. The concentration of phosphorus (P) in the impurity regions 1517 and 1518 thus formed may be set within the range of from $2\times10^{16}$ to $5\times10^{19}$ atoms/cm$^3$. In this specification, the concentration of the impurity element contained in the thus formed impurity regions 1517 to 1519 imparting n-type conductivity is represented by (n$^-$). Further, the impurity region 1519 is a semiconductor layer for forming the storage capacitor of the pixel matrix circuit; into this region, phosphorus (P) was also added at the same concentration. (FIG. 16A)

Next, the mask layer 1508 is removed by hydrofluoric acid or the like, and the step of activating the impurity elements added at the steps shown in FIG. 15D and FIG. 16A is carried out. The activation can be carried out by performing heat treatment in a nitrogen atmosphere at 500 to 600° C. for 1 to 4 hours or by using the laser activation method. Further, both methods may be jointly performed. Or, the laser irradiation described in the embodiment mode may be performed. In this embodiment, the laser activation method was employed, and a KrF excimer laser beam (with a wavelength of 248 nm) was used; the beam is formed into a linear beam; and scan was carried out under the condition that the oscillation frequency was 5 to 50 Hz, the energy density was 100 to 500 mJ/cm$^2$, and the overlap ratio of the linear beam was 80 to 98%, whereby the whole substrate surface on which the island semiconductor layers were formed was processed. Any item of the laser irradiation condition is subjected to no limitation, so that the operator may suitably select the condition.

Then, a gate insulating film 1520 is formed of an insulating film comprising silicon to a thickness of 10 to 150 nm, by plasma CVD or sputtering. For example, a silicon oxynitride film is formed to a thickness of 120 nm. As the gate insulating film, other insulating films comprising silicon may be used as a single layer or a laminate structure. (FIG. 16B)

Next, in order to form a gate electrode, a first conductive layer is deposited. This first conductive layer may be formed of a single layer but may also be formed of a laminate consisting of two or three layers. In this embodiment, a conductive layer (A) 1521 comprising a conductive metal nitride film and a conductive layer (B) 1522 comprising a metal film are laminated. The conductive layer (B) 1522 may be formed of an element selected from among tantalum (Ta), titanium (Ti), molybdenum (Mo) and tungsten (W) or an alloy comprised mainly of the above-mentioned element, or an alloy film (typically, an Mo—W alloy film or an Mo—Ta alloy film) comprised of a combination of the above-mentioned elements, while the conductive layer (A) 1521 is formed of a tantalum nitride (TaN) film, a tungsten nitride (WN) film, a titanium nitride (TiN) film, or a molybdenum nitride (MoN) film. Further, as the substitute materials of the conductive film (A) 1521, tungsten silicide, titanium silicide, and molybdenum silicide may also be applied. The conductive layer (B) may preferably have its impurity concentration reduced in order to decrease the resistance thereof; in particular, as for the oxygen concentration, the concentration may be set to 30 ppm or less. For example, tungsten (W) could result in realizing a resistivity of 20 $\mu\Omega$cm or less by rendering the oxygen concentration thereof to 30 ppm or less.

The conductive layer (A) 1521 may be set to 10 to 50 nm (preferably, 20 to 30 nm), and the conductive layer (B) 1522 may be set to 200 to 400 nm (preferably, 250 to 350 nm). In this embodiment, as the conductive layer (A) 1521, a tantalum nitride film with a thickness of 30 nm was used, while, as the conductive layer (B) 1522, a Ta film with a thickness of 350 nm was used, both films being formed by sputtering. In case of performing sputtering here, if a suitable amount of Xe or Kr is added into the sputtering gas Ar, the internal stress of the film formed is alleviated, whereby the film can be prevented from peeling off. Though not shown, it is effective to form a silicon film, into which phosphorus (P) is doped, to a thickness of about 2 to 20 nm underneath the conductive layer (A) 1521. By doing so, the adhesiveness of the conductive film formed thereon can be enhanced, and at the same time, oxidation can be prevented. In addition, the alkali metal element slightly contained in the conductive layer (A) or the conductive layer (B) can be prevented from diffusing into the gate insulating film 1520. (FIG. 16C)

Next, resist masks 1523 to 1527 are formed, and the conductive layer (A) 1521 and the conductive layer (B) 1522 are etched together to form gate electrodes 1528 to 1531 and a capacitor wiring 1532. The gate electrodes 1528 to 1531 and the capacitor wiring 1532 are formed in such a manner that the layers 1528a to 1532a comprised of the conductive layer (A) and the layers 1528b to 1532b comprised of the conductive layer (B) are respectively formed integrally. In this case, the gate electrodes 1529 and 1530 formed in the driving circuit are formed so as to overlap the portions of the impurity regions 1517 and 1518 through the gate insulating film 1520. (FIG. 16D)

Then, in order to form the source region and the drain region of the p-channel TFT in the driving circuit, the step of adding an impurity element imparting p-type conductivity is carried out. Here, by using the gate electrode 1528 as a mask, impurity regions are formed in a self-alignment manner. In this case, the region in which the n-channel TFT will be formed is coated with a resist mask 1533 in advance. Thus, impurity regions 1534 were formed by ion doping using diborane ($B_2H_6$). The concentration of boron (B) in this region is set at $3\times10^{20}$ to $3\times10^{21}$ atoms/cm$^3$. In this specification, the concentration of the impurity element imparting p-type contained in the impurity regions 1534 is represented by (p$^+$). (FIG. 17A)

Next, in the n-channel TFTs, impurity regions that function as source regions or drain regions were formed. Resist masks 1535 to 1537 were formed, and impurity regions 1538 to 1542 were formed by adding an impurity element for imparting the n-type conductivity. This was carried out by ion doping using phosphine ($PH_3$), and the phosphorus (P) concentration in these regions was set to $1\times10^{20}$ to $1\times10^{21}$ atoms/cm$^3$. In this specification, the concentration of the impurity element imparting the n-type contained in the impurity regions 1538 to 1542 formed here is represented by (n$^+$). (FIG. 17B)

In the impurity regions 1538 to 1542, the phosphorus (P) or boron (B) which was added at the preceding steps are contained, however, as compared with this impurity element concentration, phosphorus is added here at a sufficiently high concentration, so that the influence by the phosphorus (P) or boron (B) added at the preceding steps need not be taken into consideration. Further, the concentration of the phosphorus (P) that is added into the impurity regions 1538 is ½ to ⅓ of the concentration of the boron (B) added at the step shown in FIG. 17A; and thus, the p-type conductivity was guaranteed, and no influence was exerted on the characteristics of the TFTs.

Then, the step of adding an impurity imparting n-type is performed to form the LDD regions of the n-channel type TFTs in the pixel matrix circuit. Here, by using the gate electrode 1531 as a mask, the impurity element for imparting n-type was added in a self-alignment manner. The concentration of phosphorus (P) added was $1 \times 10^{16}$ to $5 \times 10^{18}$ atoms/cm$^3$; by thus adding phosphorus at a concentration lower than the concentrations of the impurity elements added at the steps shown in FIG. 16A, FIG. 17A and FIG. 17B, only impurity regions 1543 and 1544 were substantially formed. In this specification, the concentration of the impurity element for imparting the n-type conductivity contained in these impurity regions 1543 and 1544 is represented by (n$^{--}$). (FIG. 17C)

Thereafter, in order to activate the impurity elements, which were added at their respective concentrations for imparting n-type or p-type conductivity, a heat treatment step was carried out. This step can be carried out by furnace annealing, laser annealing or rapid thermal annealing (RTA). Here, the activation step was performed by furnace annealing. Heat treatment is carried out in a nitrogen atmosphere with an oxygen concentration of 1 ppm or less, preferably 0.1 ppm or less, at 400 to 800° C., typically at 500 to 600° C.; in this embodiment, the heat treatment was carried out at 550° C. for 4 hours. Further, in the case a substrate such as a quartz substrate which has heat resistance is used as the substrate 1501, the heat treatment may be carried out at 800° C. for one hour; in this case, the activation of the impurity elements and the junctions between the impurity regions into which the impurity element was added and the channel forming region could be well formed.

By this heat treatment, on the metal films 1528b to 1532b, which form the gate electrodes 1528 to 1531 and the capacitor wiring 1532, conductive layers (C) 1528c to 1532c are formed with a thickness of 5 to 80 nm as measured from the surface. For example, in the case the conductive layers (B) 1528b to 1532b are made of tungsten (W), tungsten nitride (WN) is formed; in the case of tantalum (Ta), tantalum nitride (TaN) can be formed. Further, the conductive layers (C) 1528c to 1532c can be similarly formed by exposing the gate electrodes 1528 to 1531 to a plasma atmosphere containing nitrogen using nitrogen, ammonia or the like. Further, heat treatment was carried out in an atmosphere containing 3 to 100% of hydrogen at 300 to 450° C. for 1 to 12 hours, thus performing the step of hydrogenating the island semiconductor layers. This step is a step for terminating the dangling bonds of the semiconductor layers by the thermally excited hydrogen. As another means for the hydrogenation, plasma hydrogenation (using the hydrogen excited by plasma) may be performed. (FIG. 17D)

After the activation and hydrogenation steps are over, a second conductive film is formed as gate wiring. This second conductive film is preferably formed of a conductive layer (D) comprised mainly of aluminum (Al) or copper (Cu) that is a low resistance material, and a conductive layer (E) comprised of titanium (Ti), tantalum (Ta), tungsten (W), or molybdenum (Mo). In this embodiment, the second conductive film was formed by using, as the conductive layer (D) 1545, an aluminum (Al) film containing 0.1 to 2 wt % of titanium (Ti), and by using a titanium (Ti) film as the conductive layer (E) 1546. The conductive layer (D) 1545 may be formed to a thickness of 200 to 400 nm (preferably, 250 to 350 nm), while the conductive layer (E) 1546 may be formed to a thickness of 50 to 200 nm (preferably, 100 to 150 nm). (FIG. 18A)

Then, in order to form gate wirings connected to the gate electrodes, the conductive layer (E) 1546 and the conductive layer (D) 1545 were etched, whereby gate wirings 1547, 1548 and a capacitor wiring 1549 were formed. The etching treatment was carried out in such a manner that, at first, by a dry etching method using a mixture gas of SiCl$_4$, Cl$_2$ and BCl$_3$, the portions extending from the surface of the conductive layer (E) to a part of the way of the conductive layer (D) were removed, and, thereafter, the conductive layer (D) was removed by wet etching using a phosphoric acid etching solution, whereby the gate wirings could be formed, maintaining a selective workability with respect to the base film.(FIG. 18B)

A first interlayer insulating film 1550 is formed of a silicon oxide film or a silicon oxynitride film with a thickness of 500 to 1500 nm, and contact holes reaching the source regions or the drain regions, which are formed in the respective island semiconductor layers, are formed; and source wirings 1551 to 1554 and drain wirings 1555 to 1558 are formed. Though not shown, in this embodiment, these electrodes were formed from a laminate film of three-layer structure which was formed by successively forming by sputtering: a Ti film to 100 nm; an aluminum film containing Ti to 300 nm; and a Ti film to 150 nm.

Next, as a passivation film 1559, a silicon nitride film, a silicon oxide film or a silicon oxynitride film is formed to a thickness of 50 to 500 nm (typically 100 to 300 nm). In the case that a hydrogenating treatment was carried out in this state, a preferable result was obtained in respect of the enhancement in characteristics of the TFTS. For example, it is preferable to carry out heat treatment in an atmosphere containing 3 to 100% of hydrogen at 300 to 450° C. for 1 to 12 hours; or, in the case that the plasma hydrogenation method was employed, a similar effect was obtained. Here, openings may be formed in the passivation film 1559 at the positions at which contact holes for connecting the pixel electrodes and drain wirings to each other will be formed later. (FIG. 18C)

Thereafter, a second interlayer insulating film 1560 comprised of an organic resin is formed to a thickness of 1.0 to 1.5 μm. As the organic resin, polyimide, acrylic, polyamide, polyimideamide, or BCB (benzocyclobutene) can be used. Here, the second interlayer film was formed by using a polyimide of the type which thermally polymerizes after applied to the substrate, and it was fired at 300° C. Then, a contact hole reaching the drain wiring 1558 was formed in the second interlayer insulating film 1560, and pixel electrodes 1561 and 1562 were formed. The pixel electrodes may use a transparent conductive film in the case a transmission type liquid crystal display device is to be obtained, while, in the case a reflection type liquid crystal display device is to be fabricated, it may use a metal film. In this embodiment, a transmission type liquid crystal display device is to be fabricated, so that an indium tin oxide (ITO) film was formed to a thickness of 100 nm by sputtering. (FIG. 19)

In this way, a substrate having the TFTs of the driving circuit and the pixel TFTs of the display region on the same substrate could be completed. In the driving circuit, there were formed a p-channel TFT 1601, a first n-channel TFT 1602 and a second n-channel TFT 1603, while, in the display region, there were formed a pixel TFT 1604 and a storage capacitor 1605. In this specification, such a substrate is called active matrix substrate for convenience.

Figure 20:
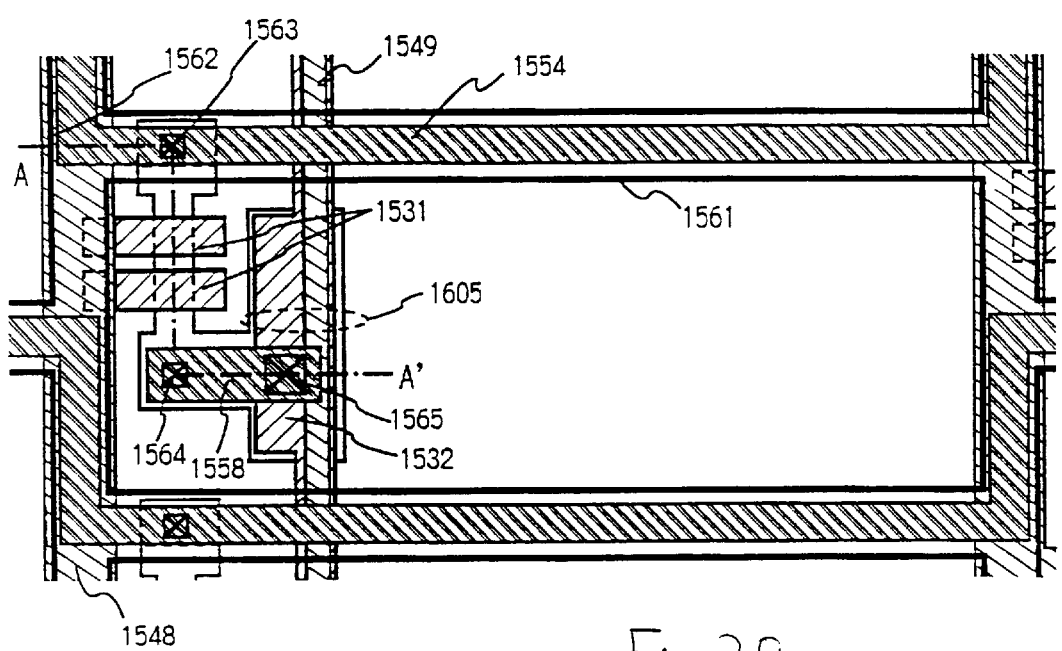
FIG. 20 is a diagram showing a top view of a pixel.

Note that FIG. 20 is a top view showing almost one pixel in the display region. The cross section along with A–A' shown in FIG. 20 corresponds to the cross sectional diagram of the display region shown in FIG. 19. Further, common reference numerals are used in FIG. 20 to correspond with the cross sectional diagrams of FIGS. 15 to 19. The gate wiring 1548 intersects, by interposing a gate insulating film that is not shown in the figure, with a semiconductor layer 1507 underneath. Though not shown, a source region, a drain region, and a Loff region which is formed from n$^{--}$ region are formed in the semiconductor layer. Reference numeral 1563 denotes a contact section of the source wiring 1554 and the source region 1624; 1564, a contact section of the drain wiring 1558 and the drain region 1626; 1565, a contact section of the drain wiring 1558 and the pixel electrode 1561. Storage capacitor 1605 is formed in the region where a semiconductor layer 1627 extended from the drain region 1626 of the pixel TFT 1604 overlap capacitor wirings 1532 and 1549 by interposing a gate insulating film.

The p-channel TFT 1601 in the driving circuit has a channel forming region 1606, source regions 1607a and 1607b and drain regions 1608a and 1608b in the island semiconductor layer 1504. The first n-channel TFT 1602 has a channel forming region 1609, a LDD region 1610 overlapping the gate electrode 1529 (such a LDD region will hereinafter be referred to as Lov), a source region 1611 and a drain region 1612 in the island semiconductor layer 1505. The length in the channel direction of this Lov region is set to 0.5 to 3.0 µm, preferably 1.0 to 1.5 µm. A second n-channel TFT 1603 has a channel forming region 1613, LDD regions 1614 and 1615, a source region 1616 and a drain region 1617 in the island semiconductor layer 1506. In these LDD regions, there are formed an Lov region and a LDD region which does not overlap the gate electrode 1530(such an LDD region will hereafter be referred as Loff); and the length in the channel direction of this Loff region is 0.3 to 2.0 µm, preferably 0.5 to 1.5 µm. The pixel TFT 1604 has channel forming regions 1618 and 1619, Loff regions 1620 to 1623, and source or drain regions 1624 to 1626 in the island semiconductor layer 1507. The length in the channel direction of the Loff regions is 0.5 to 3.0 µm, preferably 1.5 to 2.5 µm. Further, the storage capacitor 1605 comprises capacitor wirings 1532 and 1549, an insulating film composed of the same material as the gate insulating film, and a semiconductor layer 1627 which is connected to the drain region 1626 of the pixel TFT 1604 and in which an impurity element for imparting the n-type conductivity is added. It is not necessary to limit the present invention to the structure of the storage capacitor shown in the present embodiment. For example, storage capacitors of the structures disclosed in Japanese Patent Application No. Hei 9-316567, Hei 9-273444 or 10-254097, of the present applicant, can be used.

In FIG. 19, the pixel TFT 1604 is of the double gate structure, but may be of the single gate structure, or may be of a multi-gate structure in which a plurality of gate electrodes are provided.

The processes for manufacturing an active matrix liquid crystal display device from the above stated active matrix substrate is described. As shown in FIG. 21, an alignment film 1701 is formed onto the active matrix substrate of the state of FIG. 19 manufactured through the above stated method. Polyimide resin is used in general for an alignment film of a liquid crystal display element. A shielding film 1703, a transparent conductive film 1704 and an alignment film 1705 are formed on the opposing substrate 1702 on the opposite side. After forming the alignment film, rubbing treatment is performed to make the liquid crystal molecules orient with a constant pre-tilt angle. The active matrix substrate formed with the pixel matrix circuit and the CMOS circuits, and the opposing substrate are stuck together by a sealant (not shown) or column spacers 1707 through a known cell assembly process. Liquid crystal material 1706 is then injected between the substrates and completely sealed by a sealant (not shown). Known liquid crystal materials can be used for the liquid crystal materials. An active matrix liquid crystal display device shown in FIG. 21 is thus complete.

As described above, an active matrix liquid crystal display device in which TFT structures that comprise each circuit are optimized in accordance with the specification required by the pixel TFT and the driver circuit, can be formed.

Note that any constitution of the Embodiments 1 to 12 may be used in manufacturing a semiconductor device shown in the present embodiment, and it is possible to freely combine each embodiments.

Embodiment 6

Referring to FIGS. 22A to 22C, an example of using another method of crystallization, substituting the crystallization step in Embodiment 5, is shown here in Embodiment 6.

First, the state of FIG. 22A is obtained in accordance with Embodiment 5. Note that FIG. 22A corresponds to FIG. 15A.

A catalyst element for promoting crystallization (one or plural kinds of elements selected from a group consisting of nickel, cobalt, germanium, tin, lead, palladium, iron, and copper, typically nickel) is used for performing crystallization. Specifically, laser crystallization is performed under a state in which the catalyst element is maintained in a surface of an amorphous silicon film to transform the amorphous silicon film into a crystalline silicon film. In Embodiment 6, an aqueous solution containing nickel (aqueous nickel acetate solution) is applied to the amorphous silicon film by spin coating to form a catalyst-element-containing layer 1801 on the entire surface of an amorphous semiconductor film 1503a. (FIG. 22B) The spin coating method is employed as a means of doping nickel in Embodiment 6. However, other methods such as evaporation and sputtering may be used for forming a thin film containing a metal element (nickel film in the case of Embodiment 6) on the amorphous semiconductor film.

Employing the method of irradiating a laser stated in the embodiment mode of the present invention, a crystalline silicon film 1802 is formed next. (FIG. 22C)

By performing the rest of the process in accordance with the steps after FIG. 15C indicated in Embodiment 5, the structure shown in FIG. 21 can be attained If an island-like semiconductor layer is manufactured from the amorphous silicon film crystallized by using a metal element as in Embodiment 6, a very small amount of the metal element will remain in the island-like semiconductor film. Of course, it is still possible to complete a TFT under this state, but preferably better to remove at least the nickel element that will remain in a channel-forming region. As a means of removing the catalyst element residue, there is a method of utilizing a gettering action of phosphorus (P). A step in which phosphorus is selectively doped, heated, and gettered may be added. Nonetheless, without the addition of such step, the concentration of phosphorus (P) necessary for gettering is approximately the same level as the concentration in the impurity region (n$^+$) formed in FIG. 17B. Accordingly, by means of the heat treatment in the activation step shown in FIG. 17D, the catalyst element in the channel-forming region of the n-channel type TFT and the p-channel type TFT can be gettered therefrom.

There are other means for removing the catalyst element without being particularly limited. For example, after forming the island-shape semiconductor layer, heat treatment is performed on the crystalline semiconductor film with a catalyst element residue at a temperature between 800° C. and 1150° C. (preferably between 900° C. and 1000° C.) for 10 minutes to 4 hours (preferably between 30 minutes and 1 hour) in an oxygenous atmosphere to which 3 to 10 volume % of hydrogen chloride is contained. Through this step, the nickel in the crystalline semiconductor film becomes a volatile chloride compound (nickel chloride) and is eliminated in the treatment atmosphere during the operation. In other words, it is possible to remove nickel by the gettering action of a halogen element.

A plural number of means may be used in combination to remove the catalyst element. Also, gettering may be performed prior to the formation of the island-like semiconductor layer.

Embodiment 7

Referring to FIGS. 23A to 23D, an example of using another method of crystallization, substituting the crystallization step in Embodiment 5, is shown here in Embodiment 7.

First, the state of FIG. 23A is obtained in accordance with Embodiment 5. Note that FIG. 23A corresponds to FIG. 15A.

First, an aqueous solution containing a catalyst element (nickel, in this Embodiment) (aqueous nickel acetate solution) is applied to an amorphous silicon film by spin coating to form a catalyst-element-containing layer 1902 on the entire surface of an amorphous semiconductor film 1503a. (FIG. 23B) Possible metal elements other than nickel (Ni) that can be used here are elements such as germanium (Ge), iron (Fe), palladium (Pd), tin (Sn), lead (Pb), cobalt (Co), platinum (Pt), copper (Cu), and gold (Au).

The spin coating method is employed as a means of doping nickel in Embodiment 7. However, other methods such as evaporation and sputtering may be used for forming a thin film made of a catalyst element (nickel film in the case of Embodiment 7) on the amorphous semiconductor film. Though the example of forming the catalyst-element-containing layer 1902 on the entire surface of the amorphous semiconductor film 1503a is shown here in Embodiment 7, a mask may be formed to selectively form the catalyst-element-containing layer.

Heat treatment is performed next at a temperature between 500° C. and 650° C. (preferably between 550° C. and 600° C.) for a duration of 6 hours to 16 hours (preferably between 8 and 14 hours). Consequently, crystallization is advanced and a crystalline semiconductor film (crystalline silicon film in Embodiment 7) 1902 is formed. (FIG. 23C) In the case of selectively forming the metal-element-containing layer, with an opening of the mask as the starting point, crystallization advances in the direction substantially parallel (the direction indicated by an arrow) with the substrate. A crystalline silicon film that has uniform (even) crystal growth direction when viewed macroscopically is thus formed.

There are many defects included in the crystalline silicon film crystallized by the above method due to the low crystallization temperature, and there are cases in which it is insufficient for use as a semiconductor element material. Thus, in order to increase the crystallinity of the crystalline silicon film, the film is irradiated with a laser beam using the laser irradiation method indicated in the embodiment mode of the present invention. A crystalline silicon film 1903 having good crystallinity is thus formed. (FIG. 23D)

By performing the rest of the process in accordance with the steps after FIG. 15C indicated in Embodiment 5, the structure shown in FIG. 21 can be attained.

Note that similar to Embodiment 6, it is further preferable to remove the catalyst element that will remain at least from the channel-forming region. Accordingly, it is also desirable that gettering be performed by using the method indicated in Embodiment 5.

Embodiment 8

Figure 24:
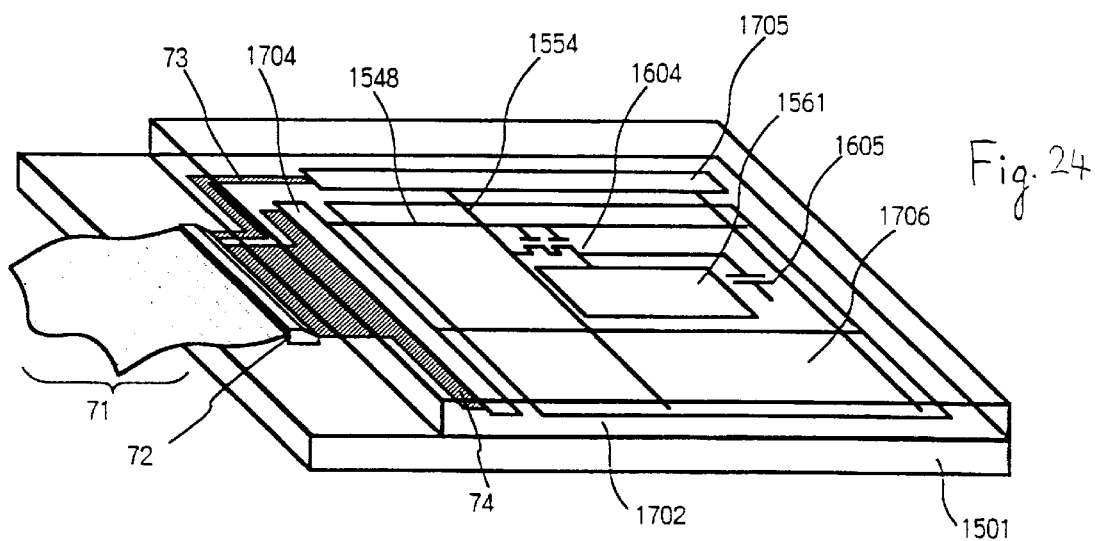
FIG. 24 is a diagram showing the outer appearance of an AM-LCD.

The structure of an active matrix type liquid crystal display device indicated in Embodiment 5 is explained using the perspective view of FIG. 24. Note that in order to give correspondence with the diagrams of FIGS. 15A to 20, common symbols are used for FIG. 24.

In FIG. 24, an active matrix substrate is structured by a display region 1706, a scanning signal drive circuit 1704, and an image signal drive circuit 1705 formed on a glass substrate 1501. A pixel TFT 1604 is provided in the display region, and the drive circuits formed in the periphery thereof are structured with CMOS circuit as a base. The scanning signal drive circuit 1704 and the image signal drive circuit 1705 are connected to the pixel TFT 1604 by a gate wiring 1548 and a source wiring 1554, respectively. Further, an FPC71 is connected to an external input terminal 72, and is connected via input wirings 73 and 74 to the respective drive circuits. Reference symbol 1702 denotes an opposing substrate 1702.

Embodiment 9

An example of manufacturing an EL display (electroluminescence) using the present invention is explained in this embodiment.

Figure 25A:
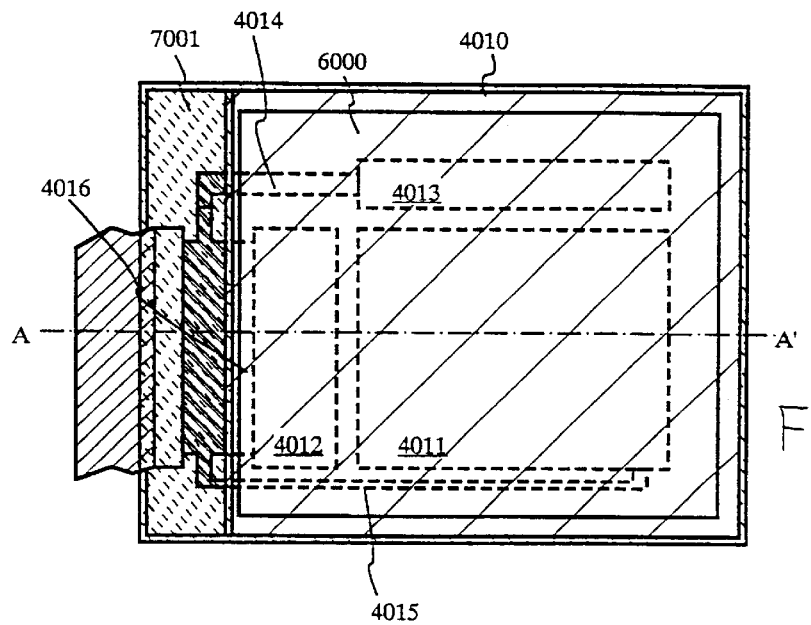
FIGS. 25A and 25B are diagrams showing the structure of an active matrix type EL display device.

FIG. 25A is a top view of an EL display device using the present invention. In FIG. 25A, reference numeral 4010 is a substrate, reference numeral 4011 is a pixel portion, reference numeral 4012 is a source signal side driver circuit, and reference numeral 4013 is a gate signal side driver circuit. Each driver circuits are connected to external equipment, through an FPC 4017, via wirings 4014 to 4016.

A covering material 6000, a sealing material (also referred to as a housing material) 7000, and an airtight sealing material (a second sealing material) 7001 are formed so as to enclose at least the pixel portion, preferably the driver circuits and the pixel portion, at this point.

Figure 25B:
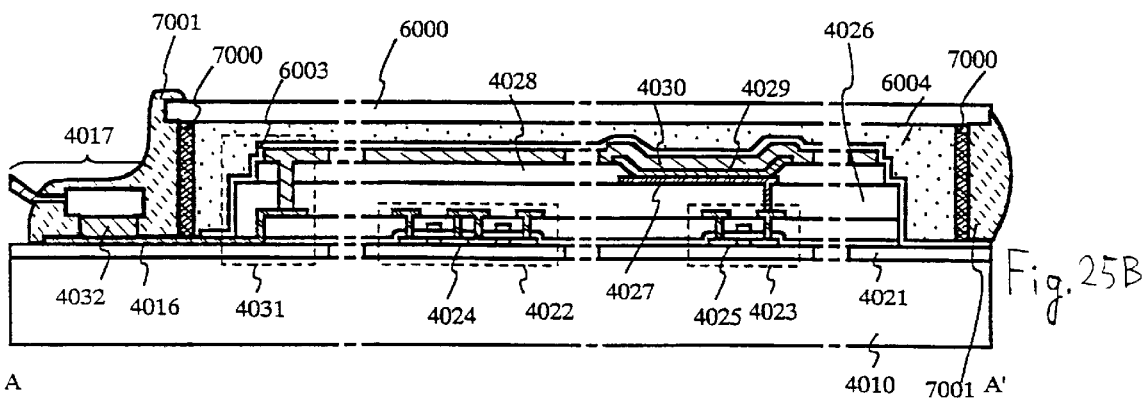

Further, FIG. 25B is a cross sectional structure of the EL display device of the present invention. A driver circuit TFT 4022 (note that a CMOS circuit in which an n-channel TFT and a p-channel TFT are combined is shown in the figure here), a pixel portion TFT 4023 (note that only an EL driver TFT for controlling the current flowing to an EL element is shown here) are formed on a base film 4021 on a substrate 4010. The TFTs may be formed using a known structure (a top gate structure or a bottom gate structure).

This invention can be applied to the driver circuit 4022 and the pixel portion TFT 4023.

After the driver circuit TFT 4022 and the pixel portion TFT 4023 are completed, a pixel electrode 4027 made from a transparent conductive film connected to a drain of pixel portion TFT 4023 is formed on an interlayer insulating film (leveling film) 4026 made from a resin material. An indium oxide and tin oxide compound (referred to as ITO) or an indium oxide and zinc oxide compound can be used as the transparent conducting film. An insulating film 4028 is formed after forming the pixel electrode 4027, and an open portion is formed on the pixel electrode 4027.

An EL layer 4029 is formed next. The EL layer 4029 may be formed having a lamination structure, or a single layer structure, by freely combining known EL materials (such as a hole injecting layer, a hole transporting layer, a light emitting layer, an electron transporting layer, and an electron injecting layer). A known technique may be used to determine which structure to use. Further, EL materials exist as low molecular weight materials and high molecular weight (polymer) materials. Evaporation is used when using a low molecular weight material, but it is possible to use easy methods such as spin coating, printing, and ink jet printing when a high molecular weight material is employed.

In this embodiment, the EL layer is formed by evaporation using a shadow mask. Color display becomes possible by forming emitting layers (a red color emitting layer, a green color emitting layer, and a blue color emitting layer), capable of emitting light having different wavelengths, for each pixel using a shadow mask. In addition, methods such as a method of combining a charge coupled layer (CCM) and color filters, and a method of combining a white color light emitting layer and color filters may also be used. Of course, the EL display device can also be made to emit a single color of light.

After forming the EL layer 4029, a cathode 4030 is formed on the EL layer. It is preferable to remove as much as possible any moisture or oxygen existing in the interface between the cathode 4030 and the EL layer 4029. It is therefore necessary to use a method of depositing the EL layer 4029 and the cathode 4030 in an inert gas atmosphere or within a vacuum. The above film deposition becomes possible in this embodiment by using a multi-chamber method (cluster tool method) film deposition apparatus.

Note that a lamination structure of a LiF (lithium fluoride) film and an Al (aluminum) film is used in this embodiment as the cathode 4030. Specifically, a 1 nm thick LiF (lithium fluoride) film is formed by evaporation on the EL layer 4029, and a 300 nm thick aluminum film is formed on the LiF film. An MgAg electrode, a known cathode material, may of course also be used. The wiring 4016 is then connected to the cathode 4030 in a region denoted by reference numeral 4031. The wiring 4016 is an electric power supply line for imparting a predetermined voltage to the cathode 4030, and is connected to the FPC 4017 through a conducting paste material 4032.

In order to electrically connect the cathode 4030 and the wiring 4016 in the region denoted by reference numeral 4031, it is necessary to form a contact hole in the interlayer insulating film 4026 and the insulating film 4028. The contact holes may be formed at the time of etching the interlayer insulating film 4026 (when forming a contact hole for the pixel electrode) and at the time of etching the insulating film 4028 (when forming the opening portion before forming the EL layer). Further, when etching the insulating film 4028, etching may be performed all the way to the interlayer insulating film 4026 at one time. A good contact hole can be formed in this case, provided that the interlayer insulating film 4026 and the insulating film 4028 are the same resin material.

A passivation film 6003, a filling material 6004, and the covering material 6000 are formed covering the surface of the EL element thus made.

In addition, the sealing material 7000 is formed between the covering material 6000 and the substrate 4010, so as to surround the EL element portion, and the airtight sealing material (the second sealing material) 7001 is formed on the outside of the sealing material 7000.

The filling material 6004 functions as an adhesive for bonding the covering material 6000 at this point. PVC (polyvinyl chloride), epoxy resin, silicone resin, PVB (polyvinyl butyral), and EVA (ethylene vinyl acetate) can be used as the filling material 6004. If a drying agent is formed on the inside of the filling material 6004, then it can continue to maintain a moisture absorbing effect, which is preferable.

Further, spacers may be contained within the filling material 6004. The spacers may be a powdered substance such as BaO, giving the spacers themselves the ability to absorb moisture.

When using spacers, the passivation film 6003 can relieve the spacer pressure. Further, a film such as a resin film can be formed separately from the passivation film 6003 to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the covering material 6000. Note that if PVB or EVA is used as the filling material 6004, it is preferable to use a sheet with a structure in which several tens of $\mu$m of aluminum foil is sandwiched by a PVF film or a Mylar film.

However, depending upon the light emission direction from the EL device (the light radiation direction), it is necessary for the covering material 6000 to have light transmitting characteristics.

Further, the wiring 4016 is electrically connected to the FPC 4017 through a gap between the sealing material 7000, the sealing material 7001 and the substrate 4010. Note that although an explanation of the wiring 4016 has been made here, the wirings 4014 and 4015 are also electrically connected to the FPC 4017 by similarly passing underneath the sealing material 7001 and sealing material 7000.

Embodiment 10

Figure 26A:
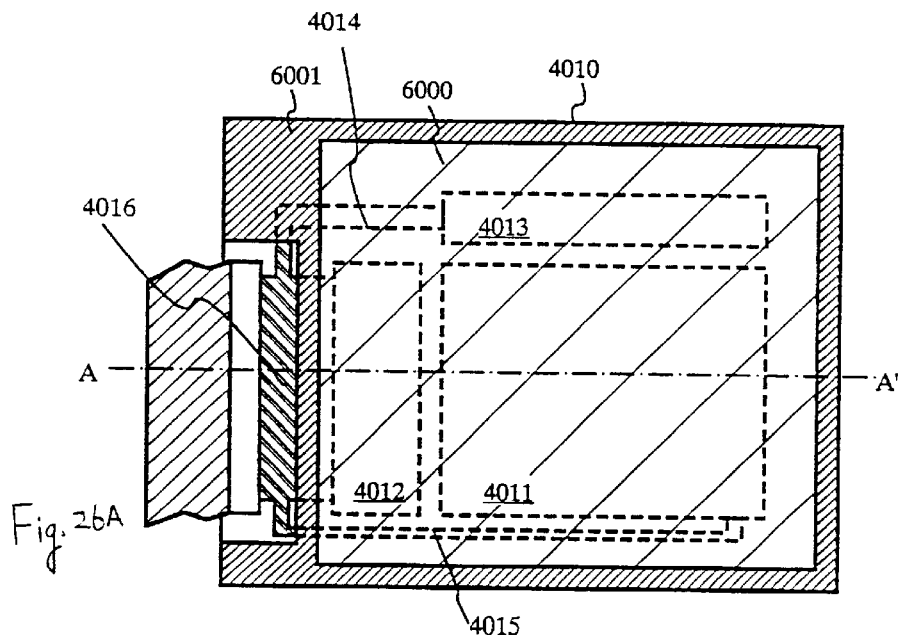
FIGS. 26A and 26B are diagrams showing the structure of an active matrix type EL display device.
Figure 26B:
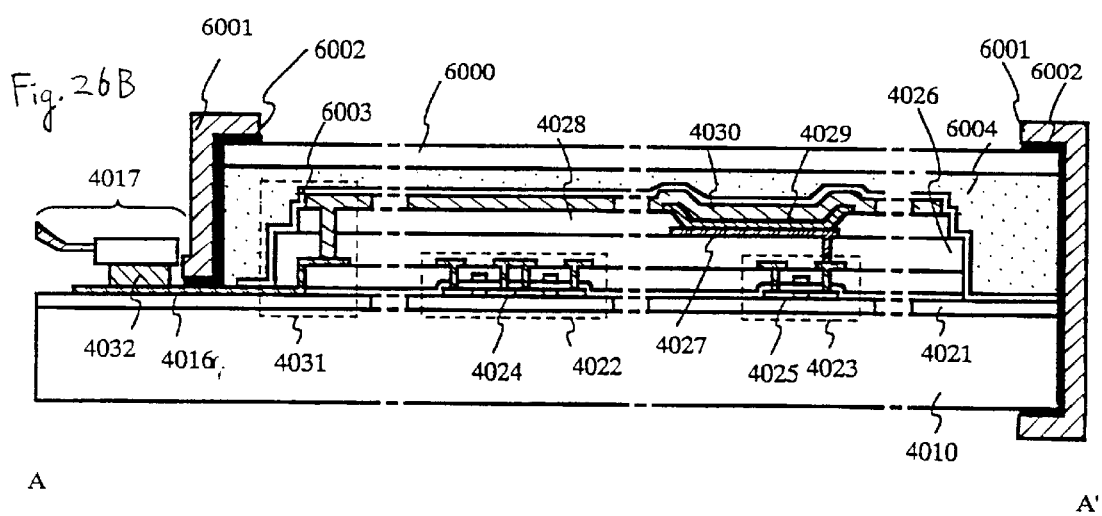

In this embodiment, an example of manufacturing an EL display device having a structure which differs from that of Embodiment 9 is explained using FIGS. 26A and 26B. Parts having the same reference numerals as those of FIGS. 25A and 25B indicate the same portions, and therefore an explanation of those parts is omitted.

FIG. 26A is a top view of an EL display device of this embodiment, and FIG. 26B shows a cross sectional diagram in which FIG. 26A is cut along the line A–A'.

In accordance with Embodiment 9, manufacturing is performed through the step of forming the passivation film 6003 covering the EL element.

In addition, the filling material 6004 is formed so as to cover the EL element. The filling material 6004 also functions as an adhesive for bonding the covering material 6000. PVC (polyvinyl chloride), epoxy resin, silicone resin, PVB (polyvinyl butyral), and EVA (ethylene vinyl acetate) can be used as the filling material 6004. If a drying agent is provided on the inside of the filling material 6004, then it can continue to maintain a moisture absorbing effect, which is preferable.

Further, spacers may be contained within the filling material 6004. The spacers may be a powdered substance such as BaO, giving the spacers themselves the ability to absorb moisture.

When using spacers, the passivation film 6003 can relieve the spacer pressure. Further, a film such as a resin film can be formed separately from the passivation film 6003 to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the covering material 6000. Note that if PVB or EVA is used as the filler material 6004, it is preferable to use a sheet with a structure in which several tens of μm of aluminum foil is sandwiched by a PVF film or a Mylar film.

However, depending upon the light emission direction from the EL device (the light radiation direction), it is necessary for the covering material 6000 to have light transmitting characteristics.

After bonding the covering material 6000 using the filling material 6004, the frame material 6001 is attached so as to cover the lateral surfaces (exposed surfaces) of the filling material 6004. The frame material 6001 is bonded by the sealing material (which functions as an adhesive) 6002. It is preferable to use a light hardening resin as the sealing material 6002 at this point, but provided that the heat resistance characteristics of the EL layer permit, a thermal hardening resin may also be used. Note that it is preferable that the sealing material 6002 be a material which, as much as possible, does not transmit moisture and oxygen. Further, a drying agent may also be added to an inside portion of the sealing material 6002.

The wiring 4016 is electrically connected to the FPC 4017 through a gap between the sealing material 6002 and the substrate 4010. Note that although an explanation of the wiring 4016 has been made here, the wirings 4014 and 4015 are also electrically connected to the FPC 4017 by similarly passing underneath the sealing material 6002.

Embodiment 11

Figure 27:
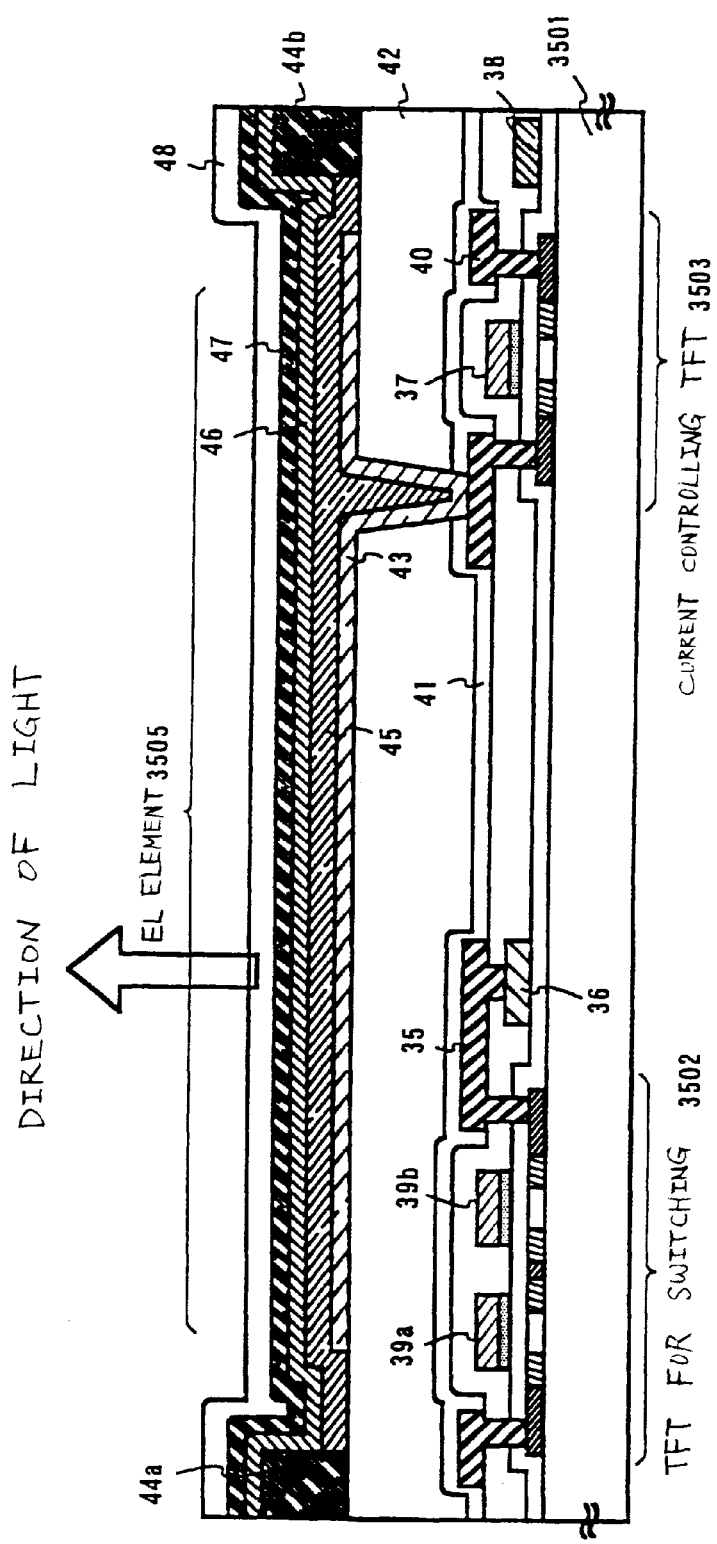
FIG. 27 is a diagram showing the structure of an active matrix type EL display device.
Figure 28A:
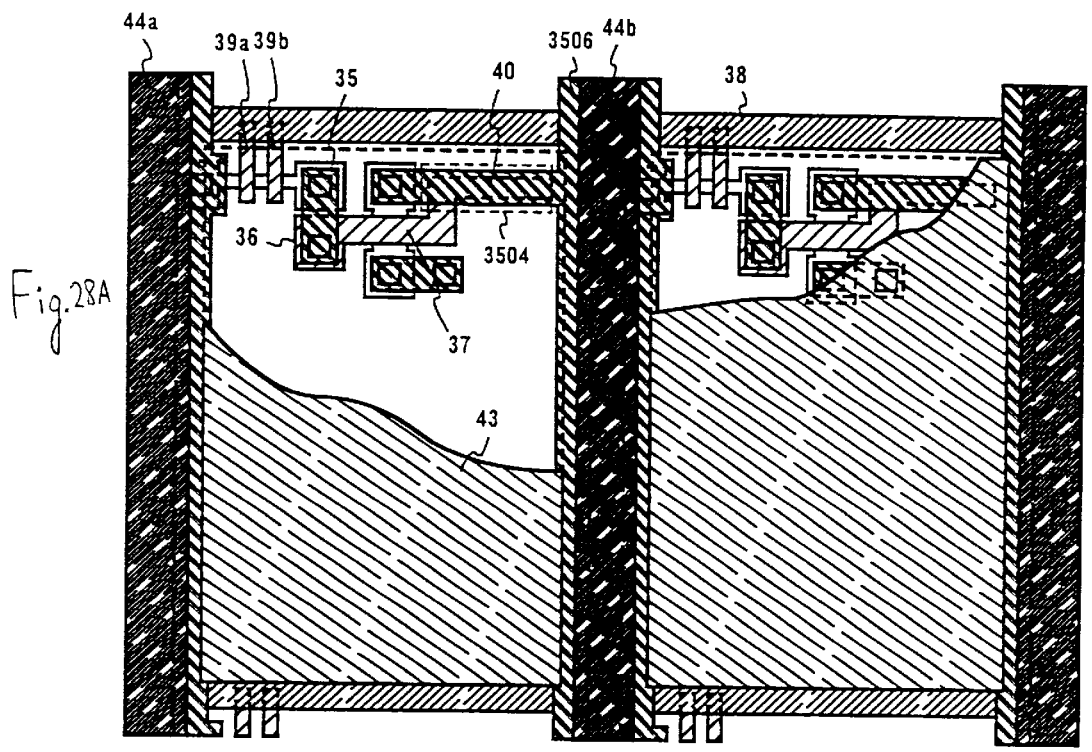
FIGS. 28A and 28B are diagrams showing the structure of an active matrix type EL display device.
Figure 28B:
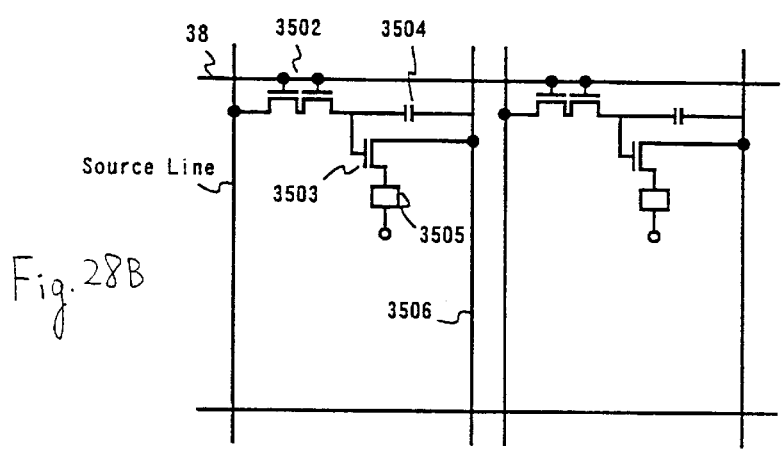

The present invention can be applied to the EL display panel with the structure of Embodiments 9 and 10. FIG. 27 shows a more detailed cross-sectional structure of the pixel portion. FIG. 28A shows a top view thereof, and FIG. 28B shows a circuit diagram thereof. In FIGS. 27, 28A, and 28B, the same components are denoted with the same reference numerals.

In FIG. 27, a TFT 3502 for switching provided on a substrate 3501 is formed by using the NTFT according to the present invention. (See Embodiments 1 to 8) In this embodiment, the TFT has a double-gate structure. Since there is no substantial difference in its structure and production process, its description will be omitted. Due to the double-gate structure, there is an advantage in that substantially two TFTs are connected in series to reduce an OFF current value. In this embodiment, the TFT has a double-gate structure; however, it may have a single gate structure, a triple gate structure, or a multi-gate structure having 4 or more gates. Alternatively, PTFT according to the present invention may be used.

A current controlling TFT 3503 is formed by using the NTFT of the present invention. A drain wiring 35 of the switching TFT 3502 is electrically connected to a gate electrode 37 of the current controlling TFT by a wiring 36. Furthermore, a wiring 38 is a gate wiring electrically connected to gate electrodes 39a and 39b of the switching TFT 3502.

At this time, it is very important that the current control TFT 3503 has a structure according to the present invention. The current controlling TFT functions for controlling the amount of a current flowing through an EL element, so that the TFT is likely to be degraded by heat and hot carriers due to a large amount of current flown therethrough. Therefore, the structure of the present invention is very effective, in which an LDD region is provided on the drain side of the current controlling TFT so as to overlap the gate electrode via the gate insulating film.

Furthermore, in this embodiment, the current controlling TFT 3503 has a single gate structure. However, it may have a multi-gate structure in which a plurality of TFTs are connected in series. Furthermore, it may also be possible that a plurality of TFTs are connected in parallel to substantially divide a channel formation region into a plurality of parts, so as to conduct highly efficient heat release. Such a structure is effective for preventing degradation due to heat.

As shown in FIG. 28A, a line to be the gate electrode 37 of the current controlling TFT 3503 overlaps a drain wiring 40 of the current controlling TFT 3503 via an insulating film in a region 3504. In the region 3504, a capacitor is formed. The capacitor 3504 functions for holding a voltage applied to a gate of the current controlling TFT 3503. The drain line 40 is connected to a current supply line (power source line) 3506 so as to be always supplied with a constant voltage.

A first passivation film 41 is provided on the switching TFT 3502 and the current controlling TFT 3503, and a flattening film 42 that is made of a resin insulating film is formed thereon. It is very important to flatten the step difference due to TFTs by using the flattening film 42. The step difference may cause a light-emitting defect because the EL layer to be formed later is very thin. Thus, it is desirable to flatten the step difference so that the EL layer is formed on a flat surface before forming a pixel electrode.

Reference numeral 43 denotes a pixel electrode (cathode of an EL element) that is made of a conductive film with high reflectivity and is electrically connected to the drain of the current controlling TFT 3503. As the pixel electrode 43, a low resistant conductive film such as an aluminum alloy film, a copper alloy film, and a silver alloy film, or a layered structure thereof can be preferably used. Needless to say, a layered structure with other conductive films may also be used.

A light-emitting layer 45 is formed in a groove (corresponding to a pixel) formed by banks 44a and 44b made of an insulating film (preferably resin). Herein, only one pixel is shown; however, light-emitting layers corresponding to each color® (red), G (green), and B (blue)) may be formed. As an organic EL material for the light-emitting layer, a π-conjugate polymer material is used. Examples of the polymer material include polyparaphenylene vinylene (PPV), polyvinyl carbazole (PVK), and polyfluorene.

There are various types of PPV organic EL materials. For example, materials as described in "H. Shenk, Becker, O. Gelsen, E. Kluge, W. Kreuder and H. Spreitzer, "Polymers for Light Emitting Diodes", Euro Display, Proceedings, 1999, pp. 33–37" and Japanese Laid-Open Publication No. 10-92576 can be used.

More specifically, as a light-emitting layer emitting red light, cyanopolyphenylene vinylene may be used. As a light-emitting layer emitting green light, polyphenylene vinylene may be used. As a light-emitting layer emitting blue light, polyphenylene vinylene or polyalkyl phenylene may be used. The film thickness may be prescribed to be 30 to 150 nm (preferably 40 to 100 nm).

The above-mentioned organic EL materials are merely examples for use as a light-emitting layer. The present invention is not limited thereto. A light-emitting layer, a charge-transporting layer, or a charge injection layer may be appropriately combined to form an EL layer (for light emitting and moving carriers therefor).

For example, in this embodiment, the case where a polymer material is used for the light-emitting layer has been described. However, a low molecular-weight organic EL material may be used. Furthermore, an inorganic material such as silicon carbide can also be used for a charge-transporting layer and a charge injection layer. As these organic EL materials and inorganic materials, known materials can be used.

In this embodiment, an EL layer with a layered structure is used, in which a hole injection layer 46 made of PEDOT (polythiophene) or PAni (polyaniline) is provided on the light-emitting layer 45. An anode 47 made of a transparent conductive film is provided on the hole injection layer 46. In this embodiment, light generated by the light-emitting layer 45 is irradiated to the upper surface (toward TFTs), so that the anode 47 must be transparent to light. As a transparent conductive film, a compound of indium oxide and tin oxide, and a compound of indium oxide and zinc oxide can be used. The conductive film is formed after forming the light-emitting layer and the hole injection layer with low heat resistance, so that the conductive film that can be formed at a possibly low temperature is preferably used.

When the anode 47 is formed, the EL element 3 505 is completed. The EL element 3505 refers to a capacitor composed of the pixel electrode (cathode) 43, the light-emitting layer 45, the hole injection layer 46, and the anode 47. As show in FIG. 28A, the pixel electrode 43 substantially corresponds to the entire area of a pixel. Therefore, the entire pixel functions as an EL element. Thus, a light image display with very high light use efficiency can be performed.

In this embodiment, a second passivation film 48 is further formed on the anode 47. As the second passivation film 48, a silicon nitride film or a silicon nitride oxide film is preferably used. The purpose of the passivation film 48 is to prevent the EL element from being exposed to the outside. That is, the passivation film 48 protects an organic EL material from degradation due to oxidation, and suppresses the release of gas from the organic EL material. Because of this, the reliability of the EL display device is enhanced.

As described above, the EL display panel of the present invention has a pixel portion made of a pixel with a structure as shown in FIG. 27, and includes a switching TFT having a sufficiently low OFF current value and a current controlling TFT that is strong to the injection of hot carriers. Thus, an EL display panel is obtained, which has high reliability and is capable of displaying a satisfactory image.

This embodiment can be realized by being appropriately combined with the structures of Embodiments 1 to 8. Furthermore, it is effective to use the EL display panel of this embodiment as a display portion of electronic equipment.

Embodiment 12

In this embodiment, referring to FIG. 29, the case will be described where the structure of the EL element 3505 is reversed in the pixel portion described in Embodiment 11. The difference from the structure shown in FIG. 27 lies only in the EL element and the current controlling TFT, so that the description of the other parts will be omitted.

Figure 29:
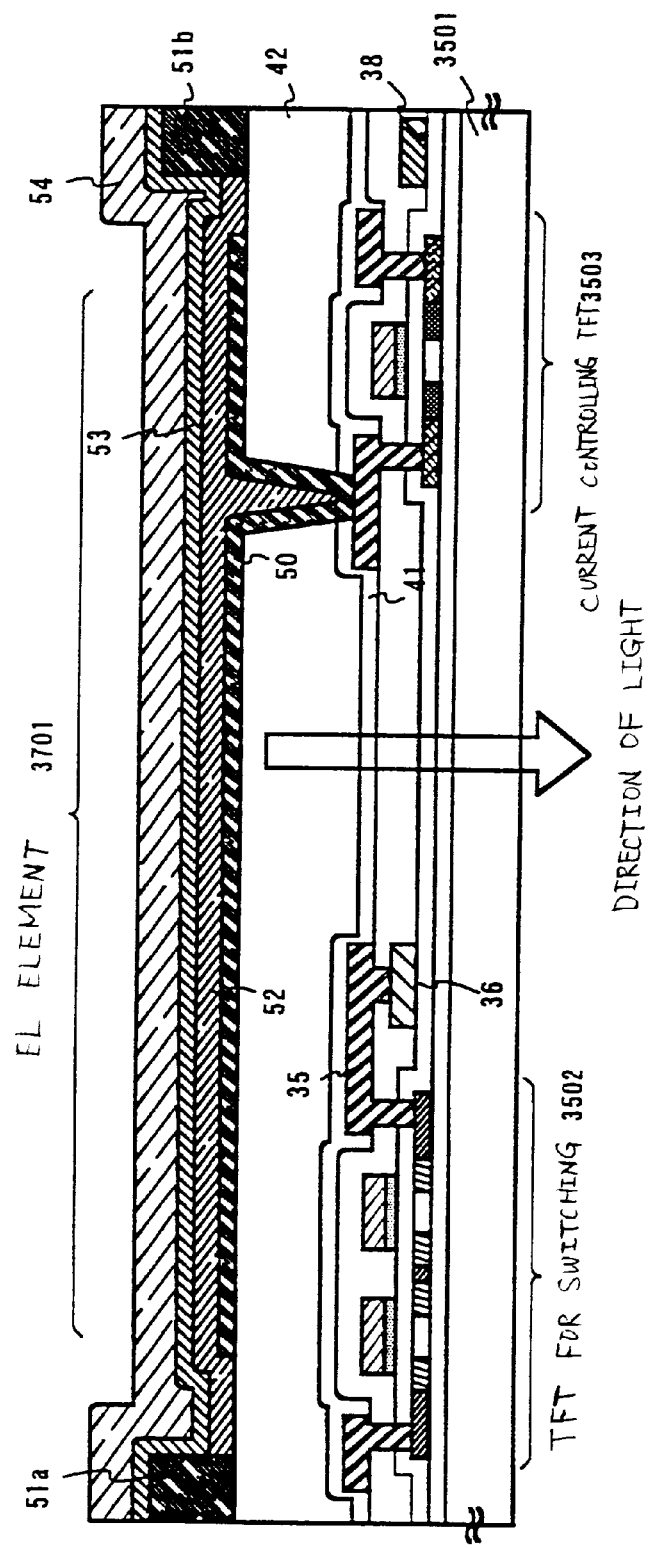
FIG. 29 is a diagram showing the structure of an active matrix type EL display device.

In FIG. 29, a current controlling TFT 3503 is formed of a PTFT according to the present invention. Regarding the production process, Embodiments 1 to 8 should be referred to.

In this embodiment, a transparent conductive film is used as a pixel electrode (anode) 50. More specifically, a conductive film made of a compound of indium oxide and zinc oxide is used. Needless to say, a conductive film made of a compound of indium oxide and tin oxide may be used.

After banks 51*a* and 51*b* made of an insulating film are formed, a light-emitting layer 52 made of polyvinyl carbazole is formed by coating of a solution. On the light-emitting layer 52, an electron injection layer 53 made of potassium acetyl acetonate (acacK), and a cathode 54 made of an aluminum alloy are formed. In this case, the cathode 54 functions as a passivation film. Thus, an EL element 3701 is formed.

In this embodiment, light generated by the light-emitting layer 52 is irradiated toward the substrate on which a TFT is formed as represented by an arrow.

This embodiment can be realized by being appropriately combined with the structures of Embodiments 1 to 8. Furthermore, it is effective to use the EL display panel of this embodiment as a display portion of electronic equipment.

Embodiment 13

In this embodiment, referring to FIGS. 30A to 30C, the case will be described where a pixel having a structure different from that of the circuit diagram shown in FIG. 28B is used. Reference numeral 3801 denotes a source line of a switching TFT 3802, 3803 denotes a gate wiring of the switching TFT 3802, 3804 denotes a current controlling TFT, 3805 denotes a capacitor, 3806 and 3808 denote current supply lines, and 3807 denotes an EL element.

Figure 30A:
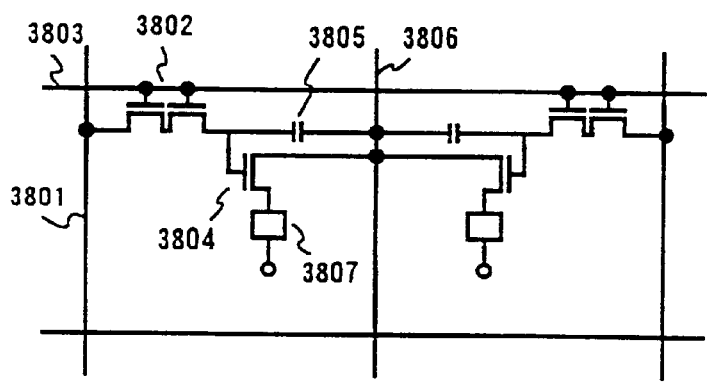
FIGS. 30A to 30C are diagrams showing a circuit configuration of an active matrix type EL display device.

FIG. 30A shows the case where two pixels share the current supply line 3806. More specifically, two pixels are formed so as to be axisymmetric with respect to the current supply line 3806. In this case, the number of power supply lines can be reduced, so that the pixel portion is allowed to have a higher definition.

Figure 30B:
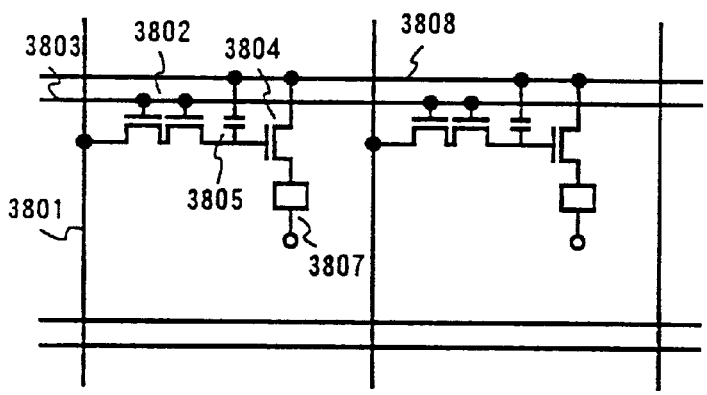

Furthermore, FIG. 30B shows the case where the current supply line 3808 and the gate line 3803 are provided in parallel. In FIG. 30B, although the current supply line 3808 does not overlap the gate wiring 3803, if both lines are formed on different layers, they can be provided so as to overlap each other via an insulating film. In this case, the current supply line 3808 and the gate line 3803 can share an occupied area, so that a pixel portion is allowed to have higher definition.

Figure 30C:
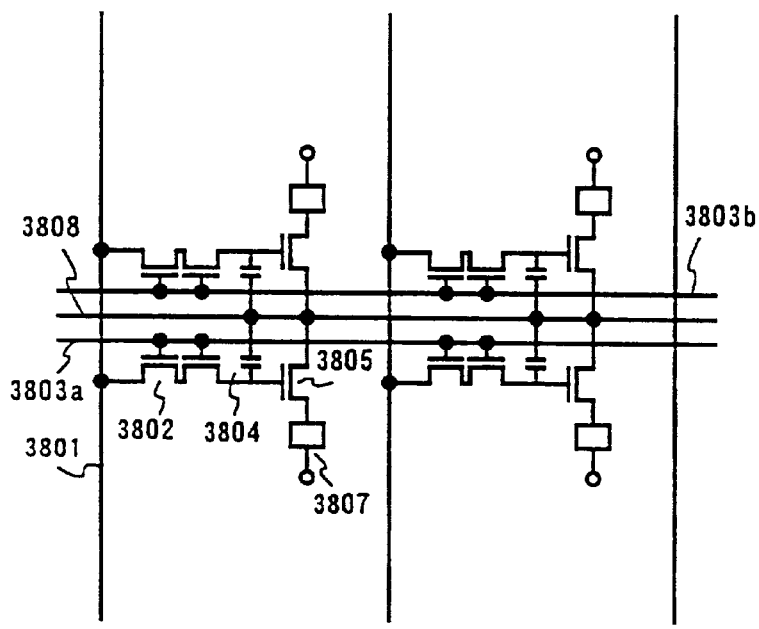

Furthermore, FIG. 30C shows the case where the current supply line 3808 and gate wiring 3803 are provided in parallel in the same way as in FIG. 30B, and two pixels are formed so as to be axisymmetric with respect to the current supply line 3808. It is also effective to provide the current supply line 3808 so as to overlap one of the gate wiring 3803. In this case, the number of the power supply lines can be reduced, so that a pixel portion is allowed to have higher definition.

This embodiment can be realized by being appropriately combined with the structures of Embodiments 1 to 10. Furthermore, it is effective to use the EL display panel of this embodiment as a display portion of electronic equipment.

Embodiment 14

In FIGS. 28A and 28B shown in Embodiment 11, the capacitor 3504 is provided so as to hold a voltage applied to a gate of the current controlling TFT 3503. However, the capacitor 3504 can be omitted. In Embodiment 11, since the NTFT according to the present invention as shown in Embodiment 1 to 8 is used as the current controlling TFT 3503, the TFT 3503 has an LDD region provided so as to overlap a gate electrode via a gate insulating film. In this region, a parasitic capacitor called a gate capacitor is generally formed. This embodiment is characterized in that the parasitic capacitor is used in place of the capacitor 3504.

The capacitance of the parasitic capacitor is varied depending upon the area in which the above-mentioned gate electrode overlaps the LDD region. Therefore, the capacitance is determined by the length of the LDD region included in the region positively.

Similarly, in FIGS. 30A, 30B, and 30C, the capacitor 3805 can also be omitted.

This embodiment can be realized by being appropriately combined with the structures of Embodiments 1 to 13. Furthermore, it is effective to use an EL display panel having a pixel structure of this embodiment as a display portion of electronic equipment.

Embodiment 15

The CMOS circuit and the pixel portion formed by implementing the present invention can be used in various electro-optical devices (active matrix type liquid crystal display device, active matrix EL display device, and active matrix EC display). That is, the present invention can be implemented in all electronic equipment that incorporate these electro-optical devices as a display portion.

The following can be given as such electronic equipment: a video camera, a digital camera, a projector (a rear type or a front type), a head mount display (goggle type display), a car navigation system, a car stereo, a personal computer, a portable information terminal (such as a mobile computer, a cellular phone, and an electronic book) etc. Some examples of these are shown in FIG. 31, FIG. 32 and FIG. 33.

FIG. 31A shows a personal computer that is comprised of a main body 2001, an image input portion 2002, a display portion 2003, and a keyboard 2004. The present invention can be applied to the image input portion 2002, the display portion 2003 and the other signal control circuit.

FIG. 31B shows a video camera that is comprised of a main body 2101, a display portion 2102, an audio input portion 2103, operation switches 2104, a battery 2105, and an image receiving portion 2106. The present invention can be applied to the display portion 2102, and other signal control circuit.

FIG. 31C shows a mobile computer that is composed of a main body 2201, a camera portion 2202, an image receiving portion 2203, operation switches 2204, and a display portion 2205. The present invention can be applied to the display portion 2205 and other signal control circuit.

FIG. 31D shows a goggle type display that is comprised of a main body 2301, display portions 2302, and arm portions 2303. The present invention can be applied to the display portion 2302 and other signal control circuit.

FIG. 31E shows a player which uses a recording medium in which a program is stored (hereinafter referred to as a recording medium) and which is comprised of a main body 2401, a display portion 2402, speaker portions 2403, a recording medium 2404, and operation switches 2405. A DVD (Digital Versatile Disc), a CD or the like is used as the recording medium to enable the player to appreciate music and the movies, and play a game or the Internet. The present invention can be applied to the display portion 2402 and other signal control circuit.

FIG. 31F shows a digital camera that is comprised of a main body 2501, a display portion 2502, an eye-piece portion 2503, operation switches 2504, and an image receiving portion (not shown in the figure). The present invention can be applied to the display portion 2502 and other signal control circuit.

FIG. 32A shows a front type projector that is comprised of a projection unit 2601, a screen 2602, and the like. The present invention can be applied to a liquid crystal display device 2808 which is a part structuring the projection unit 2601 and other signal control circuit.

FIG. 32B shows a rear type projector that is comprised of a main body 2701, a projection unit 2702, a mirror 2703, a screen 2704, and the like. The present invention can be applied to the liquid crystal display device 2808 which is a part structuring the projection unit 2702 and other signal control circuit.

Illustrated in FIG. 32C is an example of the structure of the projection units 2601 and 2702 that are shown in FIGS. 32A and 32B, respectively. Each of the projection units 2601 and 2702 is comprised of a light source optical system 2801, mirrors 2802 and 2804 to 2806, dichroic mirrors 2803, a prism 2807, liquid crystal display devices 2808, phase difference plates 2809, and a projection optical system 2810. The projection optical system 2810 is constructed of an optical system including projection lenses. An example of a three plate system is shown in the present embodiment, but there are no special limitations. For instance, an optical system of single plate system is acceptable. Further, the operator may suitably set optical systems such as optical lenses, polarizing film, film to regulate the phase difference, IR film, within the optical path shown by the arrows in FIG. 32C.

In addition, FIG. 32D shows an example of the structure of the light source optical system 2801 of FIG. 32C. In the present embodiment, the light source optical system 2801 is composed of a reflector 2811, a light source 2812, a lens array 2813 and 2814, a polarizing conversion element 2815, and a condenser lens 2816. Note that the light source optical system shown in FIG. 32D is an example, and it is not limited to the illustrated structure. For example, the operator may suitably set optical systems such as optical lenses, polarizing film, film to regulate the phase difference, and IR film.

The projector illustrated in FIG. 32, show the electro optical device of transparent type but the example of the electro optical device of reflection type and the EL display device.

Figure 33A:
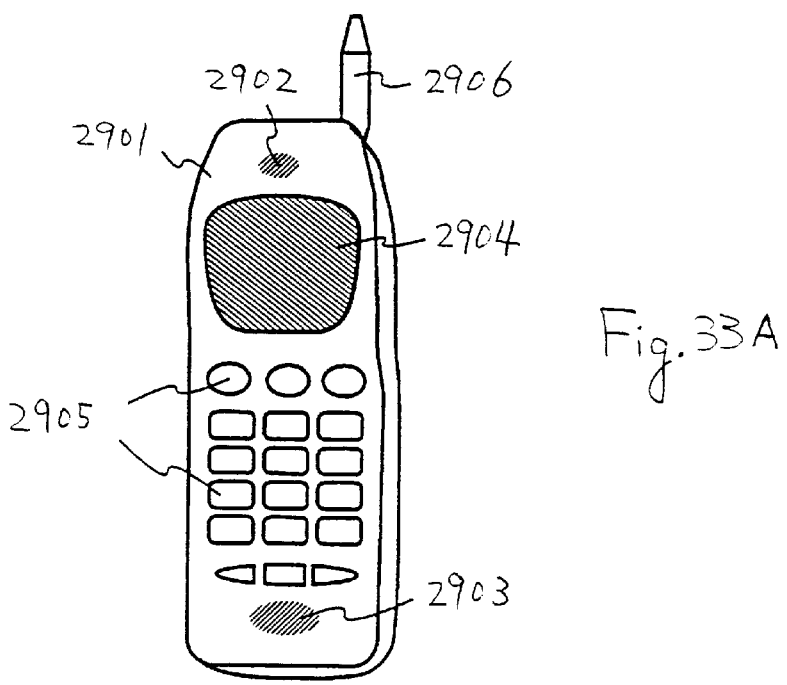
FIGS. 33A to 33C are diagrams showing examples of an electronic device.

FIG. 33A shows a cellular phone that is comprised of a main body 2901, an audio output portion 2902, an audio input portion 2903, a display portion 2904, an operation switches 2905 and an antenna 2906 etc. The present invention can be applied to the audio output portion 2902, the audio input portion 2903, the display portion 2904 and other signal control circuit.

Figure 33B:
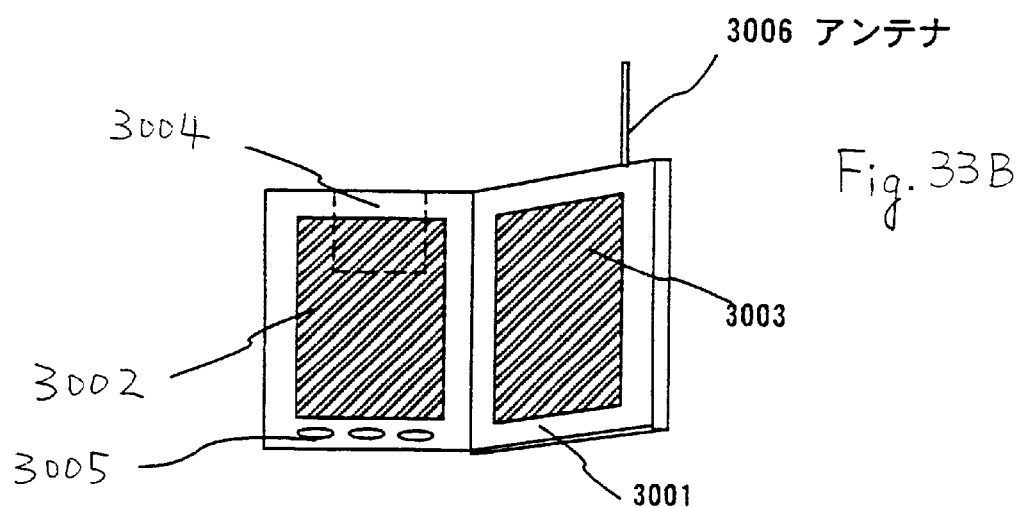

FIG. 33B shows a mobile book (electronic book) that is comprised of a main body 3001, a display portion 3002, 3003, a recording medium 3004, an operation switches 3005 and a antenna 3006 etc. The present invention can be applied to the display portion 3002, 3003 and other signal control circuit.

Figure 33C:
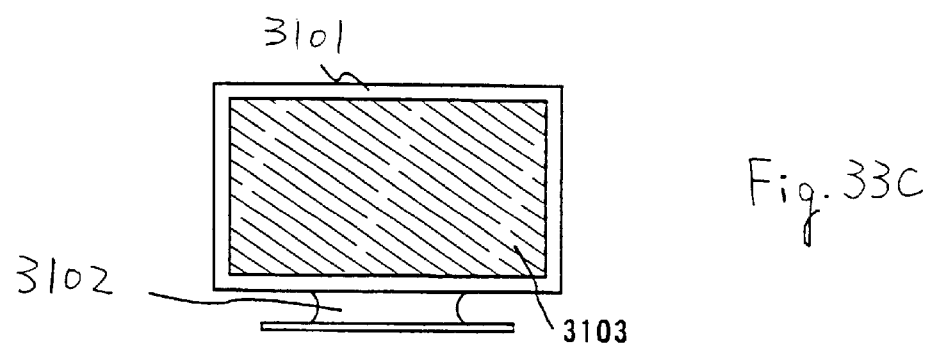
Figure 34:
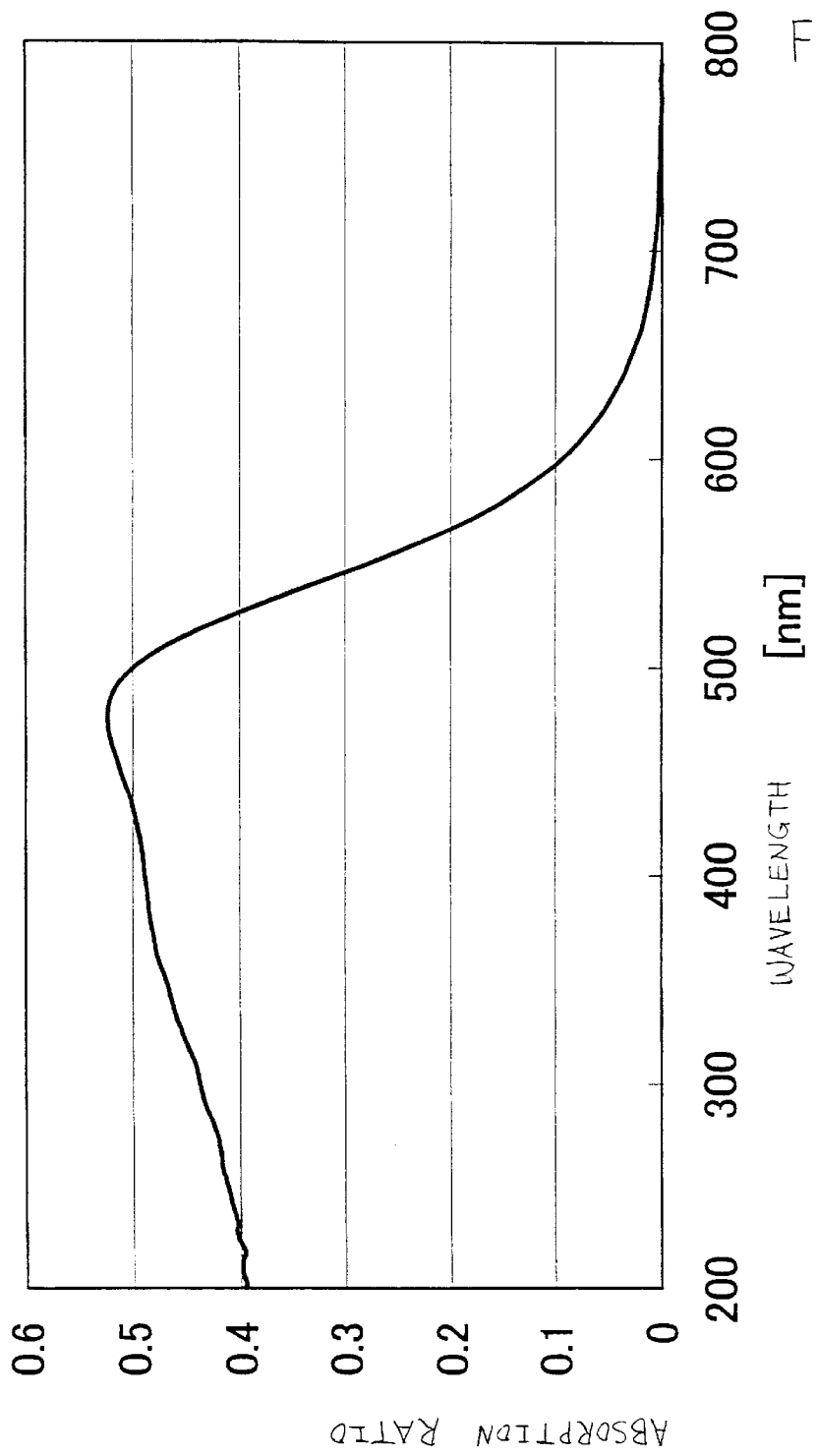
FIG. 34 is a graph illustrating a wavelength dependence of a ratio of the absorption of light to a 55 nm-thick a-Si film formed on a glass substrate.

FIG. 33C shows a display that is comprised of a main body 3101, a support stand 3102 and display portion 3103 etc. The present invention can be applied to the display portion 3103. They are especially advantageous for cases in which the screen is made large, and is favorable for displays having a diagonal greater than or equal to 10 inches (especially one which is greater than or equal to 30 inches).

Thus, the application range for the present invention is extremely wide, and it may be applied to electronic equipment in all fields. Further, the electronic equipment of this Embodiment can be realized with a composition that uses any combination of Embodiments 1 to 14.

The provision of a high cost performance laser irradiation process can be attained by the laser irradiation apparatus of the present invention. In addition, laser beams having a higher uniformity can be obtained through the present invention. The laser irradiation apparatus provided by the present invention can be utilized in processes such as the crystallization process of the non-single crystal silicon film.

What is claimed is:

1. A laser beam irradiation method comprising:
   irradiating a plurality of laser beams having different wavelengths from each other on a same region simultaneously,
   wherein each of said plurality of laser beams has a linear cross section on said same region.

2. A method according to claim 1 wherein said laser oscillator is a YAG laser.

3. A method according to claim 1 wherein said plurality of laser beams having different wavelengths from each other comprise second and third harmonics of a YAG laser beam.

4. A method according to claim 1 wherein said plurality of laser beams having different wavelengths from each other comprise second and fourth harmonics of a YAG laser beam.

5. A method according to claim 1 wherein said plurality of laser beams having different wavelengths from each other comprise third and fourth harmonics of a YAG laser beam.

6. A method according to claim 1 wherein each of said plurality of laser beams having different wavelengths from each other has a wavelength of 600 nm or less.

7. A laser beam irradiation method comprising:
   preparing a non single crystal semiconductor film formed over a substrate;
   irradiating a plurality of laser beams having different wavelengths from each other onto a same region of said semiconductor film simultaneously, each of said plurality of laser beams having a linear cross-section on said same region; and
   scanning said plurality of laser beams relatively to said semiconductor film.

8. A method according to claim 7 wherein said laser oscillator is a YAG laser.

9. A method according to claim 7 wherein said plurality of laser beams having different wavelengths from each other comprise second and third harmonics of a YAG laser beam.

10. A method according to claim 7 wherein said plurality of laser beams having different wavelengths from each other comprise second and fourth harmonics of a YAG laser beam.

11. A method according to claim 7 wherein said plurality of laser beams having different wavelengths from each other comprise third and fourth harmonics of a YAG laser beam.

12. A method according to claim 7 wherein each of said plurality of laser beams having different wavelengths from each other has a wavelength of 600 nm or less.

13. A method for manufacturing a semiconductor device comprising a thin film transistor over a substrate, said method comprising:
    forming a non-single crystal semiconductor film over said substrate; and
    irradiating a plurality of laser beams having different wavelengths from each other to a region of said semiconductor film simultaneously.

14. A method according to claim 13 wherein each of said plurality of laser beams having different wavelengths from each other has a wavelength of 600 nm or less.

15. A method according to claim 13 wherein said plurality of laser beams having different wavelengths from each other comprise second and third harmonics of a YAG laser beam.

16. A method according to claim 13 wherein said plurality of laser beams having different wavelengths from each other comprise second and fourth harmonics of a YAG laser beam.

17. A method according to claim 13 wherein said plurality of laser beams having different wavelengths from each other comprise third and fourth harmonics of a YAG laser beam.

18. A method for manufacturing a semiconductor device comprising a thin film transistor over a substrate, said method comprising:
    forming an amorphous semiconductor film over said substrate; and
    irradiating a plurality of laser beams having different wavelengths from each other to a region of said semiconductor film simultaneously to change said amorphous semiconductor film to a crystalline semiconductor film.

19. A method according to claim 18 wherein each of said plurality of laser beams having different wavelengths from each other has a wavelength of 600 nm or less.

20. A method according to claim 18 wherein said plurality of laser beams having different wavelengths from each other comprise second and third harmonics of a YAG laser beam.

21. A method according to claim 18 wherein said plurality of laser beams having different wavelengths from each other comprise second and fourth harmonics of a YAG laser beam.

22. A method according to claim 18 wherein said plurality of laser beams having different wavelengths from each other comprise third and fourth harmonics of a YAG laser beam.

* * * * *